United States Patent
Mori et al.

(10) Patent No.: US 10,332,928 B2
(45) Date of Patent: Jun. 25, 2019

(54) SOLID-STATE IMAGING DEVICE, METHOD FOR MANUFACTURING SOLID-STATE IMAGING DEVICE, AND ELECTRONIC APPARATUS

(71) Applicant: Brillnics Japan Inc., Tokyo (JP)

(72) Inventors: Kazuya Mori, Tokyo (JP); Shunsuke Tanaka, Tokyo (JP); Takuma Hasegawa, Tokyo (JP)

(73) Assignee: Brillnics Japan Inc., Tokyo (JP)

( * ) Notice: Subject to any disclaimer, the term of this patent is extended or adjusted under 35 U.S.C. 154(b) by 0 days.

(21) Appl. No.: 15/902,559

(22) Filed: Feb. 22, 2018

(65) Prior Publication Data

US 2018/0247969 A1 Aug. 30, 2018

(30) Foreign Application Priority Data

Feb. 24, 2017 (JP) ................. 2017-033802

(51) Int. Cl.
*H04N 5/347* (2011.01)
*H04N 5/355* (2011.01)
(Continued)

(52) U.S. Cl.
CPC .. *H01L 27/14656* (2013.01); *H01L 27/14612* (2013.01); *H01L 27/14621* (2013.01);
(Continued)

(58) Field of Classification Search
CPC ........... H01L 2924/00; H01L 27/14643; H01L 27/1464; H01L 27/14689; H01L 27/14609; H01L 27/14603; H01L 27/14641; H01L 27/14605; H01L 27/14683; H01L 27/1469; H04N 9/045; H04N 5/3559; H04N 3/155; H04N 5/347; H04N 5/3745; H04N 5/37455; H04N 5/37457

See application file for complete search history.

(56) References Cited

U.S. PATENT DOCUMENTS 7,122,408 B2 * 10/2006 Mouli ............... H01L 27/14603
                                                 438/134
7,274,394 B2 *  9/2007 Koizumi ........... H01L 27/14609
                                                 250/208.1

(Continued)

FOREIGN PATENT DOCUMENTS

JP       2005-223681 A      8/2005

*Primary Examiner* — Chia Wei A Chen
(74) *Attorney, Agent, or Firm* — Westerman, Hattori, Daniels & Adrian, LLP

(57) ABSTRACT

A pinned photodiode has a substrate having a first substrate side to which light is illuminated and a second substrate side opposite the first substrate side, a photoelectric conversion part including a first conductivity type semiconductor layer buried into the substrate and having a photoelectric conversion function for the received light and a charge accumulation function, a second conductivity type separation layer formed in the side portion of the first conductivity type semiconductor layer in the photoelectric conversion part, and one charge transfer gate part capable of transferring the charge accumulated in the photoelectric conversion part. The photoelectric conversion part, in at least a portion of the first conductivity type semiconductor layer, includes at least one second-conductivity type semiconductor layer forming at least one sub-area in a direction perpendicular to a normal line of the substrate and having a junction capacitance component together with the first conductivity type semiconductor layer.

20 Claims, 47 Drawing Sheets

(51) Int. Cl.
*H01L 27/146* (2006.01)
*H01L 27/148* (2006.01)
*H04N 5/3745* (2011.01)

(52) U.S. Cl.
CPC .. *H01L 27/14689* (2013.01); *H01L 27/14887* (2013.01); *H04N 5/347* (2013.01); *H04N 5/3559* (2013.01); *H04N 5/3745* (2013.01); *H04N 5/37452* (2013.01); *H04N 5/37455* (2013.01); *H04N 5/37457* (2013.01)

(56) References Cited

U.S. PATENT DOCUMENTS

| | | | | |
|---|---|---|---|---|
| 7,786,543 | B2* | 8/2010 | Hsieh | H01L 27/14634 |
| | | | | 257/226 |
| 8,883,544 | B2* | 11/2014 | Chen | H01L 27/14612 |
| | | | | 438/73 |
| 2006/0011952 | A1* | 1/2006 | Ohkawa | H01L 27/14609 |
| | | | | 257/291 |
| 2009/0200591 | A1* | 8/2009 | Park | H01L 27/14621 |
| | | | | 257/292 |
| 2009/0325337 | A1* | 12/2009 | Cheng | H01L 27/1461 |
| | | | | 438/70 |
| 2013/0015513 | A1* | 1/2013 | Kido | H01L 27/1461 |
| | | | | 257/292 |
| 2015/0070540 | A1* | 3/2015 | Wang | H01L 31/02002 |
| | | | | 348/294 |
| 2015/0372031 | A1* | 12/2015 | Yoon | H01L 27/14603 |
| | | | | 257/446 |
| 2017/0033145 | A1* | 2/2017 | Miki | H01L 27/14641 |
| 2017/0104020 | A1* | 4/2017 | Lee | H01L 27/1463 |
| 2017/0207263 | A1* | 7/2017 | Park | H01L 27/14614 |
| 2018/0061873 | A1* | 3/2018 | Lee | H01L 27/14612 |
| 2018/0261637 | A1* | 9/2018 | Moriyama | H01L 27/1461 |

* cited by examiner

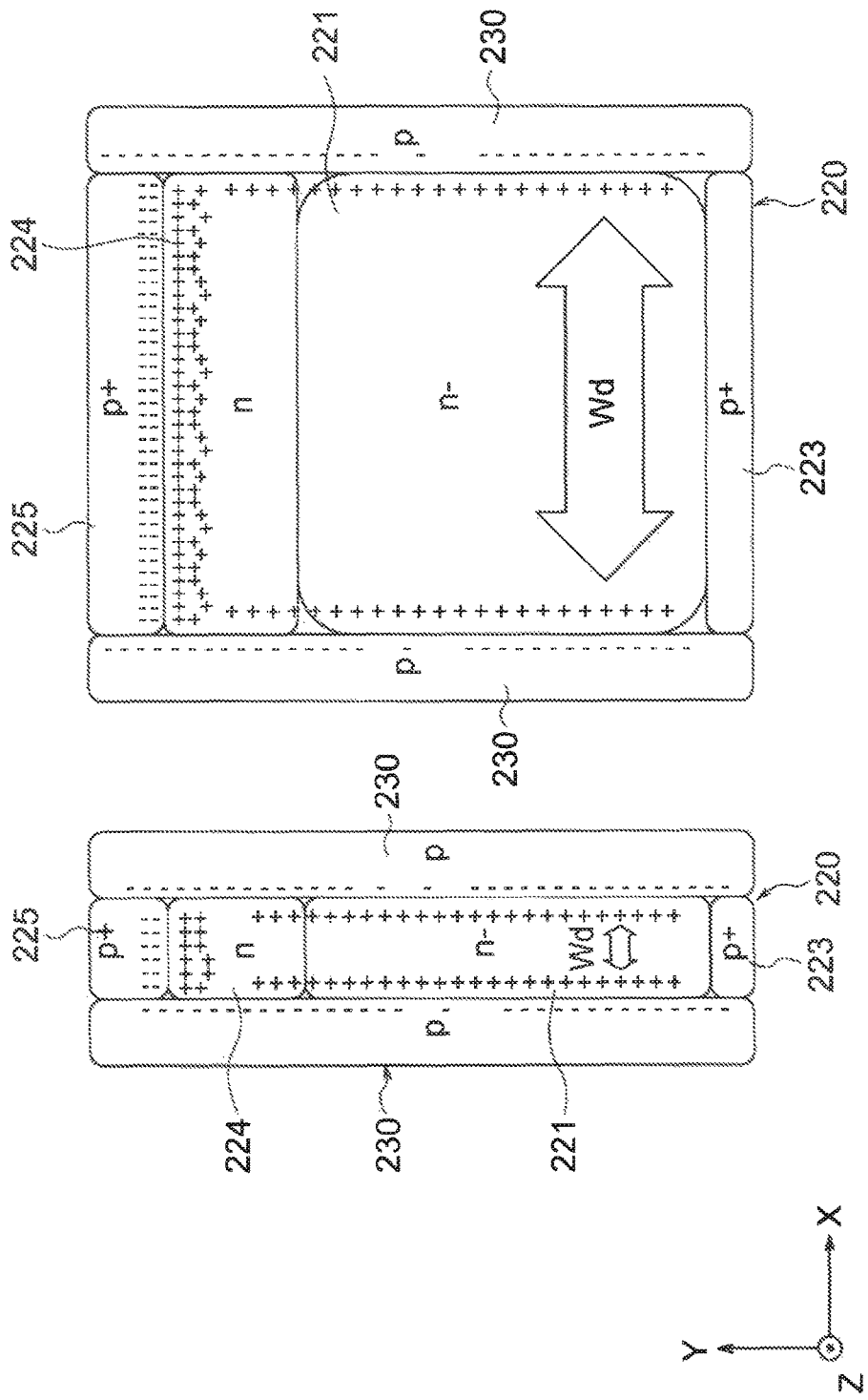

FIG.11

| BIAS VOLTAGE | COMPARATIVE EXAMPLE | PRESENT EMBODIMENT |
|---|---|---|
| HIGH | PARTIAL DEPLETION | PARTIAL DEPLETION |
| MIDDLE | PARTIAL DEPLETION | DEPLETION |
| LOW | PARTIAL DEPLETION | DEPLETION |

FIG.12

| PPD structure | LFWC | Responsivity | Noise floor |
|---|---|---|---|
| COMPARATIVE EXAMPLE | × | ○ | ○ |
| PRESENT EMBODIMENT | ○ | ○ | ○ |

○ : no degradation (=best practice)　× : <50% may be worse

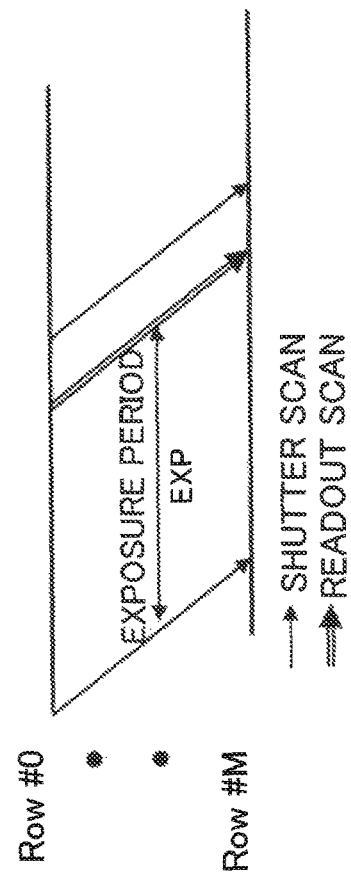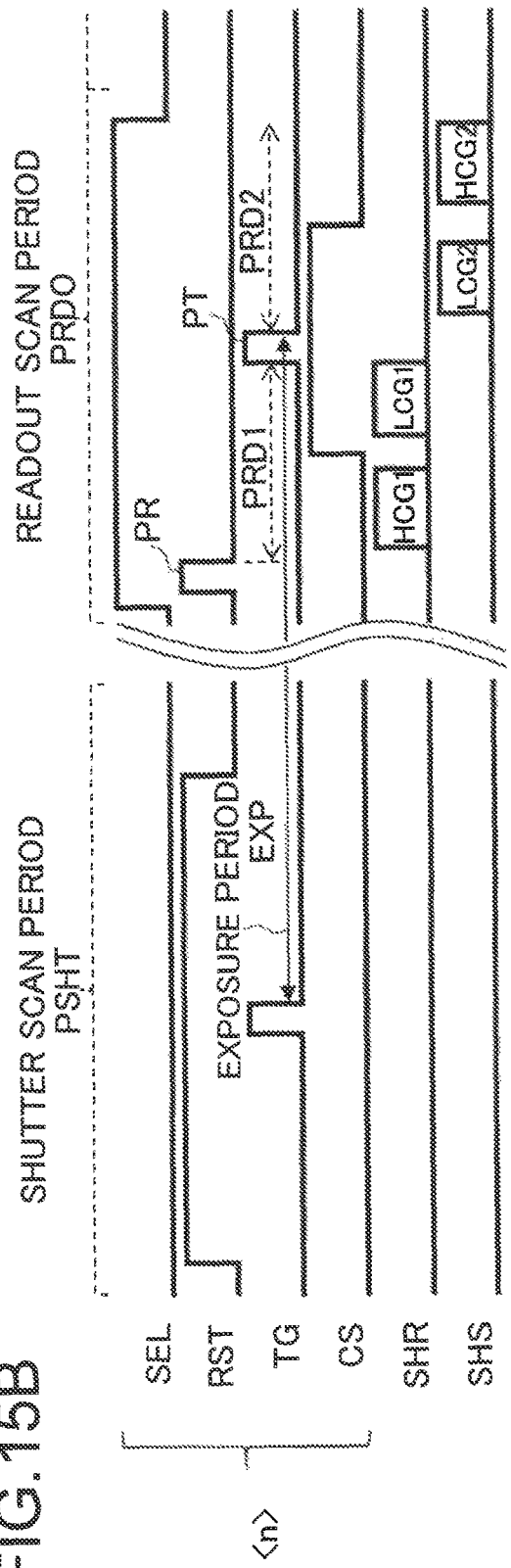

SOLID-STATE IMAGING DEVICE, METHOD FOR MANUFACTURING SOLID-STATE IMAGING DEVICE, AND ELECTRONIC APPARATUS

CROSS-REFERENCE TO RELATED APPLICATION

The present invention contains subject matter related to Japanese Patent Application JP 2017-33802 filed in the Japan Patent Office on Feb. 24, 2017, the entire contents of which being incorporated herein by reference.

TECHNICAL FIELD

The present invention relates to a solid-state imaging device, a method for manufacturing the solid-state imaging device, and an electronic apparatus.

BACKGROUND ART

As solid-state imaging devices (image sensors) using photoelectric conversion elements detecting light and generating a charge, CCD (charge coupled device) image sensors and CMOS (complementary metal oxide semiconductor) image sensors have been put into practical use. CCD image sensors and CMOS image sensors have been widely applied as parts of digital cameras, video cameras, monitoring cameras, medical endoscopes, personal computers (PC), mobile phones and other portable terminals (mobile devices) and other various types of electronic apparatuses.

CCD image sensors and CMOS image sensors use photodiodes for photoelectric conversion elements, but differ in the methods of transferring the photoelectrically converted signal charges. In a CCD image sensor, a signal charges are transferred to an output part by a vertical transfer part (vertical CCD, VCCD) and horizontal transfer part (horizontal CCD, HCCD) then converted to electrical signals and amplified. Contrary to this, in a CMOS image sensor, charges which are converted for each pixel including a photodiode are amplified and are output as a read-out signal.

Each pixel in a CMOS image sensor is for example configured by including as active elements, for one photodiode, four elements of a transfer element constituted by a transfer transistor, a reset element constituted by a reset transistor, a source follower element (amplification element) constituted by a source follower transistor, and a selection element constituted by a selection transistor (see for example PLT 1). Further, each pixel may be provided with an overflow gate (overflow transistor) for discharging an overflow charge overflowing from the photodiode in an accumulation period of the photodiode.

The transfer transistor is connected between the photodiode and an output node constituted by a floating diffusion layer (FD). The transfer transistor is held in a non-conductive state in the charge accumulation period of the photodiode. In the transfer period transferring the accumulated charge in the photodiode to the floating diffusion, a control signal is supplied to the gate whereby it is held in a conductive state and transfers the charge photoelectrically converted in the photodiode to the floating diffusion FD.

The reset transistor is connected between a power supply line and the floating diffusion FD. The reset transistor, when given a reset-use control signal at its gate, resets the potential of the floating diffusion FD to the potential of the power supply line.

The floating diffusion FD is connected the gate of the source follower transistor. The source follower transistor is connected through the selection transistor to the vertical signal line and configures a source follower together with a constant current source of a load circuit outside of the pixel part. Further, a control signal (address signal or select signal) is given to the gate of the selection transistor, whereby the selection transistor turns on. When the selection transistor turns on, the source follower transistor amplifies the potential of the floating diffusion FD and outputs a voltage in accordance with that potential to the vertical signal line. Through the vertical signal line, voltages output from the pixels are output to a pixel signal readout circuit constituted by a column-parallel processing part.

Further, in each pixel, as the photodiode (PD), a pinned photodiode (PPD) is widely used. On the substrate surface forming the photodiode (PD), there is a surface level due to dangling bonds or other defects, therefore a large charge (dark current) is generated by the heat energy, so a correct signal can no longer be read out. In a pinned photodiode (PPD), a charge accumulation part of the photodiode (PD) is buried in the substrate, so it becomes possible to reduce entry of dark current to the signal. Note that, the sensitivity of a photodiode (PD) can be changed by for example changing an exposure time etc.

The pinned photodiode (PPD) is for example configured by forming an n-type semiconductor region and forming a shallow p-type semiconductor region which has a rich impurity concentration for suppressing dark current on the surface of this n-type semiconductor region, that is, in the vicinity of the interface with an insulation film.

CITATION LIST

Patent Literature

PLT 1: Japanese Patent Publication No. 2005-223681A

SUMMARY OF INVENTION

Technical Problem

In this regard, in the conventional configuration, for example, when the pixel size is small, it is possible to efficiently accumulate a charge by a junction capacitance of a pixel separation p-type region in the pinned photodiode (PPD) and a surface p+ region pixel provided directly above the junction in the vertical direction of the pinned diode.

However, in a case of a pixel having a relatively large size and having a relatively large longitudinal and lateral aspect ratio, for example an about 3 μm square pixel, the accumulated charge is mainly limited to a pn-junction capacitance in the transverse direction in a place close to the surface of the photodiode (PD) part, therefore it is difficult to efficiently increase the storage capacity.

Further, in a case where the photoelectric conversion part (layer) of the photodiode (PD) part is simply divided into a plurality of sections, for example two sections, a plurality of transfer gates also end up becoming necessary, therefore the capacity of the charge-to-voltage conversion part ends up increasing, so the conversion efficiency deteriorates. As a result, there is the disadvantage that the noise characteristic deteriorates.

The present invention provides a solid-state imaging device capable of increasing the storage capacity while reducing noise and raising sensitivity, a method for manufacturing the solid-state imaging device, and an electronic apparatus.

Solution to Problem A solid-state imaging device of a first aspect of the present invention comprises a substrate which has a first substrate side and a second substrate side on the side opposite to the first substrate side, a photoelectric conversion part which includes a first conductivity type semiconductor layer formed so that it is buried in the substrate and has a photoelectric conversion function for received light and a charge accumulation function, a second conductivity type separation layer which is formed in a side portion of the first conductivity type semiconductor layer in the photoelectric conversion part, and one charge transfer gate part capable of transferring a charge accumulated in the photoelectric conversion part, wherein the photoelectric conversion part, in at least a portion of the first conductivity type semiconductor layer, includes at least one second-conductivity type semiconductor layer forming at least one sub-area in a direction perpendicular to a normal line of the substrate and having a junction capacitance component together with the first conductivity type semiconductor layer, and the one charge transfer gate part can transfer a charge accumulated in the sub-area in the photoelectric conversion part.

A method for manufacturing the solid-state imaging device of a second aspect of the present invention has a step of forming a first conductivity type semiconductor layer so that it is buried in a substrate having a first substrate side and a second substrate side on the side opposite to the first substrate side to form a photoelectric conversion part having a photoelectric conversion function for received light and a charge accumulation function, a step of forming a second conductivity type separation layer in a side portion of the first conductivity type semiconductor layer in the photoelectric conversion part, a step of forming, in at least a portion of the first conductivity type semiconductor layer in the photoelectric conversion part, at least one sub-area in a direction perpendicular to the normal line of the substrate and forming at least one second-conductivity type semiconductor layer having a junction capacitance component together with the first conductivity type semiconductor layer, and a step of forming one charge transfer gate part capable of transferring a charge accumulated in the sub-area in the photoelectric conversion part.

An electronic apparatus of a third aspect of the present invention comprises a solid-state imaging device and an optical system forming a subject image in the solid-state imaging device, wherein the solid-state imaging device has a substrate which has a first substrate side and a second substrate side on the side opposite to the first substrate side, a photoelectric conversion part which includes a first conductivity type semiconductor layer formed so that it is buried in the substrate and has a photoelectric conversion function for received light and a charge accumulation function, a second conductivity type separation layer which is formed in a side portion of the first conductivity type semiconductor layer in the photoelectric conversion part, and one charge transfer gate part capable of transferring a charge accumulated in the photoelectric conversion part, wherein the photoelectric conversion part, in at least a portion of the first conductivity type semiconductor layer, includes at least one second-conductivity type semiconductor layer forming at least one sub-area in a direction perpendicular to a normal line of the substrate and having a junction capacitance component together with the first conductivity type semiconductor layer, and the one charge transfer gate part can transfer a charge accumulated in the sub-area in the photoelectric conversion part.

Advantageous Effects of Invention

According to the present invention, it is possible to increase the storage capacity while reducing noise and raising the sensitivity.

BRIEF DESCRIPTION OF DRAWINGS

FIG. 6A and FIG. 6B are diagrams for explaining a reason for increase of a storage capacity by providing a player (second conductivity type semiconductor layer) in an n layer (first conductivity type semiconductor layer) of the photoelectric conversion part in the first embodiment.

FIG. 11 is a diagram showing, as a table, the state of depletion in accordance with the bias voltage applied to the pixel in the n layer in the pinned photodiode (PPD) in the first embodiment in comparison with a comparative example.

FIG. 12 is a diagram showing, as a table, pixel performance characteristics in the pinned photodiode (PPD) in the first embodiment in comparison with a comparative example.

FIG. 15A and FIG. 15B are diagrams showing operation timings of a shutter scan and a reading scan at the time of a usual pixel readout operation in the present embodiment.

DESCRIPTION OF EMBODIMENTS

Below, embodiments of the present invention will be explained with reference to the drawings.

First Embodiment

Figure 1:
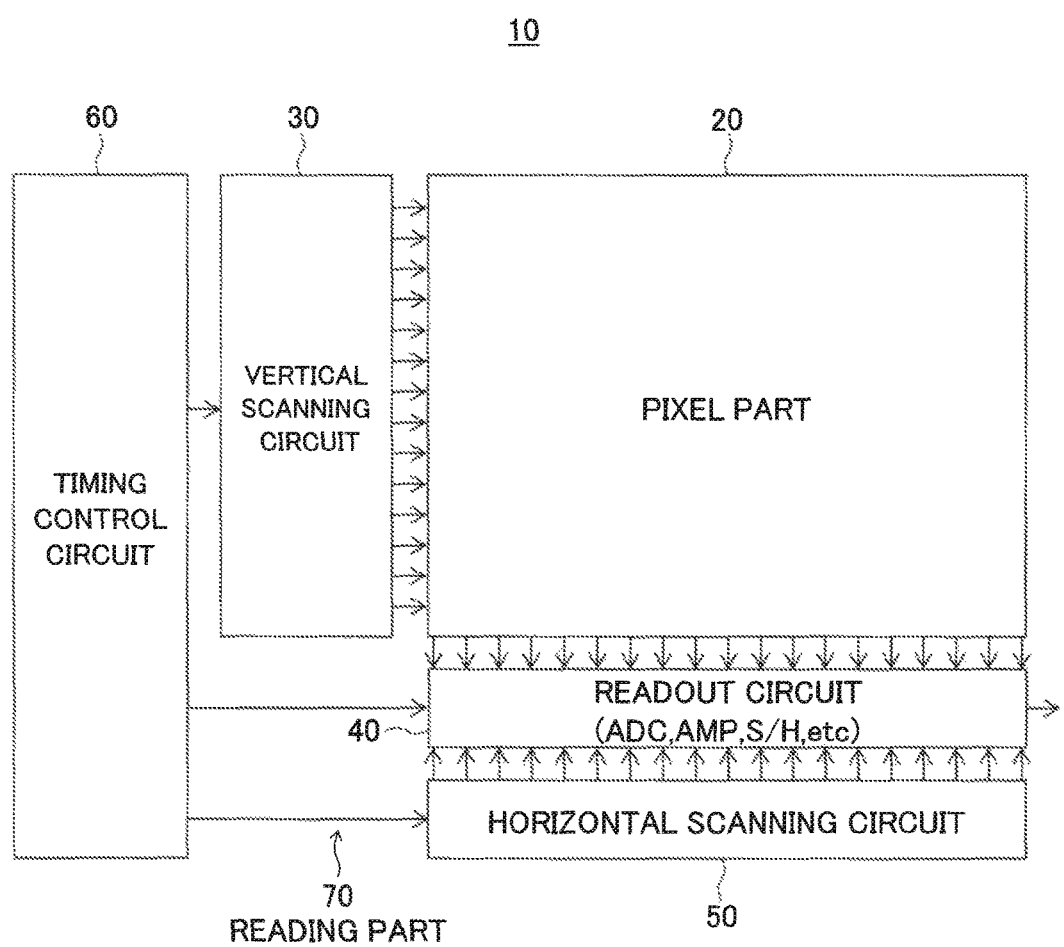
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is for example configured by a CMOS image sensor.

This solid-state imaging device 10, as shown in FIG. 1, has an imaging part constituted by a pixel part 20, a vertical scanning circuit (row scanning circuit) 30, a readout circuit (column readout circuit) 40, a horizontal scanning circuit (column scanning circuit) 50, and a timing control circuit 60 as principal components. Among these components, for example, the vertical scanning circuit 30, readout circuit 40, horizontal scanning circuit 50, and timing control circuit 60 configure a reading part 70 of pixel signals.

In the first embodiment, the solid-state imaging device 10, as will be explained in detail later, has pixels arranged in a matrix in the pixel part 20 (or has the pixel part 20) as photoelectric conversion elements. Each of the pixels is formed by a pinned photodiode (PPD). The pinned photodiode (PPD) in the present embodiment has a substrate having a first substrate side to which light is illuminated (for example back side) and a second substrate side (front side) on the side opposite to the first substrate side, a photoelectric conversion part which includes a first conductivity type (for example n-type in the present embodiment) semiconductor layer (below, sometimes also referred to as the "n layer") formed so that it is buried in the substrate and has a photoelectric conversion function for received light and a charge accumulation function, a second conductivity type (p-type in the present embodiment) separation layer formed in a side portion of the first conductivity type semiconductor layer (n layer) in the photoelectric conversion part, and one charge transfer gate part capable of transferring the charge accumulated in the photoelectric conversion part. Further, the photoelectric conversion part, in at least a portion of the first conductivity type semiconductor layer (n layer), includes at least one second conductivity type (p-type in the present embodiment) semiconductor layer (below, sometimes also referred to as the p layer) forming at least one (one or more) sub-area in a direction (X- or Y-direction) perpendicular to the normal line of the substrate and having a junction capacitance component together with the first conductivity type semiconductor layer (n layer). The one charge transfer gate part is configured so that it can transfer the charge accumulated in the sub-area in the photoelectric conversion part. In this way, by configuring the solid-state imaging device 10 in the present embodiment so that, in the photoelectric conversion part of the pinned photodiode (PPD), a plurality of pn-junction parts in a direction (horizontal direction) perpendicular to the normal line of the substrate are provided in the pixel to make it possible to read out the accumulated charge by one charge transfer part, it becomes possible to increase the storage capacity while reducing noise and raising sensitivity.

Further, in the present embodiment, the solid-state imaging device 10, as will be explained in detail later, is configured so that each of the pixels arranged in a matrix in the pixel part 20 (or the pixel part 20) includes a variable capacity part capable of changing the capacity of the floating diffusion in accordance with a capacity changing signal. In the solid-state imaging device 10, the capacity of the floating diffusion is changed by the variable capacity part for a predetermined period in one reading period after one charge accumulation period (exposure period). The conversion gain is switched in this reading period.

In the present embodiment, the reading part 70 is configured so that it can perform, in one reading period, a first conversion gain mode reading operation of reading out the pixel signal with a first conversion gain in accordance with a first capacity set by the variable capacity part and a second conversion gain mode reading operation of reading the pixel signal with a second conversion gain in accordance with a second capacity (different from the first capacity) set by the variable capacity part. That is, the solid-state imaging device 10 in the present embodiment is provided as a solid-state imaging device having a wide dynamic range which outputs a signal with respect to a charge (electrons) photoelectrically converted in one accumulation period (exposure period) while switching between the first conversion gain (for example high conversion gain) mode and the second conversion gain (low conversion gain) mode inside the pixel in one reading period and outputs both of a bright signal and dark signal.

The reading part 70 in the present embodiment basically performs the first conversion gain mode reading operation and second conversion gain mode reading operation in the accumulation period after the reset period for discharging the charge in the photodiode and floating diffusion. Further, in the present embodiment, the reading part 70 performs at least one of the first conversion gain mode reading operation or second conversion gain mode reading operation in the reading period after at least one transfer period after the reading period after the reset period. That is, in the reading period after the transfer period, sometimes both of a first conversion gain mode reading operation and a second conversion gain mode reading operation are performed.

In a usual pixel readout operation, by driving by the reading part 70, a shutter scan operation is carried out, then a reading scan operation is carried out. A first conversion gain mode reading (HCG) operation and second conversion gain mode reading (LCG) operation are carried out in the reading scan period.

Below, the configurations and functions of the parts in the solid-state imaging device 10 will be briefly explained, then the configuration of the pinned photodiode (PPD) part, the configuration of the variable capacity part, and the readout processing etc. concerned with the same will be explained in detail.

Configurations of Pixel Part 20 and Pixels PXL

In the pixel part 20, a plurality of pixels each including a photodiode (photoelectric conversion element) and an in-pixel amplifier are arranged in a two-dimensional matrix comprised of N rows and M columns.

Figure 2:
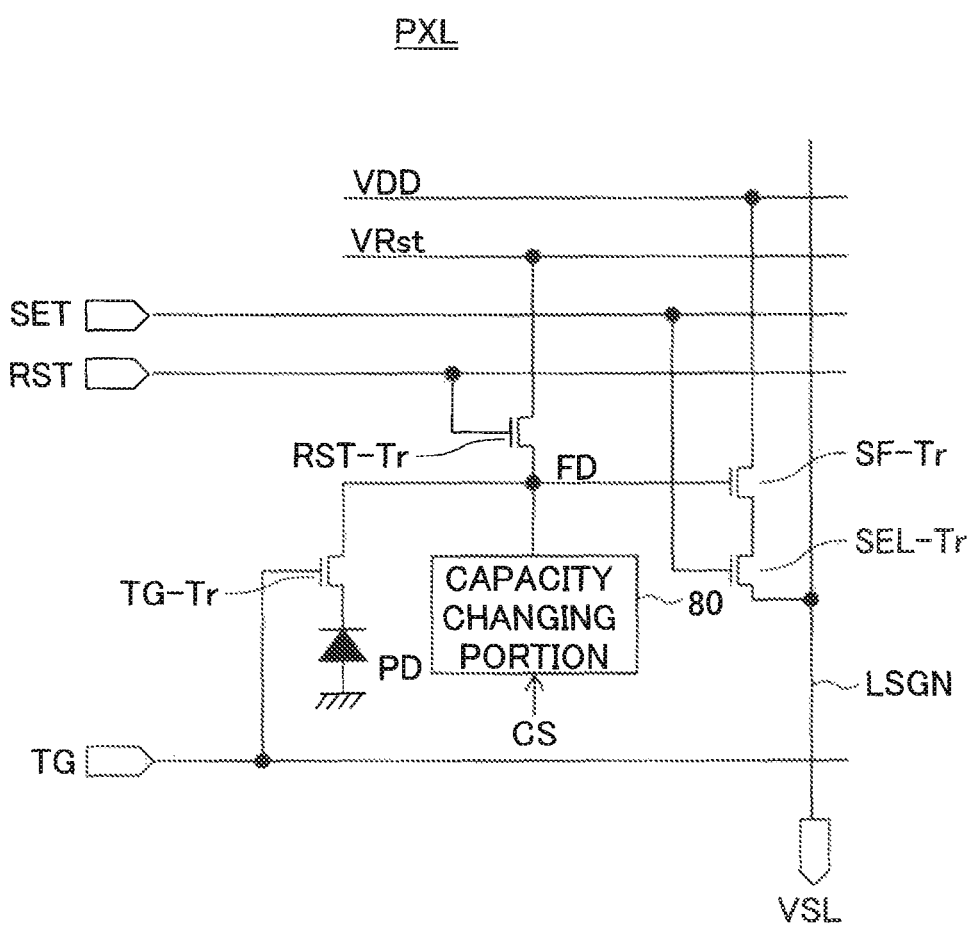
FIG. 2 is a circuit diagram showing an example of a pixel according to the first embodiment.

FIG. 2 is a circuit diagram showing an example of a pixel according to the present embodiment.

This pixel PXL has for example a photodiode (PD) as a photoelectric conversion part (photoelectric conversion element). For this photodiode PD, one each of a charge transfer gate part (transfer element) constituted by a transfer transistor TG-Tr, a reset element constituted by a reset transistor RST-Tr, a source follower element constituted by a source follower transistor SF-Tr, and a selection element constituted by a selection transistor SEL-Tr are provided.

Further, the pixel PXL has a variable capacity part 80 which is connected to a floating diffusion FD (floating diffusion layer) and can change the capacity of the floating diffusion FD in response to a capacity changing signal CS.

The photodiode PD generates a signal charge (here, electrons) in an amount in accordance with the incident light quantity and accumulates the same. Below, an explanation will be given of a case where the signal charge is comprised of electrons and each transistor is an n-type transistor, but the signal charge may be comprised of holes and each transistor may also be a p-type transistor. Further, the present embodiment is effective also in a case where each transistor is shared among a plurality of photodiodes and a case where a three-transistor (3Tr) pixel not having a selection transistor is employed.

In each pixel PXL, as the photodiode (PD), use is made of a pinned photodiode (PPD). On the substrate surface forming the photodiode (PD), there is a surface level due to dangling bonds or other defects, therefore a large charge (dark current) is generated by the heat energy, so a correct signal can no longer be read out. In a pinned photodiode (PPD), a charge accumulation part of the photodiode (PD) is buried in the substrate, so it becomes possible to reduce entry of dark current to the signal.

However, in a case where the size is relatively large and the longitudinal and lateral aspect ratio is relatively large, for example, a case of an about 3 μm square pixel, the accumulated charge is mainly limited to the pn-junction capacitance in the vertical direction (normal line direction of substrate:depth direction of substrate) at a location close to the photodiode (PD) part (photoelectric conversion part), so it is difficult to efficiently increase the storage capacity.

Therefore, in the solid-state imaging device 10 in the first embodiment, in the photoelectric conversion part of the pinned photodiode (PPD), in order to increase the storage capacity, a plurality of sub-areas are provided by dividing the photoelectric conversion layer (for example n layer) so that there are a plurality of pn junction parts in the direction (horizontal direction) perpendicular to the normal line of the substrate inside the pixel. However, in a case where the photoelectric conversion layer is simply divided into a plurality of sections, for example two sections, a plurality of transfer gates also end up becoming necessary, therefore the capacity of the charge-to-voltage conversion part ends up increasing, so the conversion efficiency deteriorates. As a result, the noise characteristic deteriorates. For this reason, the solid-state imaging device 10 in the first embodiment employs a configuration capable of reading out the charges accumulated in the sub-areas by the single charge transfer gate part constituted by the transfer transistor TG-Tr. Due to this, in the solid-state imaging device 10 in the first embodiment, it becomes possible to increase the storage capacity while reducing noise and increasing sensitivity and it becomes possible to expand the dynamic range without degrading the optical characteristics.

Figure 3:
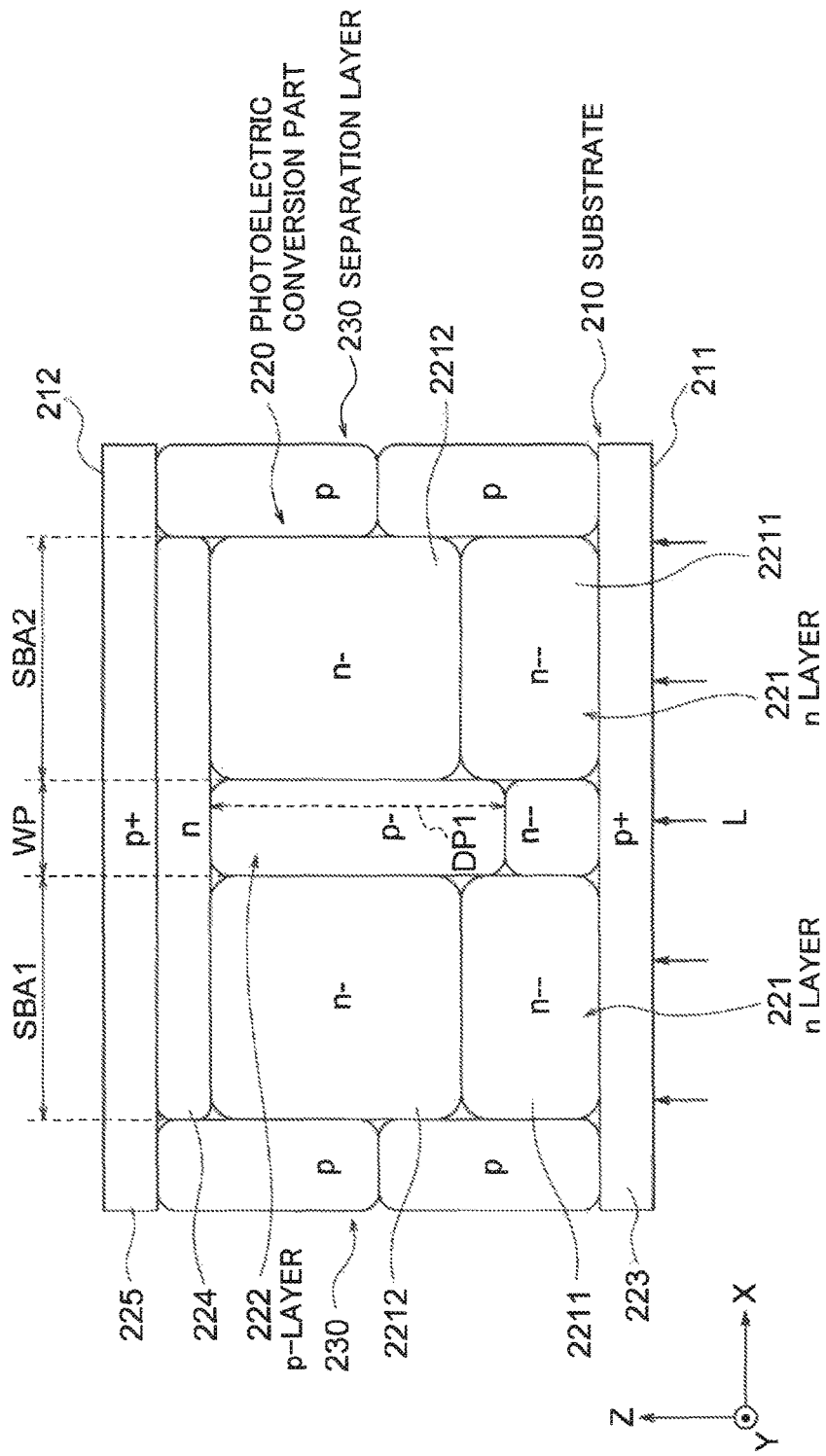
FIG. 3 is a simplified cross-sectional view showing an example of the configuration of principal parts excluding a charge transfer gate part in a pinned photodiode (PPD) according to the first embodiment of the present invention.
Figure 4:
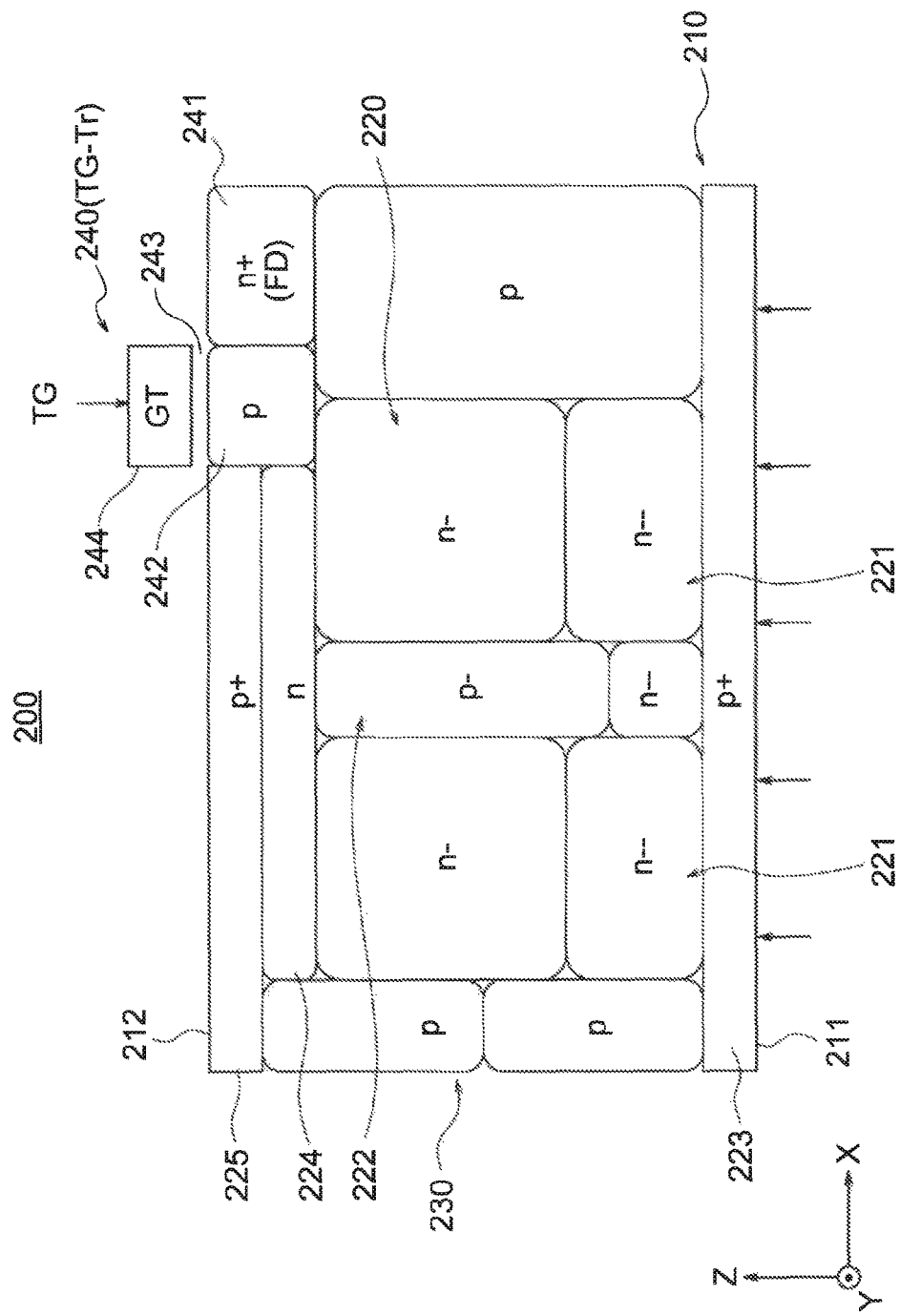
FIG. 4 is a simplified cross-sectional view showing an example of the configuration of principal parts including a charge transfer gate part in a pinned photodiode (PPD) according to the first embodiment of the present invention.
Figure 5:
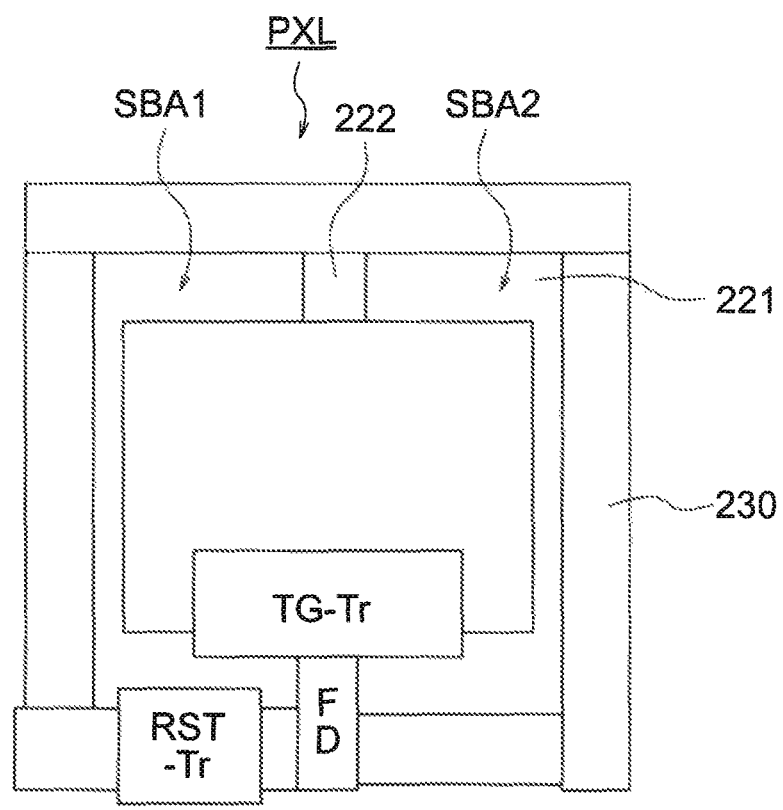
FIG. 5 is a view diagrammatically showing an example of the layout of principal parts including the charge transfer gate part in the pinned photodiode (PPD) according to the first embodiment of the present invention.

Concrete Example of Configuration of Pinned Photodiode (PPD) FIG. 3 is a simplified cross-sectional view showing an example of the configuration of principal parts excluding a charge transfer gate part in the pinned photodiode (PPD) according to the first embodiment of the present invention. FIG. 4 is a simplified cross-sectional view showing an example of the configuration of principal parts including a charge transfer gate part in the pinned photodiode (PPD) according to the first embodiment of the present invention. FIG. 5 is a diagram schematically showing an example of the layout of principal parts including a charge transfer gate part in the pinned photodiode (PPD) according to the first embodiment of the present invention. Note that, here, the pinned photodiode (PPD) will be represented by the notation 200.

The pinned photodiode (PPD) 200 in FIG. 3 has a semiconductor substrate (below, simply referred to as the "substrate") 210 having a first substrate surface 211 side (for example back side) to which light L is illuminated and a second substrate surface 212 side (front side) on the side opposite to the first substrate surface 211 side. The pinned photodiode 200 has a photoelectric conversion part 220 which includes semiconductor layers (n− layers) 221 of a first conductivity type (n-type in the present embodiment) formed so that they are buried in the substrate 210 and has a photoelectric conversion function for the received light and charge accumulation function, second conductivity type (p-type in the present embodiment) separation layers 230 which are formed in the side portions of the n-layers (first conductivity type semiconductor layers) 221 in the photoelectric conversion part 220, and one charge transfer gate part 240 (see FIG. 4 and FIG. 5) capable of transferring a charge accumulated in the photoelectric conversion part 220.

The photoelectric conversion parts 220 in FIG. 3 and FIG. 4 are configured so that the n layer (first conductivity type semiconductor layer) 221 has a double-layer structure in the normal line direction of the substrate 210 (Z-direction in the orthogonal coordinate system in the figure). In the present example, an n− layer 2211 is formed on the first substrate surface 211 side, while an n− layer 2212 is formed in the upper layer side (second substrate surface 212 side) of this n− layer 2211. This configuration is one example. The structure may be a single layer structure as well. Further, the structure may be a multilayer structure of three or more layers.

Further, the photoelectric conversion part 220 in the first embodiment is configured so that, in the n layer (first conductivity type semiconductor layer) 221, at least one (two in the present example) sub-areas SBA1 and SBA2 are formed in the direction perpendicular to the normal line of the substrate (X-direction in the orthogonal coordinate system in the figure), and at least one (one in the present example) p layer (second conductivity type semiconductor layer, i.e., p− layer in the present example) 222 having a junction capacitance component together with the n layer (first conductivity type semiconductor layer) 221 is included.

In the photoelectric conversion part 220 in the first embodiment, the p− layer 222 has a predetermined width WP in the direction X perpendicular to the normal line of the substrate 210 and has a depth DP1 in the normal line direction Z of the substrate starting from the surface on the second substrate surface 212 side of the n layer (first conductivity type semiconductor layer) 221, but not reaching the surface on the first substrate surface 211 side.

In the photoelectric conversion part 220 in the first embodiment, on the surfaces of the n layers (first conductivity type semiconductor layers) 221 and p type separation layers 230 on the first substrate surface 211 sides, a second p layer (second conductivity type semiconductor layer, i.e., p+ layer in the present example) 223 is formed.

In the photoelectric conversion part 220 in the first embodiment, on the surfaces of the n layers (first conductivity type semiconductor layers) 221 and p− layer 222 on the second substrate surface 212 sides, a second n layer (first conductivity type semiconductor layer) 224 is formed.

In the photoelectric conversion part 220 in the first embodiment, on the surfaces of the second n layer (first conductivity type semiconductor layer) 224 and p type separation layers 230 on the second substrate surface 212 sides, a third p layer (second conductivity type semiconductor layer, i.e., p+ layer in the present example) 225 is formed.

The one charge transfer gate part 240 is configured by a transfer transistor TG-Tr. The charge transfer gate part 240 in FIG. 4 is configured by including a third n layer (first conductivity type semiconductor layer, i.e., n+ layer in the present example) 241 forming a floating diffusion FD to which the charges accumulated in the storage capacity parts formed in the sub-areas SBA1 and SBA2 etc. in the photoelectric conversion part 220 are transferred, a fourth p layer (second conductivity type semiconductor layer) 242 which is formed between first end parts of the second n layer (first conductivity type semiconductor layer) 224 and third p+ layer (second conductivity type semiconductor layer) 225 stacked in the photoelectric conversion part 220 and the third n+ layer (first conductivity type semiconductor layer) 241 and including a gate electrode (GT) 244 which is formed through an insulation film 243 on at least the fourth p layer 242.

This one charge transfer gate part 240 is configured so that the charges accumulated in the sub-areas SBA1 and SBA2 in the photoelectric conversion part 220 can be transferred.

The transfer transistor TG-Tr configuring the charge transfer gate part 240 is connected between the pinned photodiode (PPD) 220 and the floating diffusion FD and is controlled through a control signal TG. The transfer transistor TG-Tr is selected in a period where the control signal TG is a high level (H) and becomes a conductive state and transfers the charge (electrons) which is photoelectrically converted and accumulated in the photodiode PD to the floating diffusion FD.

In this way, by configuring the solid-state imaging device 10 of the first embodiment so as to form two sub-areas SBA1 and SBA2 in the photoelectric conversion part 220 of a pinned photodiode (PPD) in the direction X perpendicular to the normal line of the substrate 210 and increasing the pn-junction parts in the direction (horizontal direction) X perpendicular to the normal line of the substrate to provide a plurality inside the pixel and thereby enabling reading of the accumulated charges by one charge transfer part, it becomes possible to increase the storage capacity while reducing noise and raising the sensitivity and it becomes possible to expand the dynamic range without degrading the optical characteristics.

Here, the reason the storage capacity increases due to forming sub-areas SBA1 and SBA2 in the direction X perpendicular to the normal line of the substrate in the n layer (first conductivity type semiconductor layer) 221 in the photoelectric conversion part 220 in the first embodiment and providing the p layer 222 having a junction capacitance component together with the n layers (first conductivity type semiconductor layers) 221 will be considered.

FIG. 6A and FIG. 6B are diagrams for explaining the reason for increase of the storage capacity by providing the p− layer (second conductivity type semiconductor layer) 222 at the n layers (first conductivity type semiconductor layers) 221 in the photoelectric conversion part 220 in the first embodiment. FIG. 6A shows simplified the structure of the photoelectric conversion part 220 of a pinned photodiode (PPD) having a narrow pixel pitch, while FIG. 6B shows simplified the structure of the photoelectric conversion part 220 of a pinned photodiode (PPD) having a broad pixel pitch.

The reason for the storage capacity increasing due to the provision of the p− layer (second conductivity type semiconductor layer) 222 at the n layers (first conductivity type semiconductor layers) 221 will be explained.

In general, an n region (n layer) of the photodiode must be completely depleted. The depletion potential (voltage) φ"V" must be sufficiently low for complete charge transfer. The maximum depletion potential must be in the vicinity of the charge transfer gate part 240. In order to make the storage capacity maximum, it is necessary to make the concentration of the n regions (n layers) maximum after satisfying the above condition of space charge density. However, if the quantity of impurities in the n layers 221 is increased, the PD potential becomes deeper and the readout voltage rises, therefore there is a limit to making the concentration of the n layers 221 richer.

In general, in the p+n junction model, the following model stands.

$$W_d = \sqrt{\frac{2\epsilon_{Si}\,(\varphi_{bi} \pm V_{app})}{qN_d}}$$

$W_d$: Depletion layer distance
$\epsilon_{Si}$: Dielectric ratio of silicon
$\varphi_{bi}$: Internal voltage
$V_{app}$: Depletion voltage
$N_d$: Donor concentration According to this model, the following can be derived. As shown in FIG. 6A, with a narrow pixel pitch, the depletion layer distance Wd in the direction X perpendicular to the normal line of the substrate 210 is short, therefore the depletion voltage Vapp is lower when the donor concentration Nd is the same. As shown in FIG. 6B, when the pixel pitch becomes wide, the depletion voltage Vapp rises, so reading and depletion at a low voltage become difficult. When the dopant concentration is lowered, the charge becomes saturated, so this falls.

Therefore, by providing the p− layer (second conductivity type semiconductor layer) 222 at the n layers (first conductivity type semiconductor layers) 221 in the photoelectric conversion part 220 to thereby form sub-areas SBA1 and SBA2 having a depletion layer distance Wd shorter than the pixel pitch in the direction X perpendicular to the normal line of the substrate, it becomes possible to increase the storage capacities in the sub-areas SBA1 and SBA2 having a lower depletion voltage Vapp, therefore the saturation output at the time of same readout voltage is improved.

Here, the storage capacity corresponding to the pn-junction capacitance in the pinned photodiode (PPD) in the first embodiment shown in FIG. 3 and FIG. 4 and so on will be considered.

Figure 7A:
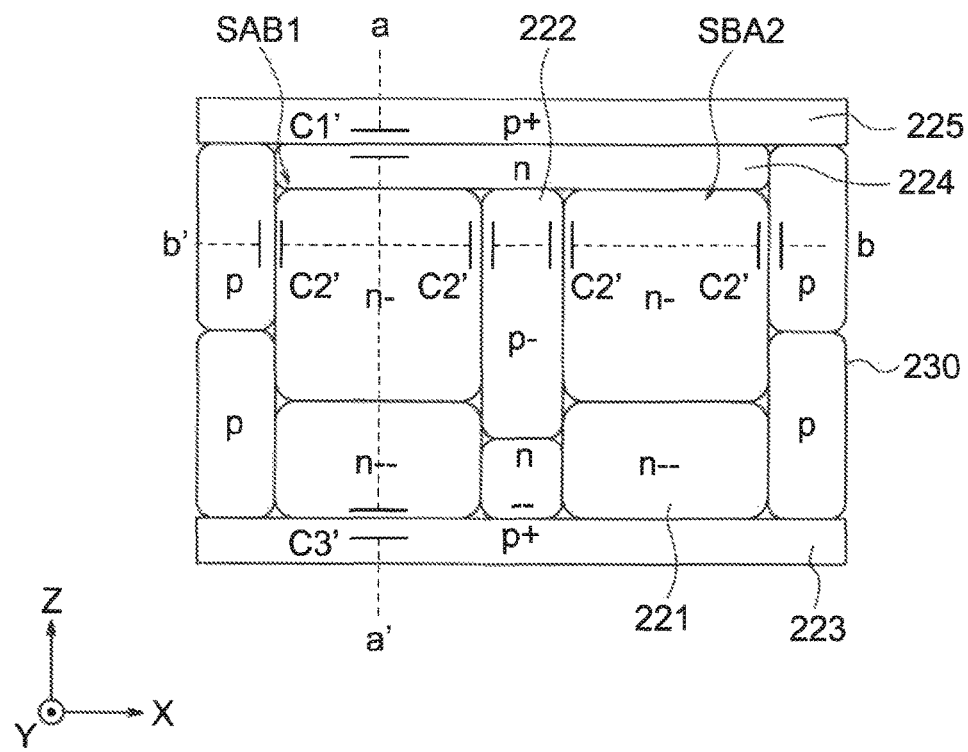
FIG. 7A and FIG. 7B are diagrams for explaining a pn-junction capacitance in the pinned photodiode (PPD) in the first embodiment in comparison with a comparative example.
Figure 7B:
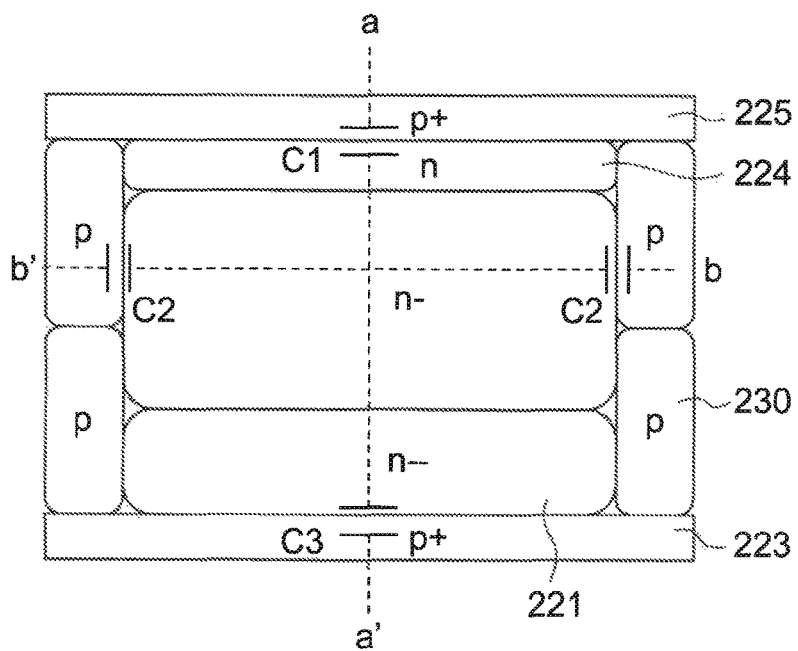

FIG. 7A and FIG. 7B are diagrams for explaining the pn-junction capacitance in the pinned photodiode (PPD) in the first embodiment in comparison with a comparative example. FIG. 7A is a diagram showing the pn-junction capacitance in the pinned photodiode (PPD) 200 in the first embodiment in which two sub-areas SBA1 and SBA2 are formed in the direction X (horizontal direction) perpendicular to the normal line of the substrate 210. FIG. 7B is a diagram showing a pn-junction capacitance in a comparative example where two sub-areas SBA1 and SBA2 are not formed in the direction X perpendicular to the normal line of the substrate 210.

FIG. 7A and FIG. 7B diagrammatically show junction capacities C1 and C3 on a broken line a-a' set in the normal line direction Z (vertical direction) of the substrate 210 and junction capacities C2 and C2' on broken lines b-b' set in the direction X perpendicular to the normal line of the substrate 210.

As seen from FIG. 7A and FIG. 7B, by forming the two sub-areas SBA1 and SBA2 in the direction X perpendicular to the normal line of the substrate 210 by the p layer (second conductivity type semiconductor layer, i.e., p− layer in the present example) 222 as in the pinned photodiode (PPD) 200 in the first embodiment, compared with a comparative example not forming sub-areas, the number of pn-junction parts in the direction X perpendicular to the normal line of the substrate 210 increases from two to four. Along with this, the number of pn-junction capacitances C2' increases. By formation of the two sub-areas SBA1 and SBA2 in the direction X perpendicular to the normal line of the substrate 210 by this p− layer 222, the LFWC (Linear Full Well Capacity) is boosted. This LFWC is obtained according to the horizontally modulated p-n doping profile in order to obtain a space charge density represented by $d\varphi^2/dx^2$ ($\varphi$: electrostatic potential, x: spatial coordination in depletion layer in PPD).

Figure 8A:
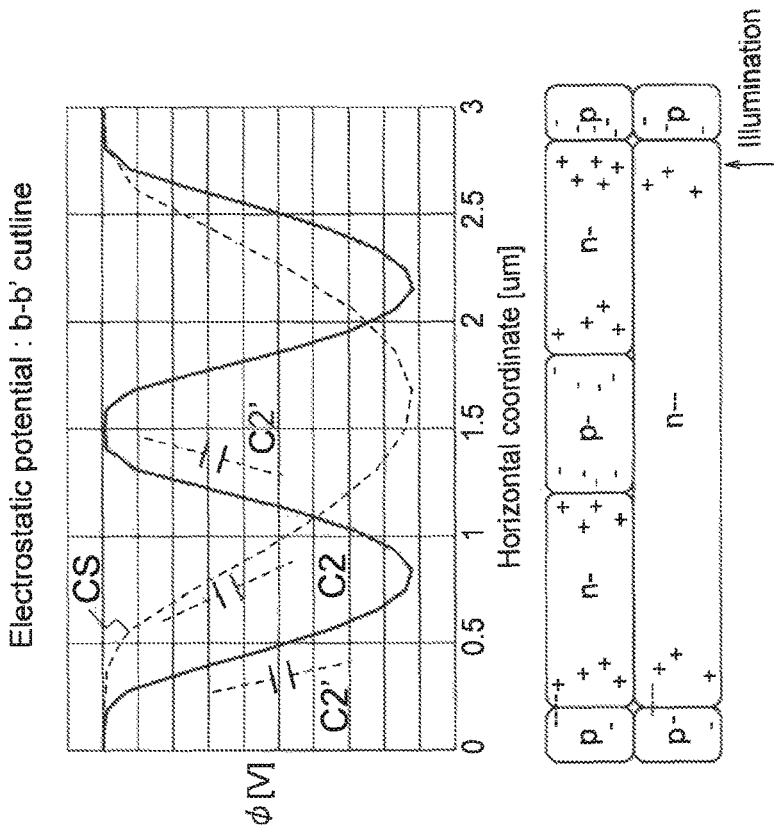
FIG. 8A and FIG. 8B are diagrams showing electrostatic potential profiles along cut lines a-a' and b-b' by broken lines shown in FIG. 7A and FIG. 7B.
Figure 8B:
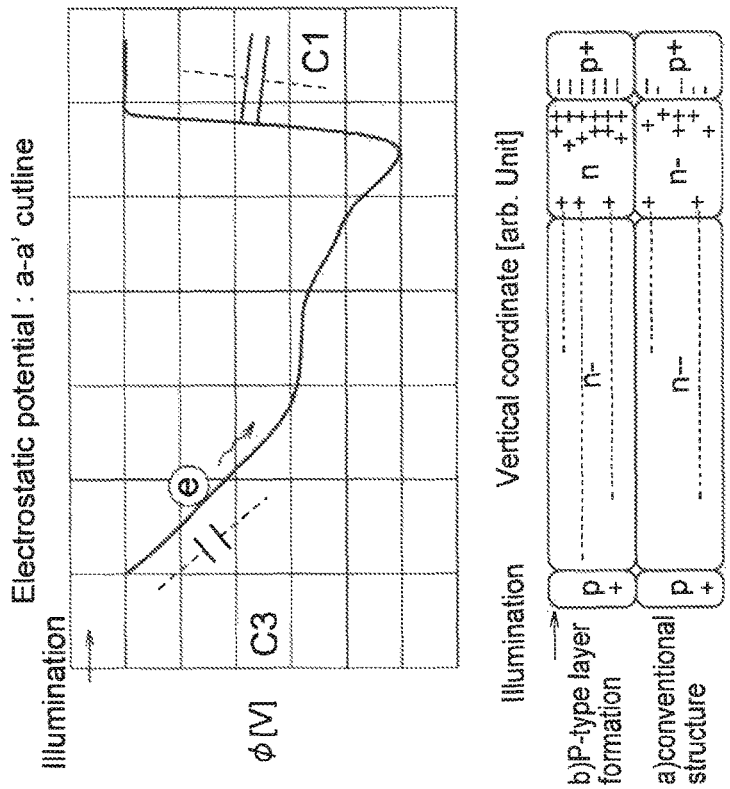

FIG. 8A and FIG. 8B are diagrams showing electrostatic potential profiles along the cut lines a-a' and b-b' by broken lines shown in FIG. 7A and FIG. 7B. FIG. 8A shows the electrostatic potential profile along the cut line a-a', while FIG. 8B shows the electrostatic potential profile along the cut line b-b'. Further, in FIG. 8A and FIG. 8B, schematic views of pn-junctions and the estimated space charge densities and capacity components in the vicinities of the pn-junctions are shown as well. Further, a curve CS indicated by a broken line shows the characteristic of the comparative example.

From FIG. 8A and FIG. 8B, a significant increase of the space charge in both directions of the vertical direction (normal line direction Z of the substrate 210) and horizontal direction (direction X perpendicular to the normal line of the substrate 210) in the structure of the pinned photodiode (PPD) 200 in the first embodiment as the result of the increase of the n-dopant and the vertical junction capacitance can be seen. In other words, according to the pinned photodiode (PPD) 200 in the first embodiment, as shown in FIG. 8A, due to the p– layer 222, the concentration of the n layers 221 can be optimized while the potential of the surface layer portion can be optimized. Further, as shown in FIG. 8B, a capacity component can be added by the p– layer 222.

Figures 9A, 9B:
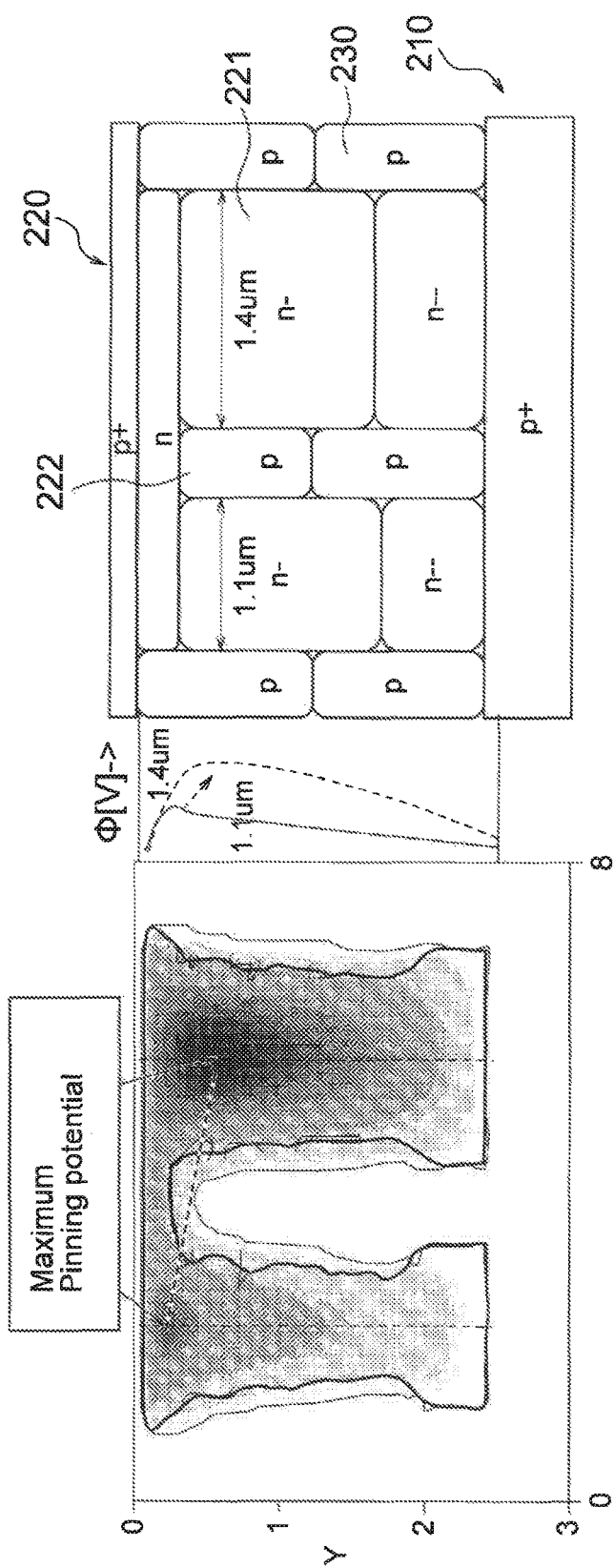
FIG. 9A and FIG. 9B are diagrams showing results of 2D device/process simulation by using a pinned photodiode (PPD) in which sizes of two sub-areas are different (1.1 μm and 1.4 μm).

In order to confirm the latent modulation explained above, a 2D device/process simulation was run using a pinned photodiode (PPD) in which two sub-areas have different sizes (1.1 μm and 1.4 μm). FIG. 9A and FIG. 9B are diagrams showing results by running the 2D device/process simulation by using a pinned photodiode (PPD) in which the two sub-areas have different sizes (1.1 μm and 1.4 μm). FIG. 9A shows an electrostatic potential profile according to the simulation, while FIG. 9B shows a doping profile model. Note that, here, regarding the depth of the p– layer 222, a device having a depth deep enough to reach the p+ layer 223 was applied as the model.

This simulation suggests that in order to suppress both of the readout voltage Vpin making movement of the charge difficult and the latent profile shift, in a larger pixel, two sub-areas SBA1 and SBA2 must be formed by the p layer (second conductivity type semiconductor layer, i.e., p– layer in the present example) 222 in the direction X perpendicular to the normal line of the substrate 210 as in the pinned photodiode (PPD) 200 in the first embodiment. According to the simulation, a rise of the depletion voltage and shift of the peak potential to a deeper direction were confirmed. That is, when the pixel size becomes large, it is difficult to maintain the transfer characteristic in the direction in which the potential peak becomes deeper and make the surface n layer richer to maintain the capacity. However, it becomes possible to maintain the characteristics by forming the two sub-areas SBA1 and SBA2 in the direction X perpendicular to the normal line of the substrate 210 in the n layers 221 by the p– layer (second conductivity type semiconductor layer) 222 as in the pinned photodiode (PPD) 200 in the first embodiment.

Figure 10A:
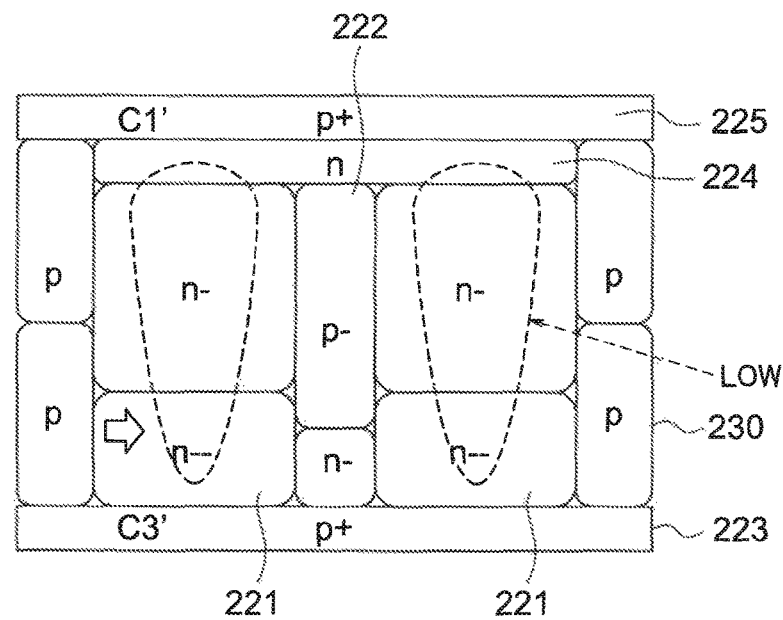
FIG. 10A and FIG. 10B are diagrams for explaining a state of depletion in accordance with a bias voltage applied to the pixel in the n layer in the pinned photodiode (PPD) in the first embodiment in comparison with a comparative example.
Figure 10B:
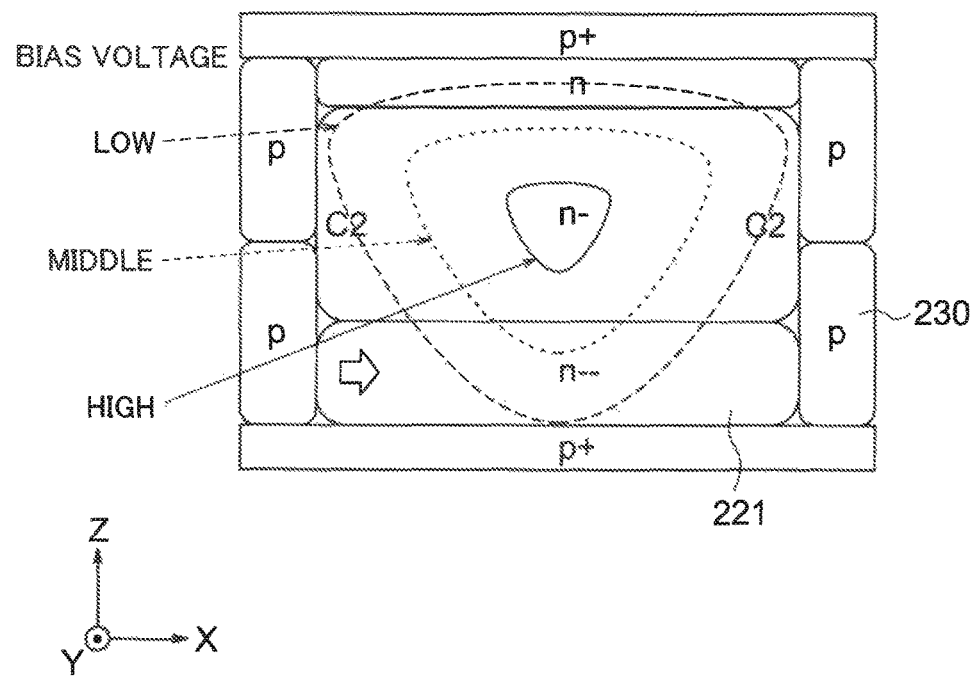

FIG. 10A and FIG. 10B are diagrams for explaining a state of depletion in accordance with a bias voltage applied to the pixel in the n layers 221 in the pinned photodiode (PPD) 200 in the first embodiment in comparison with a comparative example. FIG. 10A is a diagram showing the state of depletion in accordance with a bias voltage applied to the pixel in the n layers 221 in the pinned photodiode (PPD) 200 in the first embodiment forming the two sub-areas SBA1 and SBA2 in the direction X (horizontal direction) perpendicular to the normal line of the substrate 210. FIG. 10B is a diagram showing the state of depletion in accordance with a bias voltage applied to the pixel in the n layer 221 in a comparative example not forming two sub-areas SBA1 and SBA2 in the direction X perpendicular to the normal line of the substrate 210. FIG. 11 is a diagram showing, as a table, the state of depletion in accordance with a bias voltage applied to the pixel in the n layers 221 in the pinned photodiode (PPD) 200 in the first embodiment in comparison with a comparative example.

As seen from FIG. 10A and FIG. 10B, and FIG. 11, by forming the two sub-areas SBA1 and SBA2 in the direction X perpendicular to the normal line of the substrate 210 by the p layer (second conductivity type semiconductor layer, i.e., p– layer in the present example) 222 as in the pinned photodiode (PPD) 200 in the first embodiment, compared with a comparative example not forming sub-areas, complete depletion can be realized even if the bias voltage is low. Contrary to this, in the comparative example, no matter what level the bias voltage—low, middle, or high —, only partial depletion can be realized. Complete depletion is difficult.

FIG. 12 is a diagram showing, as a table, pixel performance characteristics in the pinned photodiode (PPD) 200 in the first embodiment in comparison with a comparative example. As seen from FIG. 12, the pinned photodiode (PPD) 200 in the first embodiment has good characteristics compared with the comparative example concerning the LFWC performance, response, and dark noise. In particular, concerning the LFWC performance, the pinned photodiode (PPD) 200 in the first embodiment is especially better than the comparative example.

Figure 13:
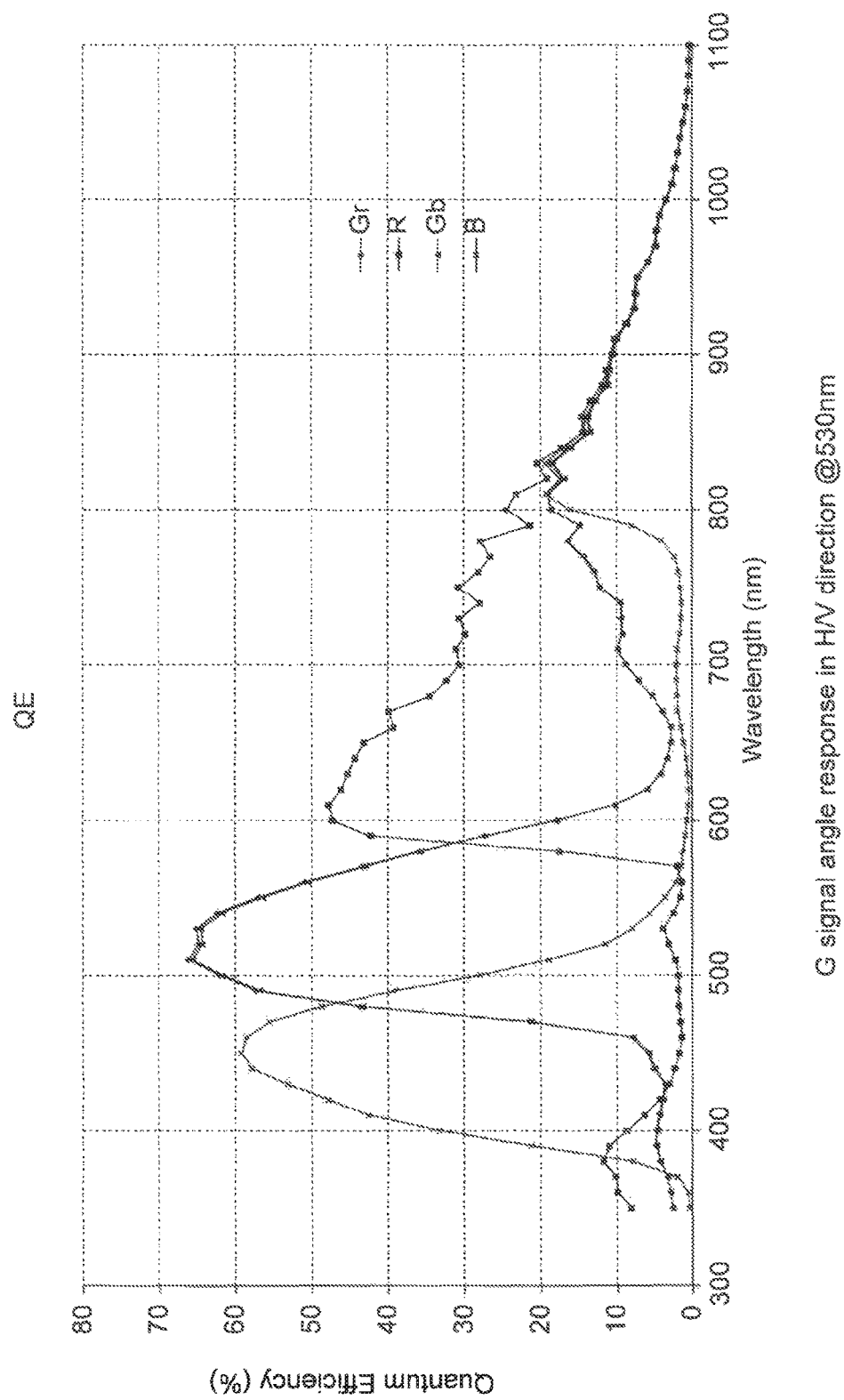
FIG. 13 is a diagram showing a spectral response characteristic in the pinned photodiode (PPD) in the first embodiment.
Figure 14:
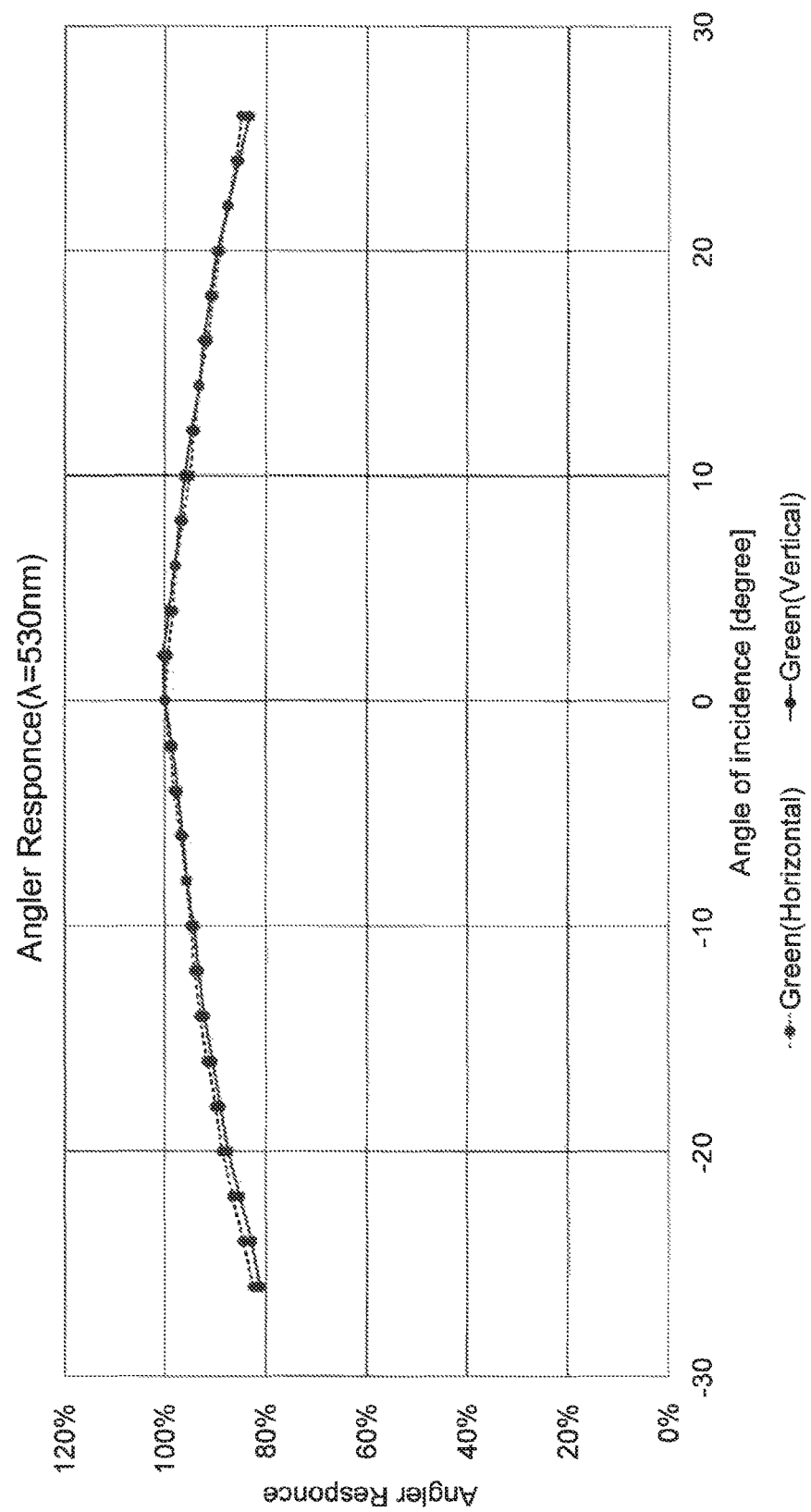
FIG. 14 is a diagram showing an angle response characteristic in the pinned photodiode (PPD) in the first embodiment.

FIG. 13 is a view showing a spectral response characteristic in the pinned photodiode (PPD) 200 in the first embodiment. FIG. 14 is a view showing an angle response characteristic in the pinned photodiode (PPD) 200 in the first embodiment.

As shown in FIG. 13 and FIG. 14, irrespective of formation of the p layer 222 in the pinned photodiode (PPD) 200, no drop in important optical performances such as quantum efficiency and uniformity of angle response was seen. A peak quantum efficiency of 77% is obtained at a wavelength 520 nm in the spectral response in FIG. 13. FIG. 14 shows the angle response of a green pixel in a Bayer array. There is no significant difference of angle response in the horizontal direction and vertical direction. Both are good.

In this way, by configuring the solid-state imaging device 10 in the first embodiment so as to form the two sub-areas SBA1 and SBA2 in the direction X perpendicular to the normal line of the substrate 210 in the photoelectric conversion part 220 of the pinned photodiode (PPD) 200 and increasing the pn-junction parts (junction parts) in the direction (horizontal direction) X perpendicular to the normal line of the substrate so as to provide a plurality of them in the pixel and thereby enabling reading of the accumulated charges by one charge transfer part, it becomes possible increase the storage capacity while reducing noise and raising sensitivity and it becomes possible to expand the dynamic range without degrading the optical characteristics.

Above, a detailed explanation was given of the structure, characteristics, and effects in the pinned photodiode (PPD) 200 in the first embodiment. Here, we will return to the explanation of the pixel in FIG. 2.

The reset transistor RST-Tr is connected between the power supply line VRst and the floating diffusion FD and is controlled through the control signal RST. Note that, the reset transistor RST-Tr may be connected between the power supply line VDD and the floating diffusion FD and be controlled through the control signal RST as well. The reset transistor RST-Tr is selected and becomes a conductive state in the period when the control signal RST is the H level and resets the floating diffusion FD to the potential of the power supply line VRst (or VDD).

Note that, the first embodiment, as will be explained later, can be configured so that first binning transistors (81$n$, 81$n$+1) used as the variable capacity parts 80 have functions as reset elements as well. Further, it is also possible to employ a configuration where all pixels of the plurality of (two in the present example) pixels which are connected through the first binning transistors (81n, 81n+1) share the reset element formed by the first binning transistor (81n+1) which discharges the floating diffusion FD in the reset period PR.

The source follower transistor SF-Tr and the selection transistor SEL-Tr are connected in series between the power supply line VDD and the vertical signal line LSGN. The gate of the source follower transistor SF-Tr is connected to the floating diffusion FD. The selection transistor SEL-Tr is controlled through the control signal SEL. The selection transistor SEL-Tr is selected and becomes a conductive state in the period where the control signal SEL is the H level. Due to this, the source follower transistor SF-Tr outputs to the vertical signal line LSGN the read-out signal VSL of column output obtained by converting the charge in the floating diffusion FD to a voltage signal with a gain in accordance with the charge amount (potential). These operations are carried out simultaneously and in parallel for one row's worth of pixels since for example the gates of the transfer transistors TG-Tr, reset transistors RST-Tr, and selection transistors SEL-Tr are connected in units of rows.

In the pixel part 20, the pixels PXL are arranged in N rows and in M columns. Therefore, there are N number of each of the control lines LSEL, LRST, and LTG, and there are M vertical signal lines LSGN. In FIG. 1, the control lines LSEL, LRST, and LTG are represented as one row scanning control line.

The vertical scanning circuit 30 drives pixels through the row scanning control line in the shutter row and read row under the control by the timing control circuit 60. Further, the vertical scanning circuit 30 outputs a row selection signal having row addresses of the read row for reading the signals and the shutter row for resetting the charge accumulated in the photodiode PD according to the address signal.

As explained above, in the usual pixel readout operation, a shutter scan is carried out by driving of the reading part 70 by the vertical scanning circuit 30. After that, the reading scan is carried out.

FIG. 15A and FIG. 15B are diagrams showing operation timings of the shutter scan and reading scan at the time of a usual pixel readout operation in the present embodiment.

The control signal SEL for controlling the on (conductive) state and off (non-conductive) state of the selection transistor SEL-Tr is set at an L level for a shutter scan period PSHT whereby the selection transistor SEL-Tr is held in a non-conductive state, while is set at an H level for a reading scan period PRDO whereby the selection transistor SEL-Tr is held in a conductive state. Further, in the shutter scan period PSHT, the control signal TG is set at an H level for the predetermined term in the period where the control signal RST is the H level whereby the photodiode PD and the floating diffusion FD are reset through the reset transistor RST-Tr and transfer transistor TG-Tr.

In the reading scan period PRDO, the control signal RST is set at an H level whereby the floating diffusion FD is reset through the reset transistor RST-Tr. In the reading period PRD1 after this reset period PR, the signal in reset state is read out. After the reading period PRD1, for the predetermined period, the control signal TG is set at an H level whereby the accumulated charge in the photodiode PD is transferred through the transfer transistor TG-Tr to the floating diffusion FD. A signal in accordance with the accumulated electrons (charge) is read out in the reading period PRD2 after this transfer period PT.

Note that, in the usual pixel readout operation in the first embodiment, the accumulation period (exposure period) EXP, as shown in FIG. 15B as an example, is a period from when resetting the photodiode PD and floating diffusion FD to switch the control signal TG to the L level in the shutter scan period PSHT up to when switching of the control signal TG to the L level again in order to end the transfer period PT in the reading scan period PRDO.

The readout circuit 40 may be configured so as to include a plurality of column signal processing circuits (not shown) which are arranged corresponding to the column outputs of the pixel part 20 so that column parallel processing is possible among the plurality of column signal processing circuits.

The readout circuit 40 can be configured including correlated double sampling (CDS) circuits or ADC (analog-to-digital converters: AD converters), amplifiers (AMP), and sample/hold (S/H) circuits, etc.

Figure 16A:
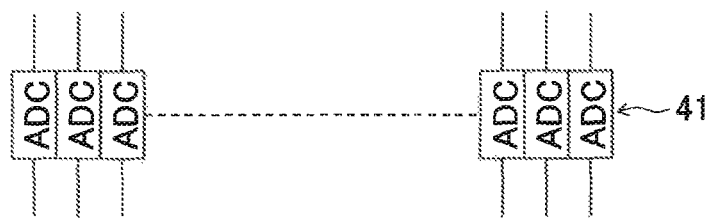
FIG. 16A to FIG. 16C are diagrams for explaining an example of the configuration of a read-out system of column output of the pixel part in the solid-state imaging device according to the embodiments of the present invention.
Figure 16B:
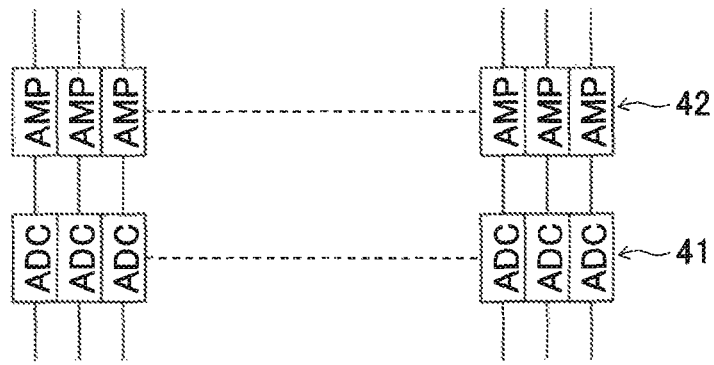
Figure 16C:
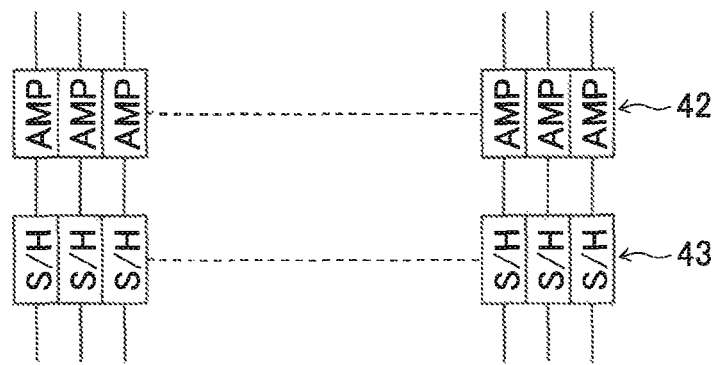

In this way, the readout circuit 40, for example, as shown in FIG. 16A, may include ADCs 41 for converting the read-out signals VSL of the column outputs of the pixel part 20 to digital signals. Otherwise, in the readout circuit 40, for example as shown in FIG. 16B, amplifiers (AMP 42) for amplifying read-out signals VSL of column outputs of the pixel part 20 may be arranged. Further, in the readout circuit 40, for example as shown in FIG. 16C, sample/hold (S/H) circuits 43 for sampling and holding the read-out signals VSL of column outputs of the pixel part 20 may be arranged.

The horizontal scanning circuit 50 scans signals processed in the plurality of column signal processing circuits such as the ADCs in the readout circuit 40, transfers the results to the horizontal direction, and outputs the same to a not shown signal processing circuit.

The timing control circuit 60 generates timing signals which are necessary for signal processing in the pixel part 20, vertical scanning circuit 30, readout circuit 40, horizontal scanning circuit 50, etc.

Above, the configurations and functions of the parts in the solid-state imaging device 10 were explained in brief. Next, the configuration of the variable capacity part 80 according to the first embodiment and the readout processing concerned with that and so on will be explained in detail.

In the first embodiment, the variable capacity part 80 is configured by applying binning switches (binning transistors).

Figure 17:
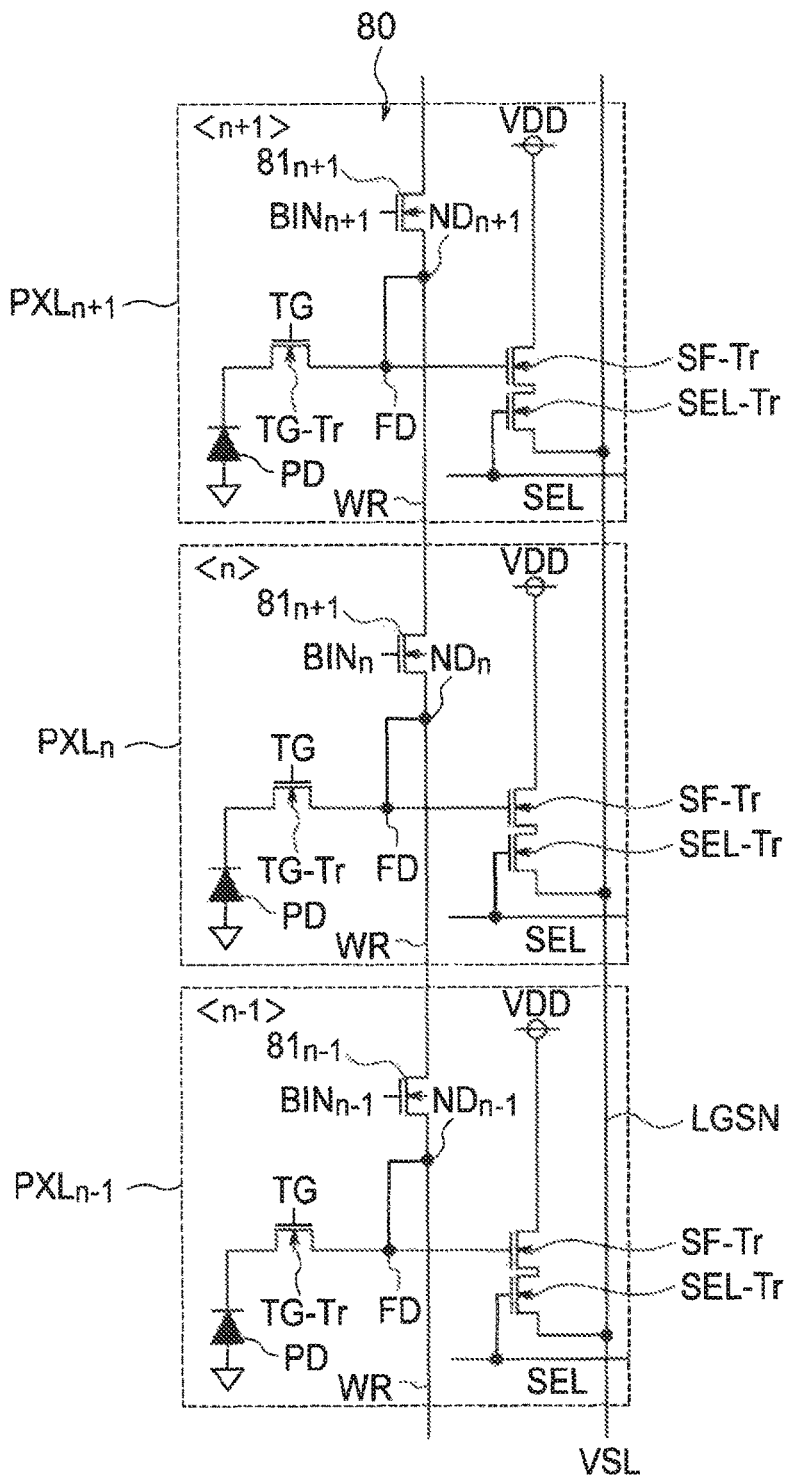
FIG. 17 is a diagram showing an example of the configuration of a pixel part and variable capacity part according to the first embodiment of the present invention.

FIG. 17 is a diagram showing an example of the configuration of a pixel part and variable capacity part according to the first embodiment of the present invention.

In the first embodiment, the variable capacity part 80 is configured not by a capacitor, but by a first binning switch 81n which is connected to (arranged on) the wiring WR formed between the floating diffusions FD in two pixels PXLn and PXLn+1 which are adjacent in the column direction and by a first binning switch 81n+1 which is connected between the floating diffusion FD in the pixel PXLn+1 and the power supply line VDD. In the first embodiment, by turning on/off the first binning switches 81n and 81n+1 by capacity changing signals BINn and BINn+1, the number of the floating diffusions FD to be connected is switched to one or multiple diffusions to change the capacity of the floating diffusion FD in the reading target pixel and switch the conversion gain of the floating diffusion FD in the pixel PXLn or PXLn+1 to be read out.

In the first embodiment, the first binning switches 81 ( . . . , n−1, n, n+1, . . . ) are for example formed by n-channel MOS (NMOS) transistors. In the following explanation, sometimes the binning switches will be called "binning transistor".

In the first embodiment, the reset element is shared by all of the pixels in one column, i.e., . . . , PXLn−1, PXLn, PXLn+1, . . . . For example, the floating diffusion FD in the pixel PXL0 (not shown in FIG. 17) on one end of one column and the power supply line VDD (not shown in FIG. 17) which is formed close to the pixel PXLN−1 on the other end of one column are connected through the first binning transistors (switches) . . . 81n−1, 81n, 81n+1 . . . , corresponding to the pixels and cascade connected to the wiring WR. The nodes . . . NDn−1, NDn, NDn+1 . . . on the wiring WR between the first binning switches and the floating diffusions FD in the corresponding pixels . . . PXLn−1, PXLn, PXLn+1 . . . are connected. In the first embodiment, a not shown first binning transistor (switch) 81N−1 which is closest to the other end functions as the shared reset element.

By such a configuration, according to the first embodiment, it is possible to flexibly switch the number of floating diffusions FD connected, therefore the configuration is excellent in expandability of the dynamic range. Further, the number of transistors in each pixel is small, therefore it is possible to raise a PD opening ratio and raise the photoelectric conversion sensitivity and number of saturation electrons.

Further, as explained above, in the photoelectric conversion part 220 of the pinned photodiode (PPD) 200 in each pixel PXL, in order to increase the storage capacity, the photoelectric conversion layer constituted by the n layer 221 is divided by the p− layer 222 to provide the plurality of sub-areas SBA1 and SBA2 so that there are a plurality of pn-j unction parts in the direction (horizontal direction) perpendicular to the normal line of the substrate inside the pixel. By forming the two sub-areas SBA1 and SBA2 in the direction X perpendicular to the normal line of the substrate 210 by the p layer (second conductivity type semiconductor layer, i.e., p− layer in the present example) 222 in the pinned photodiode (PPD) 200 of each pixel PXL in this way, complete depletion can be realized even with a low bias voltage. Further, in the solid-state imaging device 10 in the first embodiment, it becomes possible to read out the charges accumulated in the sub-areas by the charge transfer part constituted by the transfer transistor TG-Tr. Due to this, it becomes possible to increase the storage capacity while reducing noise and raising the sensitivity and it becomes possible to expand the dynamic range without degrading the optical characteristics.

Next, the operation for realizing a wide dynamic range when applying a binning switch (binning transistor) to the variable capacity part according to the first embodiment will be explained with reference to FIG. 18.

Figure 18:
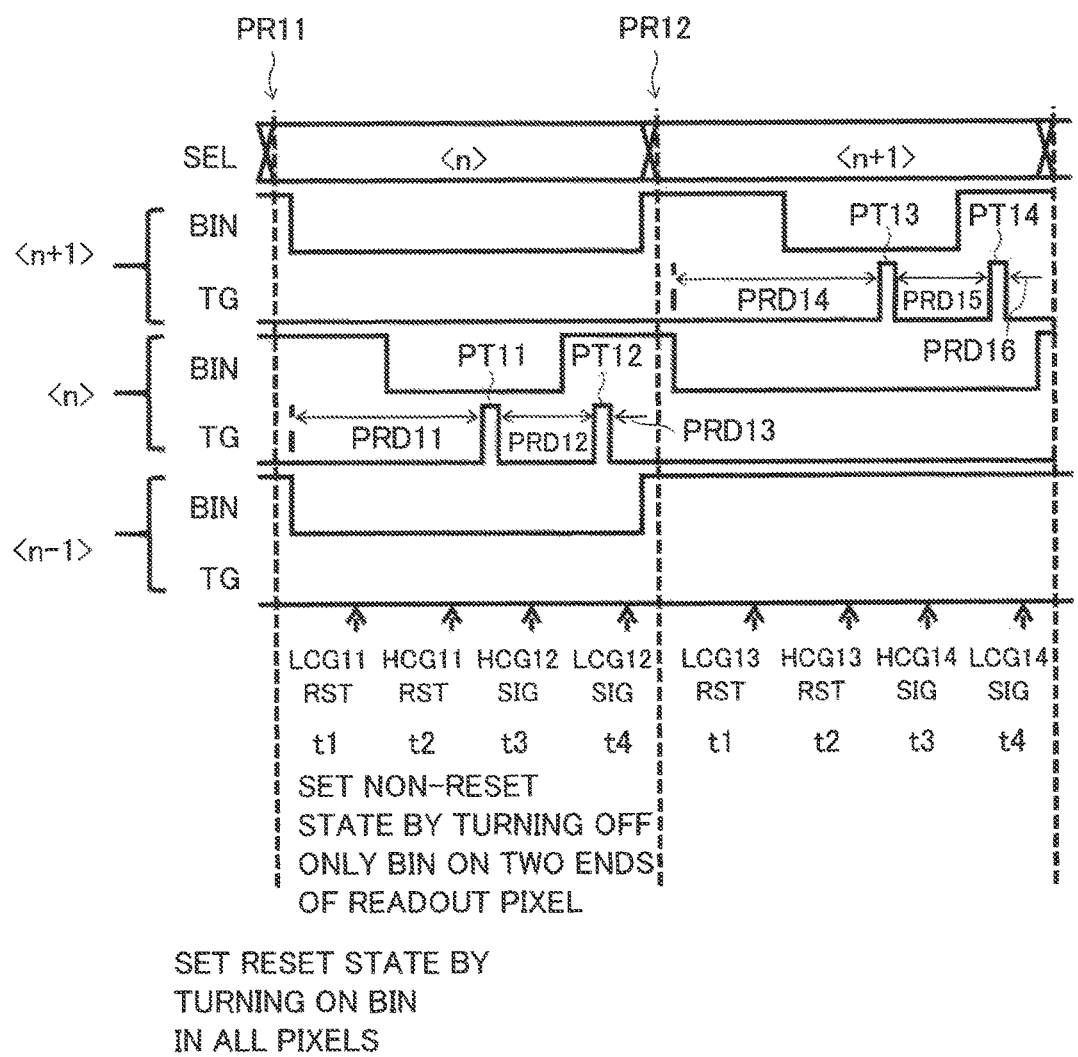
FIG. 18 is a timing chart for explaining an operation realizing a wide dynamic range where a binning switch is applied to the variable capacity part according to the first embodiment.

FIG. 18 is a timing chart for explaining the operation for realizing a wide dynamic range where a binning switch (binning transistor) is applied to the variable capacity part according to the first embodiment.

In the first embodiment, the capacity changing signals corresponding to the pixels on the two ends in the column direction of a read pixel PXLn are made the L level to render the pixel a non-reset state. For example, the capacity changing signals BINn−1 and BINn+1 corresponding to the pixels PXLn−1 and PXLn+1 on the two ends in the column direction of the read pixel PXLn are made the L level to render the pixel a non-reset state. Further, for example, the capacity changing signals BINn and BINn+2 (not shown) corresponding to the pixels PXLn and PXLn+2 (not shown) on the two ends in the column direction of the read pixel PXLn+1 are made the L level to render the pixel a non-reset state.

However, this is just one example. When increasing the number of floating diffusions connected, the capacity changing signals BIN corresponding to the truly neighboring pixels are not made the L level, but the capacity changing signals BIN corresponding to pixels separated from the truly neighboring pixels by a plurality of (two or more) pixels in accordance with the connection configuration are made the L level so as to render the pixel a non-reset state.

In the reading scan period PRDO, as shown in FIG. 18, in order to select a certain row in the pixel array, for example the n-th row, the control signal SEL connected to each pixel PXLn in that selected row is set to the H level and the selection transistor SEL-Tr in the pixel PXLn becomes a conductive state. In this selection state, in the reset period PR11, all first binning transistors 81n−1, 81n, and 81n+1 are selected to become a conductive state for the period where the capacity changing signals BINn−1, BINn, and BINn+1 are the H level as reset signals, and the floating diffusions FD are reset to the potential of the power supply line VDD. After the elapse of this reset period PR11, the capacity changing signals BINn−1 and BINn+1 are switched to the L level and the first binning transistors 81n−1 and 81n+1 are switched to the non-conductive state. On the other hand, the capacity changing signal BINn is held at the H level as it is, and the first binning transistor 81n is held in a conductive state. By the first binning transistors 81n−1 and 81n+1 being switched to the non-conductive state and the first binning transistor 81n being held in the conductive state, the reset period PR11 ends, and the capacity (charge amount) of the floating diffusion FD in the pixel PXLn is changed so as to increase from a first capacity to a second capacity. Further, a period until the transfer period PT11 is started becomes the first reading period PRD11 of reading out the pixel signal at the time of the reset state.

At the time t1 after the start of the first reading period PRD11, in a state where the capacity changing signal BINn is held at the H level, the reading part 70 performs the first low conversion gain mode reading operation LCG11 for reading out the pixel signal with a low conversion gain (second conversion gain) by which the capacity (charge amount) of the floating diffusion FD was changed to the second capacity. At this time, in each pixel PXLn, due to the source follower transistor SF-Tr, the charge in the floating diffusion FD is converted to a voltage signal with a gain in accordance with the charge amount (potential), is output as the read-out signal VSL (LCG11) of column output to the vertical signal line LSGN, is supplied to the readout circuit 40, and is for example held.

In the first reading period PRD11, after the first low conversion gain mode reading operation LCG11 is carried out at the time t1, the capacity changing signal BINn is switched to L (low level) and the capacity (charge amount) of the floating diffusion FD is changed to decrease from the second capacity to the first capacity. Further, at the time t2, the reading part 70 performs the first high conversion gain mode reading operation HCG11 of reading out the pixel signals with a high conversion gain (first conversion gain) by which the capacity (charge amount) of the floating diffusion FD was changed. At this time, in each pixel PXLn, due to the source follower transistor SF-Tr, the charge in the floating diffusion FD is converted to a voltage signal with a gain in accordance with the charge amount (potential), is output as the read-out signal VSL (HCG11) of column output to the vertical signal line LSGN, is supplied to the readout circuit 40, and is for example held.

Here, the first reading period PRD11 ends and the first transfer period PT11 starts. Note that, at this time, the capacity changing signal BINn is held at the L level as it is for a predetermined period after the elapse of the first transfer period PT11 up to substantially just before the start of the next second transfer period PT12. In the first transfer period PT11, the transfer transistor TG-Tr is selected to become a conductive state for the period where the control signal TG is the H level, and the charge (electrons) which is photoelectrically converted and accumulated in the photodiode PD is transferred to the floating diffusion FD. After this first transfer period PT11 elapses (the transfer transistor TG-Tr becomes a non-conductive state), the second reading period PRD12 for reading out the pixel signal in accordance with the charge which is photoelectrically converted and accumulated in the photodiode PD is started.

At the time t3 after the start of the second reading period PRD12, in a state where the capacity changing signal BINn is set at the L level, the reading portion 70 performs the second high conversion gain mode reading operation HCG12 for reading out the pixel signal with a high conversion gain (first conversion gain) by which the capacity (charge amount) of the floating diffusion FD was set to the first capacity. At this time, in each pixel PXLn, due to the source follower transistor SF-Tr, the charge in the floating diffusion FD is converted to a voltage signal with a gain in accordance with the charge amount (potential), is output as the read-out signal VSL (HCG12) of column output to the vertical signal line LSGN, is supplied to the readout circuit 40, and is for example held.

In the second reading period PRD12, after the second high conversion gain mode reading operation HCG12 is carried out at the time t3, the capacity changing signal BINn is switched to the H level and the capacity (charge amount) in the floating diffusion FD is changed so as to increase from the first capacity to the second capacity. Substantially parallel to this capacity change, the second transfer period PT12 starts. Note that, at this time, the capacity changing signal BINn is held at the H level as it is even after the second transfer period PT12 elapses. In the second transfer period PT12, the transfer transistor TG-Tr is selected to become a conductive state for the period where the control signal TG is the high level (H), and the charge (electrons) which is photoelectrically converted and accumulated in the photodiode PD is transferred to the floating diffusion FD. After this second transfer period PT12 elapses (the transfer transistor TG-Tr becomes a non-conductive state), the third reading period PRD13 for further reading out the pixel signal in accordance with the charge photoelectrically converted and accumulated by the photodiode PD starts.

At the time t4 after the start of the third reading period PRD13, in a state where the capacity changing signal BINn is held at the H level, the reading part 70 performs the second low conversion gain mode reading operation LCG12 for reading out the pixel signal with a low conversion gain (second conversion gain) by which the capacity (charge amount) of the floating diffusion FD was set to the second capacity. At this time, in each pixel PXLn, due to the source follower transistor SF-Tr, the charge in the floating diffusion FD is converted to a voltage signal with a gain in accordance with the charge amount (potential), is output as the read-out signal VSL (LCG12) of column output to the vertical signal line LSGN, is supplied to the readout circuit 40, and is for example held.

Further, for example, in the readout circuit 40 configuring a portion of the reading part 70, a difference {VSL (HCG12)−VSL(HCG11)} between the read-out signal VSL (HCG12) of the second high conversion gain mode reading operation HCG12 and the read-out signal VSL (HCG11) of the first high conversion gain mode reading operation HCG11 is taken, and CDS processing is carried out. In the same way, in the readout circuit 40, a difference {VSL (LCG12)−VSL(LCG11)} between the read-out signal VSL (LCG12) of the second low conversion gain mode reading operation LCG12, and the read-out signal VSL (LCG11) of the first low conversion gain mode reading operation LCG11 is taken, and the CDS processing is carried out.

Next, as shown in FIG. 18, in order to select the row next to the n-th row in the pixel array, for example, the n+1-th row, the control signal SEL connected to each pixel PXLn+1 in that selected n+1-th row in place of the n-th row is set at the H level whereby the selection transistor SEL-Tr in the pixel PXLn+1 becomes a conductive state. At this time, the capacity changing signal BINn is held at the H level as it is at the time of access to the n-th row. Further, in this selection state, in the reset period PR12, all first binning transistors 81n−1, 81n, and 81n+1 are selected to become the conductive state for the period where the capacity changing signals BINn−1, BINn, and BINn+1 are the H level as the reset signals, and each floating diffusion FD is reset to the potential of the power supply line VDD. After this reset period PR12 elapses, the capacity changing signal BINn is switched to the L level, and the first binning transistor 81n is switched to the non-conductive state. On the other hand, the capacity changing signals BINn+1 and BINn−1 are held at the H level as they are, and the first binning transistors 81n+1 and 81n−1 are held in the conductive state. By the first binning transistor 81n being switched to the non-conductive state and the first binning transistors 81n+1 and 81n−1 being held in the conductive state, the reset period PR12 ends, and the capacity (charge amount) of the floating diffusion FD in the pixel PXLn+1 is changed so as to increase from the first capacity to the second capacity. Further, the period up to the start of the transfer period PT13 becomes the first reading period PRD14 for reading out the pixel signal at the time of the reset state.

At the time t1 after the start of the first reading period PRD14, in the state where the capacity changing signal BINn+1 is held at the H level, the reading part 70 performs the first low conversion gain mode reading operation LCG13 for reading out the pixel signal with a low conversion gain (second conversion gain) by which the capacity (charge amount) of the floating diffusion FD was changed to the second capacity. At this time, in each pixel PXLn+1, due to the source follower transistor SF-Tr, the charge in the floating diffusion FD is converted to a voltage signal with a gain in accordance with the charge amount (potential), is output as the read-out signal VSL (LCG13) of column output to the vertical signal line LSGN, is supplied to the readout circuit 40, and is for example held.

In the first reading period PRD14, after performing the first low conversion gain mode reading operation LCG13 at the time t1, the capacity changing signal BINn+1 is switched to L (low level) and the capacity (charge amount) of the floating diffusion FD is changed to decrease from the second capacity to the first capacity. Further, at the time t2, the reading part 70 performs the first high conversion gain mode reading operation HCG13 for reading out the pixel signal with a high conversion gain (first conversion gain) by which the capacity (charge amount) of the floating diffusion FD was changed. At this time, in each pixel PXLn+1, due to the source follower transistor SF-Tr, the charge in the floating diffusion FD is converted to a voltage signal with a gain in accordance with the charge amount (potential), is output as the read-out signal VSL (HCG13) of column output to the vertical signal line LSGN, is supplied to the readout circuit 40, and is for example held.

Here, the first reading period PRD14 ends, and the first transfer period PT13 starts. Note that, at this time, the capacity changing signal BINn+1 is held at the L level as it is for a predetermined period after the elapse of the first transfer period PT13 up to substantially the time immediately before the start of the next second transfer period PT14. In the first transfer period PT13, the transfer transistor TG-Tr is selected to become the conductive state for the period where the control signal TG is the H level, and the charge (electrons) which is photoelectrically converted and accumulated in the photodiode PD is transferred to the floating diffusion FD. After this first transfer period PT13 elapses (the transfer transistor TG-Tr becomes the non-conductive state), the second reading period PRD15 for reading out the pixel signal in accordance with the charge photoelectrically converted and accumulated by the photodiode PD starts.

At the time t3 after the start of the second reading period PRD15, in a state where the capacity changing signal BINn+1 is set at the L level, the reading part 70 performs the second high conversion gain mode reading operation HCG14 for reading out the pixel signal with a high conversion gain (first conversion gain) by which the capacity (charge amount) of the floating diffusion FD was set to the first capacity. At this time, in each pixel PXLn+1, due to the source follower transistor SF-Tr, the charge in the floating diffusion FD is converted to a voltage signal with a gain in accordance with the charge amount (potential), is output as the read-out signal VSL (HCG14) of column output to the vertical signal line LSGN, is supplied to the readout circuit 40, and is for example held.

In the second reading period PRD15, after performing the second high conversion gain mode reading operation HCG14 at the time t3, the capacity changing signal BINn+1 is switched to the H level and the capacity (charge amount) of the floating diffusion FD is changed to increase from the first capacity to the second capacity. Substantially parallel to this capacity change, the second transfer period PT14 starts. Note that, at this time, the capacity changing signal BINn+1 is held at the H level as it is even after the second transfer period PT14 elapses. In the second transfer period PT14, the transfer transistor TG-Tr is selected and becomes a conductive state for the period where the control signal TG is H level, and the charge (electrons) which is photoelectrically converted and accumulated in the photodiode PD is transferred to the floating diffusion FD. After this second transfer period PT14 elapses (the transfer transistor TG-Tr becomes a non-conductive state), a third reading period PRD16 for further reading out the pixel signal in accordance with the charge photoelectrically converted and accumulated by the photodiode PD starts.

At the time t4 after the start of the third reading period PRD16, in the state where the capacity changing signal BINn+1 is held at the H level, the reading part 70 performs the second low conversion gain mode reading operation LCG14 for reading out the pixel signal with a low conversion gain (second conversion gain) by which the capacity (charge amount) of the floating diffusion FD was set to the second capacity. At this time, in each pixel PXLn+1, due to the source follower transistor SF-Tr, the charge in the floating diffusion FD is converted to a voltage signal with a gain in accordance with the charge amount (potential), is output as the read-out signal VSL (LCG14) of column output to the vertical signal line LSGN, is supplied to the readout circuit 40, and is for example held.

Further, for example, in the readout circuit 40 configuring a portion of the reading part 70, a difference {VSL (HCG14)−VSL(HCG13)} between the read-out signal VSL (HCG14) of the second high conversion gain mode reading operation HCG14 and the read-out signal VSL (HCG13) of the first high conversion gain mode reading operation HCG13 is taken and CDS processing is performed. In the same way, in the readout circuit 40, a difference {VSL (LCG14)−VSL(LCG13)} between the read-out signal VSL (LCG14) of the second low conversion gain mode reading operation LCG14 and the read-out signal VSL (LCG13) of the first low conversion gain mode reading operation LCG13 is taken and CDS processing is performed.

As explained above, in the solid-state imaging device 10 of the first embodiment, the pinned photodiode (PPD) 200 has a substrate 210 having a first substrate surface 211 side (for example back side) to which the light L is illuminated and a second substrate surface 212 side (front side) on the side opposite to the first substrate surface 211 side, a photoelectric conversion part 220 which includes a first conductivity type n layer 221 formed so that it is buried in the substrate 210 and has a photoelectric conversion function for the received light and a charge accumulation function, a p type separation layer 230 of the second conductivity type which is formed in a side portion of the n layer 221 of the first conductivity type semiconductor layer in the photoelectric conversion part 220, and one charge transfer gate part 240 capable of transferring the charge accumulated in the photoelectric conversion part 220. Further, in the solid-state imaging device 10 in the first embodiment, in the photoelectric conversion part 220 of the pinned photodiode (PPD) 200, in order to increase the storage capacity, the photoelectric conversion layer constituted by the n layer 221 is divided by the p layer 222 to provide a plurality of sub-areas SBA1 and SBA2 so that there are a plurality of pn-junction parts (junction parts) in a direction (X or Y direction) perpendicular to the normal line of the substrate inside the pixel.

In this way, in the pinned photodiode (PPD) 200 of the first embodiment, by forming the two sub-areas SBA1 and SBA2 in the direction X perpendicular to the normal line of the substrate 210 by the p layer (second conductivity type semiconductor layer, i.e., p− layer in the present example) 222, in comparison with a comparative example not forming sub-areas, complete depletion can be realized even with a low bias voltage. However, in a case where the photoelectric conversion layer is simply divided into a plurality of sections, for example two sections, a plurality of transfer gates also end up becoming necessary, therefore the capacity of the charge-to-voltage conversion part ends up increasing, so the conversion efficiency deteriorates. As a result, the noise characteristic deteriorates. For this reason, the solid-state imaging device 10 in the first embodiment employs a configuration capable of reading out the charges accumulated in the sub-areas by the single charge transfer gate part constituted by the transfer transistor TG-Tr. Due to this, in the solid-state imaging device 10 in the first embodiment, it becomes possible to increase the storage capacity while reducing noise and increasing sensitivity and it becomes possible to expand the dynamic range without degrading the optical characteristics.

Further, according to the first embodiment, it is possible to obtain the effects that it is possible to output a signal for the charge (electrons) which is photoelectrically converted in one accumulation period (exposure period) while switching between a high conversion gain mode and a low conversion gain mode inside the pixel in one reading period and thereby output both of a bright signal and a dark signal, the reset noise at the time of the high conversion gain mode and low conversion gain mode can be cancelled, expansion of the dynamic range can be realized while suppressing occurrence of moving body distortion, and consequently a higher image quality can be realized.

Further, according to the first embodiment, it is possible to flexibly switch the number of floating diffusions FD connected, therefore the configuration is excellent in expandability of the dynamic range. Further, the number of transistors in each pixel is small, therefore it is possible to raise a PD opening ratio and raise the photoelectric conversion sensitivity and number of saturation electrons.

Second Embodiment

Figure 19:
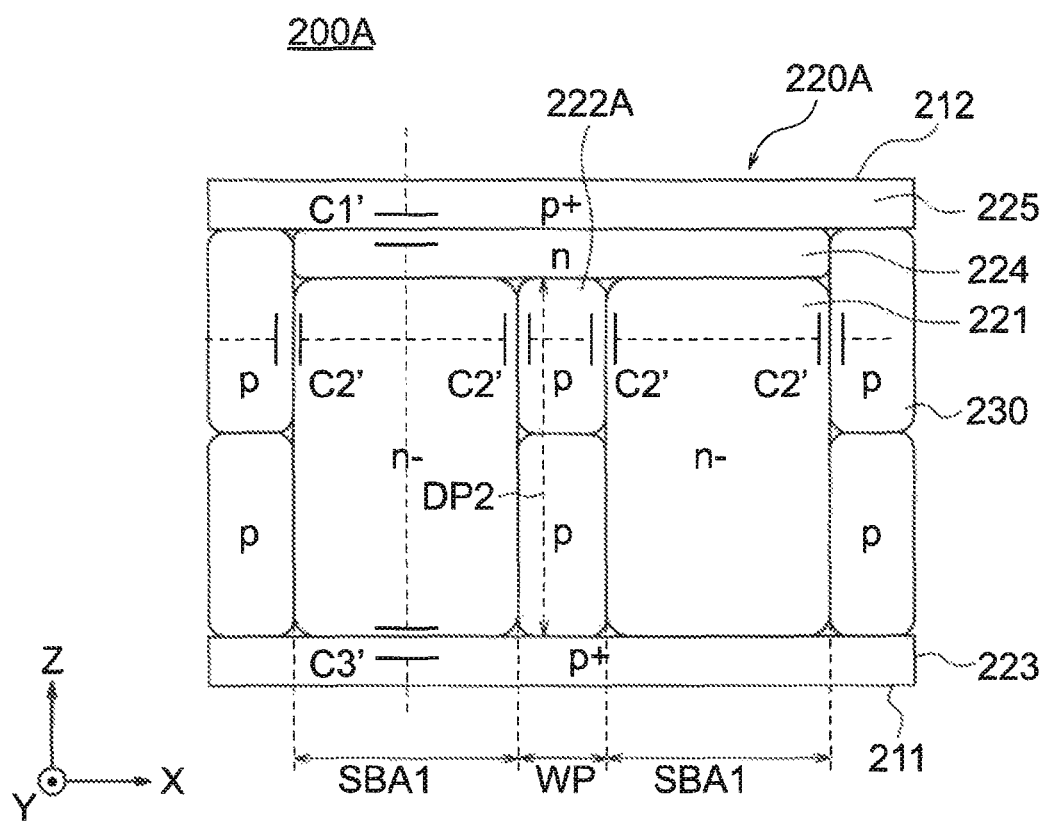
FIG. 19 is a simplified cross-sectional view showing an example of the configuration of principal parts excluding the charge transfer gate part in a pinned photodiode (PPD) according to a second embodiment of the present invention.

FIG. 19 is a simplified cross-sectional view showing an example of the configuration of principal parts excluding the charge transfer gate part in a pinned photodiode (PPD) according to a second embodiment of the present invention.

The difference of the pinned photodiode (PPD) 200A in the second embodiment from the pinned photodiode (PPD) 200 (FIG. 3) in the first embodiment is as follows.

In the photoelectric conversion part 220 in the pinned photodiode (PPD) 200 in the first embodiment, the second conductivity type p layer (p− layer in the example in FIG. 3) 222 has the predetermined width WP in the direction X perpendicular to the normal line of the substrate 210 and has a depth DP1 in the normal line direction Z of the substrate starting from the surface on the second substrate surface 212 side of the n layer (first conductivity type semiconductor layer) 221, but not reaching the surface on the first substrate surface 211 side.

Contrary to this, in the photoelectric conversion part 220A of the pinned photodiode (PPD) 200A in the second embodiment, the second conductivity type p layer (p− layer in the example in FIG. 3) 222A has the predetermined width WP in the direction X perpendicular to the normal line of the substrate 210 and has a depth DP2 in the normal direction Z of the substrate starting from the surface on the second substrate surface 212 side of the n layer (first conductivity type semiconductor layer) 221 and reaching the surface on the first substrate surface 211 side. Accordingly, in the photoelectric conversion part 220A, the sub-areas SBA1 and SBA2 in the n layer 221 are divided into two regions by the p layer 222A. Note that, in the example in FIG. 19, the n layer 221 is shown as a single layer structure of the n− layer.

According to the second embodiment, the same effects as those by the first embodiment explained above can be obtained.

Third Embodiment

Figure 20:
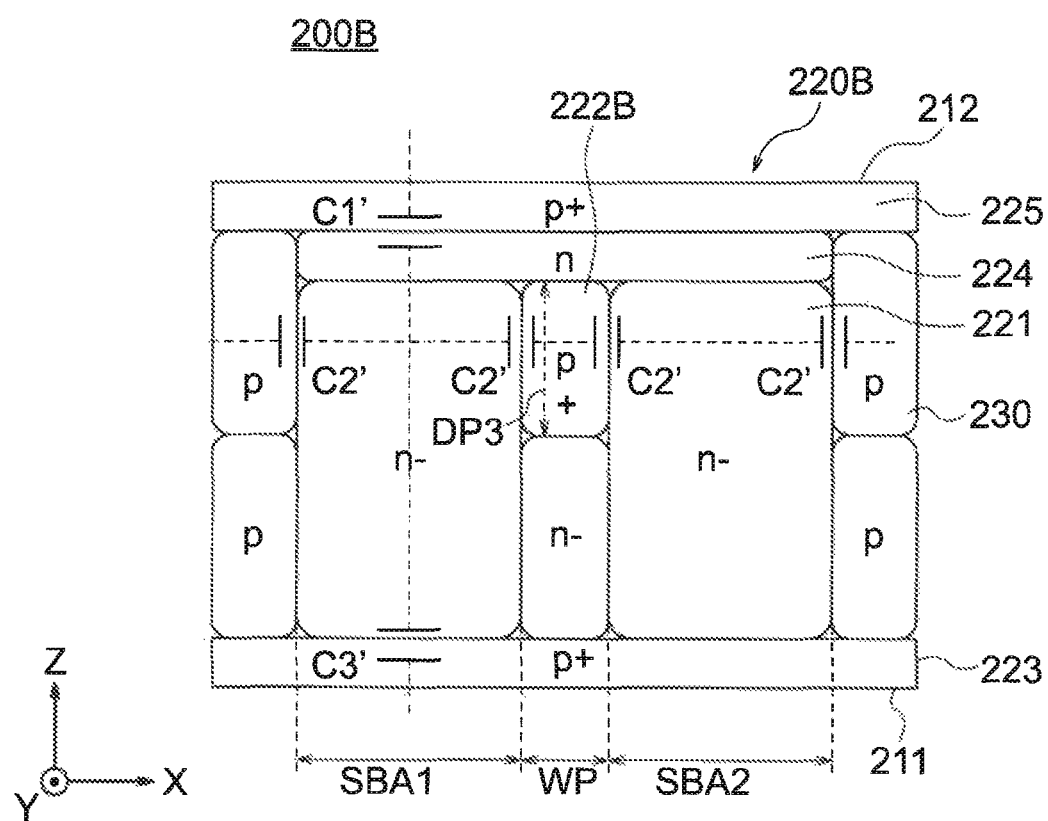
FIG. 20 is a simplified cross-sectional view showing an example of the configuration of principal parts excluding the charge transfer gate part in a pinned photodiode (PPD) according to a third embodiment of the present invention.

FIG. 20 is a simplified cross-sectional view showing an example of the configuration of principal parts excluding the charge transfer gate part in a pinned photodiode (PPD) according to a third embodiment of the present invention.

The difference of a pinned photodiode (PPD) 200B in the third embodiment from the pinned photodiode (PPD) 200 (FIG. 3) in the first embodiment is as follows.

In the photoelectric conversion part 220 in the pinned photodiode (PPD) 200 in the first embodiment, the second conductivity type p layer (p− layer in the example in FIG. 3) 222 has the predetermined width WP in the direction X perpendicular to the normal line of the substrate 210 and has a depth DP1 in the normal line direction Z of the substrate starting from the surface on the second substrate surface 212 side of the n layer (first conductivity type semiconductor layer) 221, but not reaching the surface on the first substrate surface 211 side.

Contrary to this, in the photoelectric conversion part 220B of the pinned photodiode (PPD) 200B in the third embodiment, the second conductivity type p layer (p− layer in the example in FIG. 3) 222B has the predetermined width WP in the direction X perpendicular to the normal line of the substrate 210 and has a depth DP3 in the normal direction Z of the substrate starting from the surface on the second substrate surface 212 side of the n layer (first conductivity type semiconductor layer) 221, but not reaching the surface on the first substrate surface 211 side which is shallower than DP1 (>DP3). Note that, in the example of FIG. 20, the n layer 221 is shown as a single layer structure of an n− layer.

According to the third embodiment, the same effects as those by the first embodiment explained above can be obtained.

Fourth Embodiment

Figure 21:
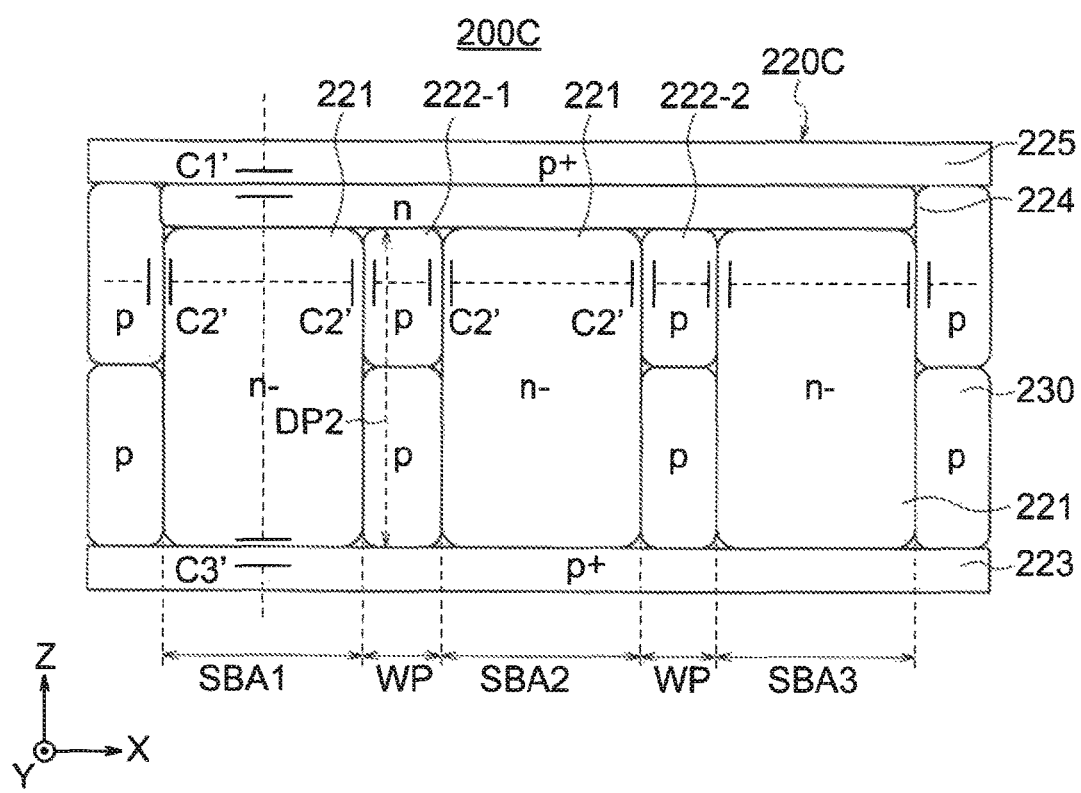
FIG. 21 is a simplified cross-sectional view showing an example of the configuration of principal parts excluding the charge transfer gate part in a pinned photodiode (PPD) according to a fourth embodiment of the present invention.

FIG. 21 is a simplified cross-sectional view showing an example of the configuration of principal parts excluding the charge transfer gate part in a pinned photodiode (PPD) according to a fourth embodiment of the present invention.

The difference of a pinned photodiode (PPD) 200C in the fourth embodiment from the pinned photodiode (PPD) 200A (FIG. 19) in the second embodiment is as follows.

In the photoelectric conversion part 220A of the pinned photodiode (PPD) 200A in the second embodiment, the two sub-areas SBA1 and SBA2 are formed in the n layer (first conductivity type semiconductor layer) 221 in the direction X perpendicular to the normal line of the substrate by one p layer 222.

Contrary to this, in the photoelectric conversion part 220C of the pinned photodiode (PPD) 200C in the fourth embodiment, three sub-areas SBA1, SBA2, and SBA3 are formed in the n layer (first conductivity type semiconductor layer) 221 in the direction X perpendicular to the normal line of the substrate by two p layers 222-1 and 222-2.

According to the fourth embodiment, the same effects as those by the first and second embodiments explained above can be obtained.

Fifth Embodiment

Figure 22:
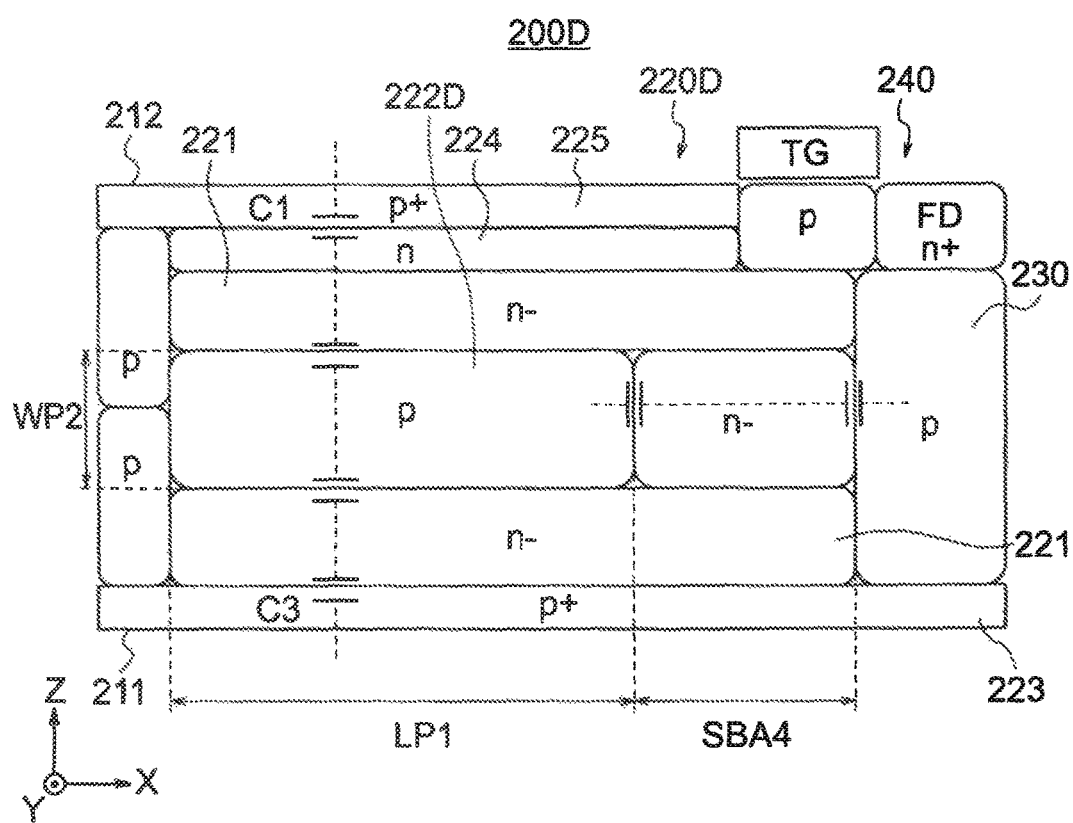
FIG. 22 is a simplified cross-sectional view showing an example of the configuration of principal parts in a pinned photodiode (PPD) according to a fifth embodiment of the present invention.

FIG. 22 is a simplified cross-sectional view showing an example of the configuration of principal parts of a pinned photodiode (PPD) according to a fifth embodiment of the present invention.

The difference of a pinned photodiode (PPD) 200D in the fifth embodiment from the pinned photodiode (PPD) 200 (FIG. 3) in the first embodiment is as follows.

In the photoelectric conversion part 220 in the pinned photodiode (PPD) 200 in the first embodiment, the second conductivity type p layer (p− layer in the example in FIG. 3) 222 has the predetermined width WP in the direction X perpendicular to the normal line of the substrate 210 and has a depth DP1 in the normal line direction Z of the substrate starting from the surface on the second substrate surface 212 side of the n layer (first conductivity type semiconductor layer) 221, but not reaching the surface on the first substrate surface 211 side. Further, in the n layer (first conductivity type semiconductor layer) 221, two sub-areas SBA1 and SBA2 are formed by the p layer 222 in the direction X perpendicular to the normal line of the substrate.

Contrary to this, in the photoelectric conversion part 220D of the pinned photodiode (PPD) 200D in the fifth embodiment, the second conductivity type p layer (p− layer in the example of FIG. 3) has a predetermined width WP2 in the normal line direction Z of the substrate 210. Further, in the direction X perpendicular to the normal line of the substrate, it has a length LP1 forming one sub-area SBA4 with the p type separation layer 230. Note that, in the example of FIG. 22, the n layer 221 is shown as a single layer structure of an n− layer.

According to the fifth embodiment, the same effects as those by the first embodiment explained above can be obtained.

Sixth Embodiment

Figure 23A:
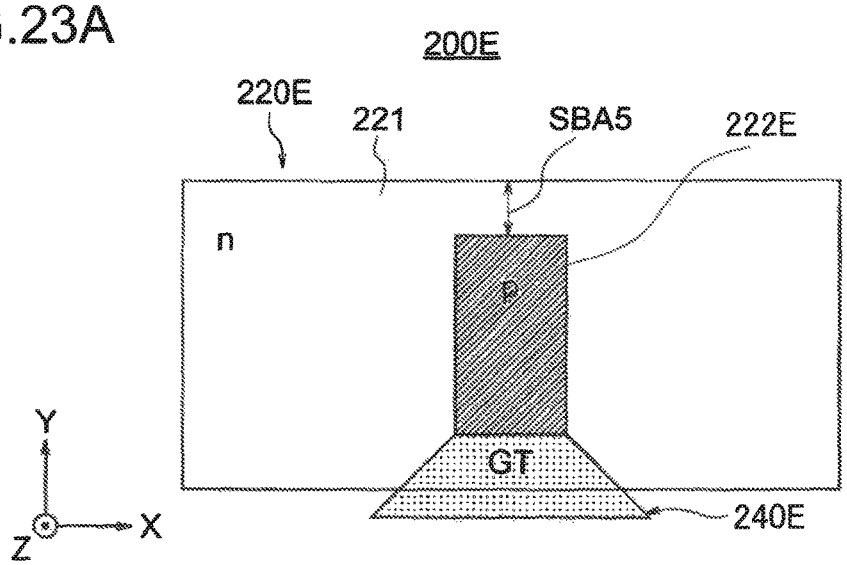
FIG. 23A to FIG. 23C are diagrams showing an example of the configuration of principal parts in a pinned photodiode (PPD) according to a sixth embodiment of the present invention.
Figure 23B:
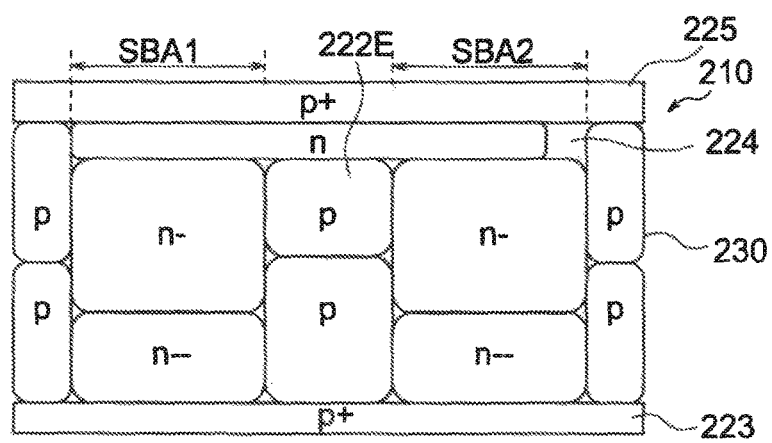
Figure 23C:
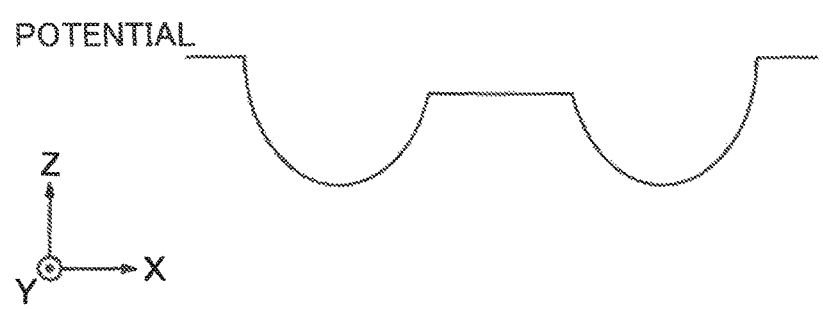

FIG. 23A to FIG. 23C are diagrams showing an example of the configuration of principal parts of a pinned photodiode (PPD) according to a sixth embodiment of the present invention. FIG. 23A is a view diagrammatically showing a planar layout, FIG. 23B is a simplified cross-sectional view of the principal parts, and FIG. 23C is a diagram showing a profile of the potential of the photodiode.

The difference of a pinned photodiode (PPD) 200E in the sixth embodiment from the pinned photodiode (PPD) 200A (FIG. 19) in the second embodiment is as follows.

In a photoelectric conversion part 220E of the pinned photodiode (PPD) 200E in the sixth embodiment, a p layer 222E having a rectangular shape when viewed on a plane is locally formed in the n layer 221. The p layer 222E is formed by separation at a peripheral part or reading part constituted by the charge transfer gate part 240E. In the example of FIG. 23A to FIG. 23C, by the rectangular p layer 222E being locally formed in the n layer 221, two sub-areas SBA1 and SBA2 are formed in the direction X perpendicular to the normal line of the substrate 210, and one sub-area SBA5 is formed in a direction Y perpendicular to the normal line of the substrate 210. Further, in the charge transfer gate part 240E, the gate electrode is formed in a trapezoidal-shape, when viewed on a plane, gradually expanding toward the charge transfer direction (charge reading direction).

In the photoelectric conversion part 220E of the pinned photodiode (PPD) 200E in the sixth embodiment as well, a p layer 222E is formed in the photoelectric conversion part 220E, and a pn-junction part is three-dimensionally formed in the photoelectric conversion part 220E. Further, due to the pixel pitch reduced by division, the potential peak of the photodiode becomes shallower. According to this structure, the saturation output at the time of same readout voltage (Vpin) is improved.

In this way, according to the sixth embodiment, in the same way as the first to fifth embodiments explained above, the saturation output of the n layer 221 can be improved, and it becomes possible to suppress the depletion voltage and increase of color bleeding.

Seventh Embodiment

Figure 24A:
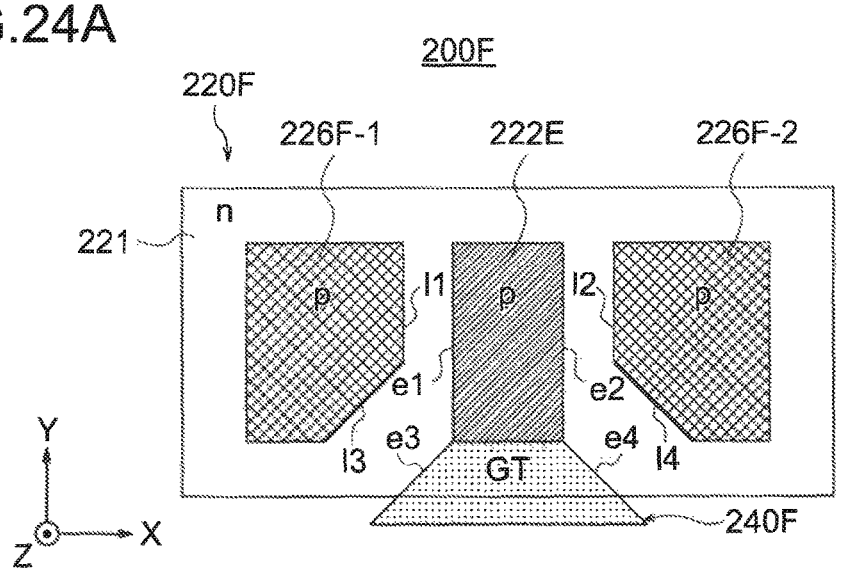
FIG. 24A to FIG. 24C are diagrams showing an example of the configuration of principal parts in a pinned photodiode (PPD) according to a seventh embodiment of the present invention.
Figure 24B:
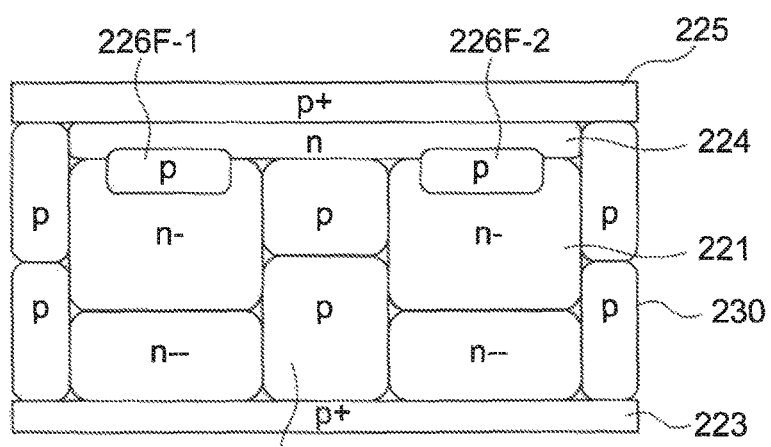
Figure 24C:
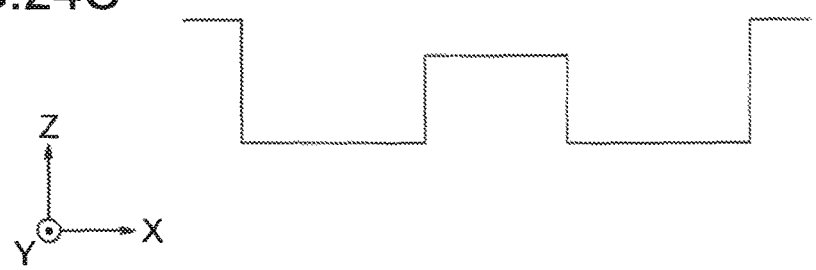

FIG. 24A to FIG. 24C are diagrams showing an example of the configuration of principal parts of a pinned photodiode (PPD) according to a seventh embodiment of the present invention. FIG. 24A is a view diagrammatically showing a planar layout, FIG. 24B is a simplified cross-sectional view of the principal parts, and FIG. 24C is a diagram showing a profile of the potential of the photodiode.

The difference of a pinned photodiode (PPD) 200F in the seventh embodiment from the pinned photodiode (PPD) 200E (FIG. 23A to FIG. 23C) in the sixth embodiment is as follows.

In a photoelectric conversion part 220F of the pinned photodiode (PPD) 200F in the seventh embodiment, further, counter ion implantation (below, referred to as "counter implant") portions 226F (−1, −2) are formed by implantation of boron or another impurity having an inverse polarity in the n layer 221 at positions where the potential of the photodiode becomes the deepest. In the present example, the counter implant parts 226F are formed in a boundary part between the n layer 221 and the n layer 224 in the normal line direction Z of the substrate 210 and in intermediate regions between the position of formation of the p layer 222E and the positions of formation of the p type separation layer 230 in the direction X perpendicular to the normal line of the substrate 210.

The counter implant parts 226F are basically rectangular in shape when viewed on a plane, but portions l1 and l2 and l3 and l4 which face the edge parts e1 and e2 of the p layer 222E and the edge parts e3 and e4 of the charge transfer gate part 240F are formed so as to become parallel to these edge parts.

By setting the depth of the bottom portion of the photoelectric conversion part 220F of the photodiode uniform by the counter implant parts 226F (by making the potential of the peripheral parts deeper), the saturation output at the time of same readout voltage (Vpin) is further improved.

In this way, according to the seventh embodiment, the saturation output of the n layer 221 can be further improved, and it becomes possible to suppress the depletion voltage and increase of color bleeding.

Eighth Embodiment

Figure 25:
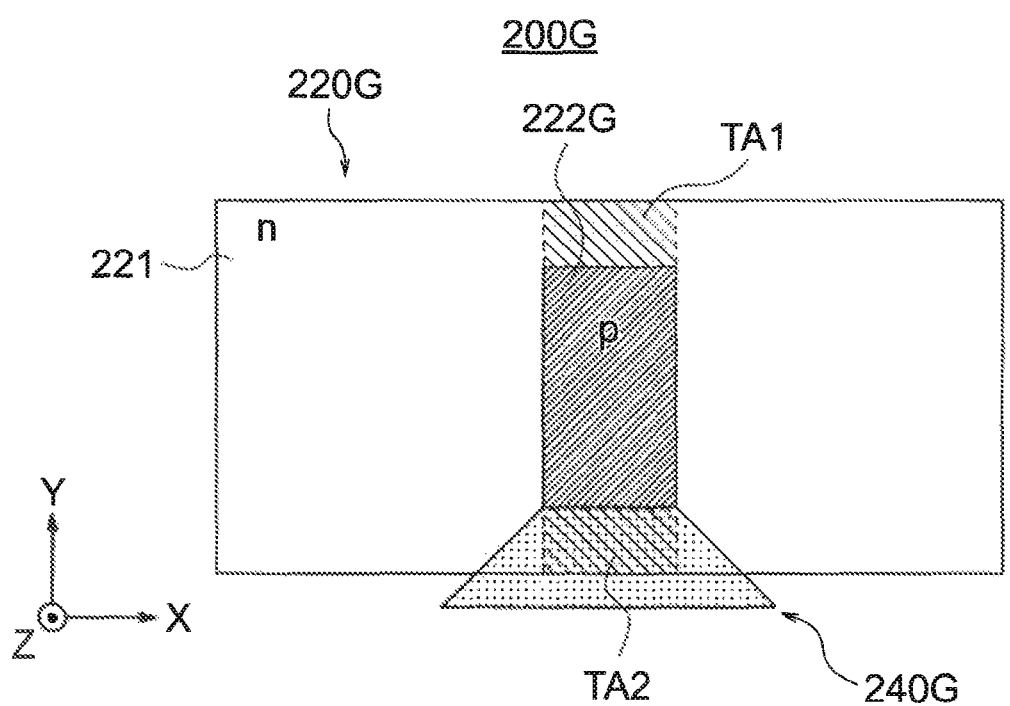
FIG. 25 is a diagram showing an example of the configuration of principal parts in a pinned photodiode (PPD) according to an eighth embodiment of the present invention.

FIG. 25 is a diagram showing an example of the configuration of principal parts of a pinned photodiode (PPD) according to an eighth embodiment of the present invention.

The difference of a pinned photodiode (PPD) 200G in the eighth embodiment from the pinned photodiode (PPD) 200E (FIG. 23) in the sixth embodiment is as follows.

In a photoelectric conversion part 220G of the pinned photodiode (PPD) 200G in the eighth embodiment, a rectangular shaped p layer 222G is locally formed in the n layer 221. It is formed up to end parts TA1 and TA2 of the direction Y perpendicular to the normal line of the substrate 210. Further, the p layer 222G is formed so as to have a thin ion implantation concentration in the end areas (the peripheral part of the p layer 222G or the region of the reading part constituted by the charge transfer gate part 240G) TA1 and TA2 of the direction Y perpendicular to the normal line of the substrate 210.

According to the eighth embodiment, in the same way as the sixth embodiment explained above, the saturation output of the n layer 221 can be improved, and it becomes possible to suppress the depletion voltage and increase of color bleeding.

Ninth Embodiment

Figure 26:
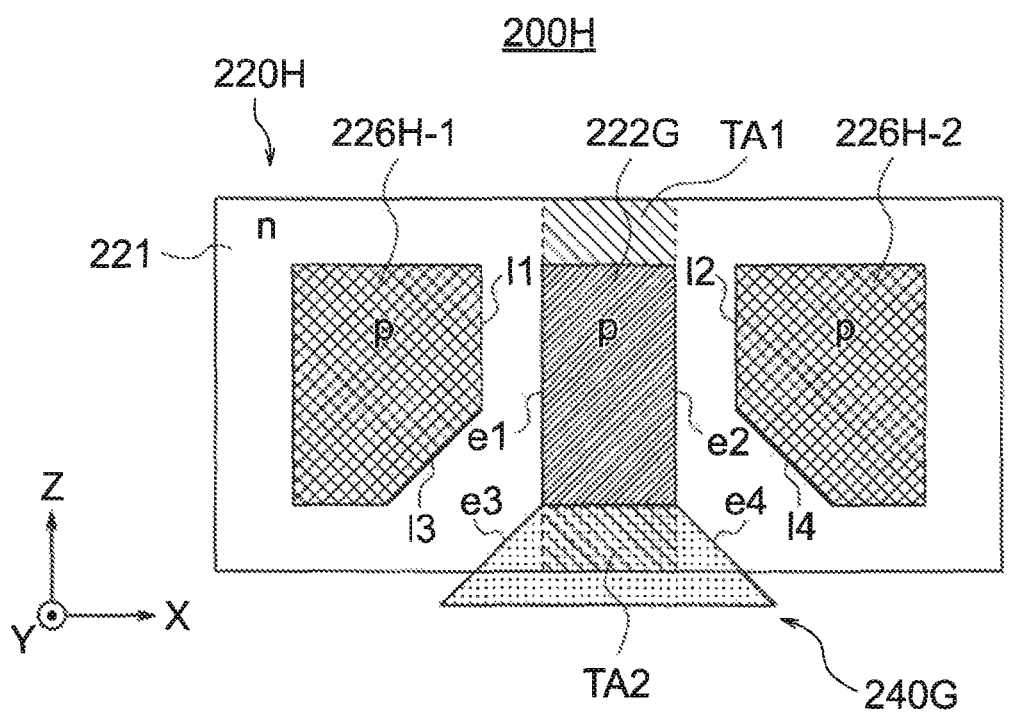
FIG. 26 is a diagram showing an example of the configuration of principal parts in a pinned photodiode (PPD) according to a ninth embodiment of the present invention.

FIG. 26 is a diagram showing an example of the configuration of principal parts of a pinned photodiode (PPD) according to a ninth embodiment of the present invention.

The difference of a pinned photodiode (PPD) 200H in the ninth embodiment from the pinned photodiode (PPD) 200G (FIG. 25) in the eighth embodiment is as follows.

In a photoelectric conversion part 220H of the pinned photodiode (PPD) 200H in the ninth embodiment, further, counter implant parts 226H (-1, -2) are formed by implantation of boron or another impurity having an inverse polarity in the n layer 221 at positions where the potential of the photodiode becomes the deepest. In the present example, the counter implant parts 226H are formed in intermediate regions between the position of formation of the p layer 222G and the positions of formation of the p type separation layers 230 in the direction X perpendicular to the normal line of the substrate 210 so as to become closer to the position of formation of the p layer 222G.

The counter implant parts 226H are basically rectangular in shape when viewed on a plane, but the portions l1 and l2 and l3 and l4 which face the edge parts e1 and e2 of the p layer 222G and the edge parts e3 and e4 of the charge transfer gate part 240G are formed so as to become parallel to these edge parts.

By setting the depth of the bottom portion of the photoelectric conversion part 220H of the photodiode uniform by the counter implant parts 226H (by making the potential of the peripheral parts deeper), the saturation output at the time of same readout voltage (Vpin) is further improved.

In this way, according to the ninth embodiment, the saturation output of the n layer 221 can be further improved, and it becomes possible to suppress the depletion voltage and increase of color bleeding.

10th Embodiment

Figure 27:
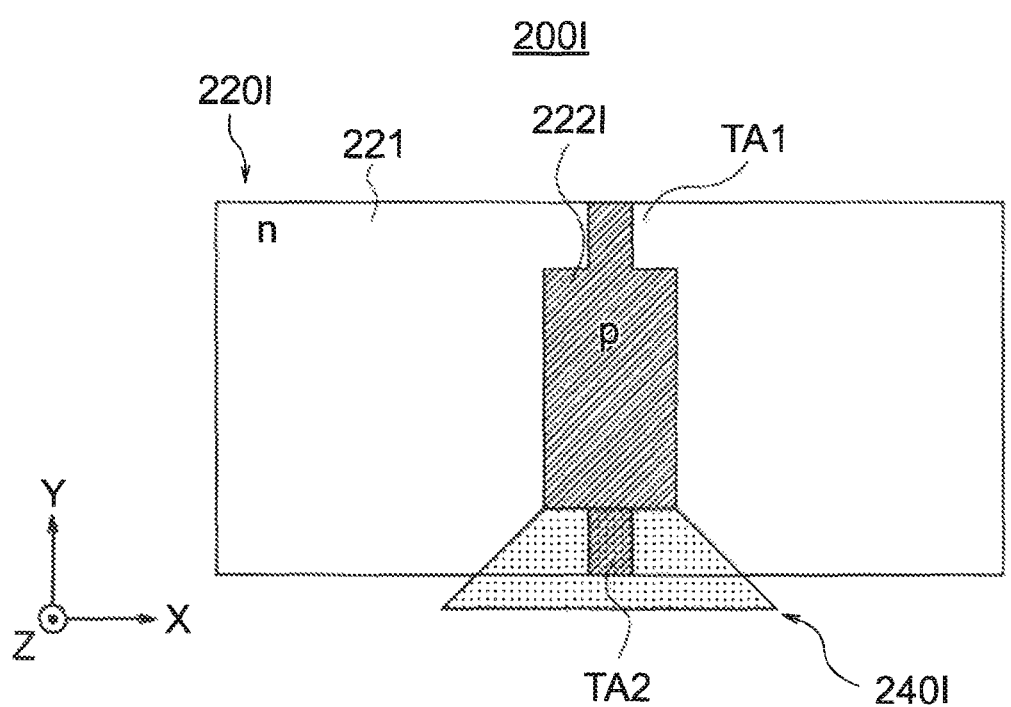
FIG. 27 is a diagram showing an example of the configuration of principal parts in a pinned photodiode (PPD) according to a 10th embodiment of the present invention.

FIG. 27 is a diagram showing an example of the configuration of principal parts of a pinned photodiode (PPD) according to a 10th embodiment of the present invention.

The difference of a pinned photodiode (PPD) 200I in the 10th embodiment from the pinned photodiode (PPD) 200E (FIG. 23) in the sixth embodiment is as follows.

In a photoelectric conversion part 220I of the pinned photodiode (PPD) 200I in the 10th embodiment, a rectangular shaped p layer 222I is locally formed in the n layer 221. It is formed up to end parts TA1 and TA2 of the direction Y perpendicular to the normal line of the substrate 210. Further, the p layer 222I is formed so as to have narrow widths in the end areas (the peripheral part of the p layer 222I or the region of the reading part constituted by the charge transfer gate part 240I) TA1 and TA2 of the direction Y perpendicular to the normal line of the substrate 210.

According to the 10th embodiment, in the same way as the sixth embodiment explained above, the saturation output of the n layer 221 can be improved, and it becomes possible to suppress the depletion voltage and increase of color bleeding.

11th Embodiment

Figure 28:
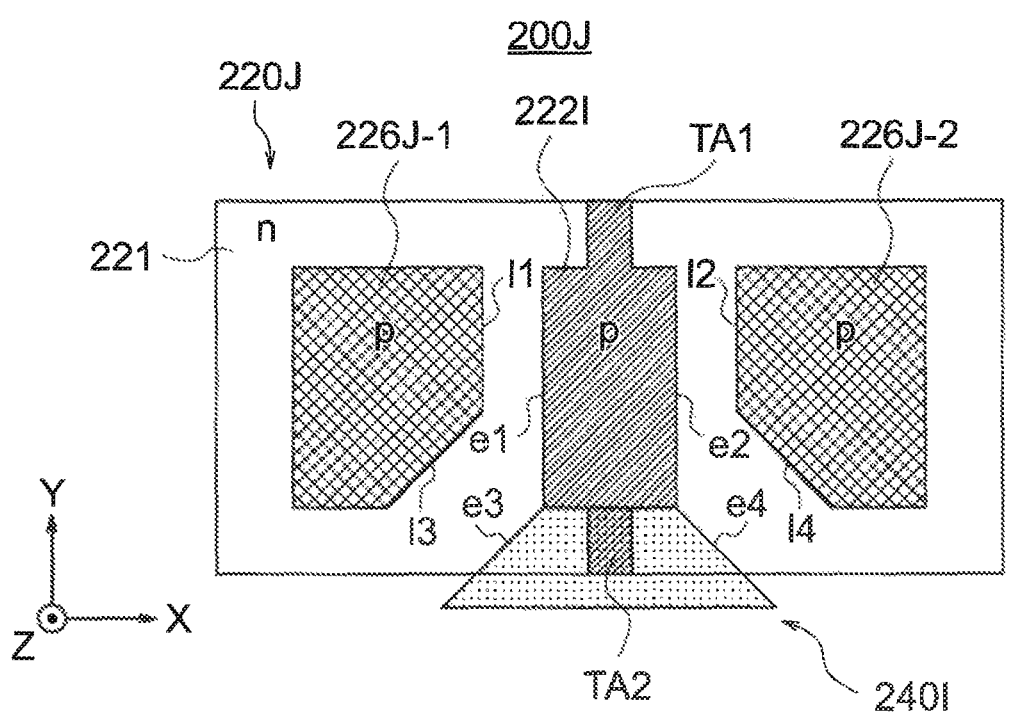
FIG. 28 is a diagram showing an example of the configuration of principal parts in a pinned photodiode (PPD) according to an 11th embodiment of the present invention.

FIG. 28 is a diagram showing an example of the configuration of principal parts of a pinned photodiode (PPD) according to an 11th embodiment of the present invention.

The difference of a pinned photodiode (PPD) 200J in the 11th embodiment from the pinned photodiode (PPD) 200I (FIG. 27) in the 10th embodiment is as follows.

In a photoelectric conversion part 220J of the pinned photodiode (PPD) 200J in the 11th embodiment, further, counter implant parts 226J (-1, -2) are formed by implantation of boron or another impurity having an inverse polarity in the n layer 221 at positions where the potential of the photodiode becomes the deepest. In the present example, the counter implant parts 226J are formed in intermediate regions between the position of formation of the p layer 222I and the positions of formation of the p type separation layers 230 in the direction X perpendicular to the normal line of the substrate 210 so as to become closer to the position of formation of the p layer 222I.

The counter implant parts 226J are basically rectangular in shape when viewed on a plane, but the portions l1 and l2 and l3 and l4 which face the edge parts e1 and e2 of the p layer 222I and the edge parts e3 and e4 of the charge transfer gate part 240I are formed so as to become parallel to these edge parts.

By setting the depth of the bottom portion of the photoelectric conversion part 220J of the photodiode uniform by the counter implant parts 226J (by making the potential of the peripheral parts deeper), the saturation output at the time of same readout voltage (Vpin) is further improved.

In this way, according to the 11th embodiment, the saturation output of the n layer 221 can be further improved, and it becomes possible to suppress the depletion voltage and increase of color bleeding.

12th Embodiment

Figure 29:
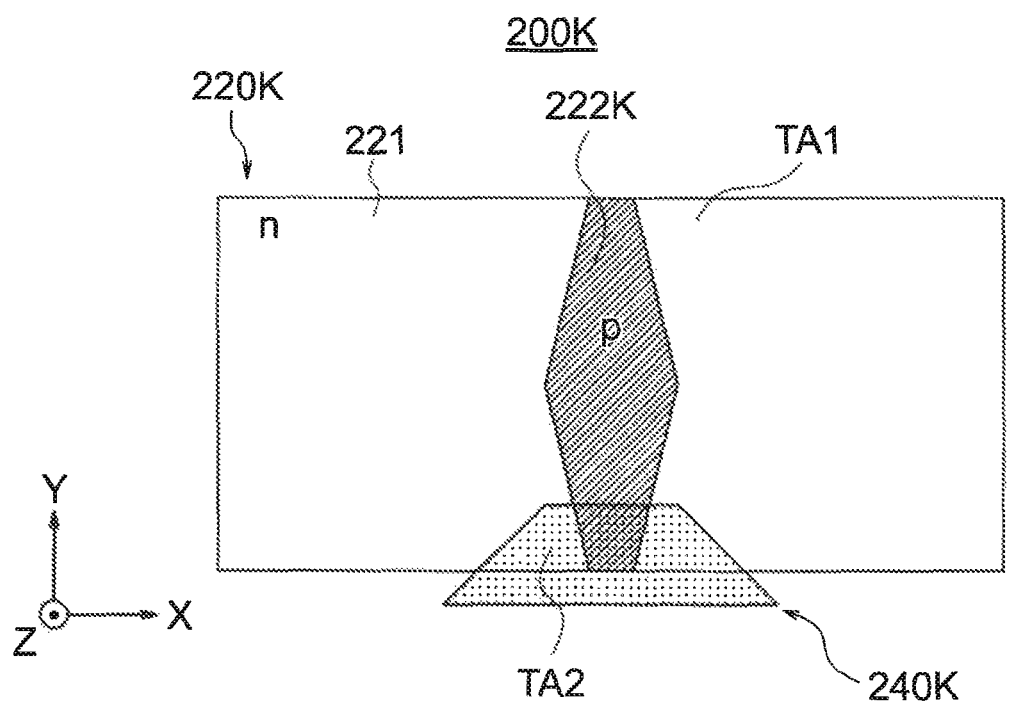
FIG. 29 is a diagram showing an example of the configuration of principal parts in a pinned photodiode (PPD) according to a 12th embodiment of the present invention.

FIG. 29 is a diagram showing an example of the configuration of principal parts of a pinned photodiode (PPD) according to a 12th embodiment of the present invention.

The difference of a pinned photodiode (PPD) 200K in the 12th embodiment from the pinned photodiode (PPD) 200E (FIG. 23) in the sixth embodiment is as follows.

In a photoelectric conversion part 220K of the pinned photodiode (PPD) 200K in the 12th embodiment, a rectangular shaped p layer 222K is locally formed in the n layer 221. It is formed up to end parts TA1 and TA2 of the direction Y perpendicular to the normal line of the substrate 210. Further, the p layer 222K is formed so as to exhibit a tapered state or to stepwise become narrower toward the end areas (the peripheral part of the p layer 222K or the region of the reading part constituted by the charge transfer gate part 240K) TA1 and TA2 of the direction Y perpendicular to the normal line of the substrate 210.

According to the 12th embodiment, in the same way as the sixth embodiment explained above, the saturation output of the n layer 221 can be improved, and it becomes possible to suppress the depletion voltage and increase of color bleeding.

13th Embodiment

Figure 30:
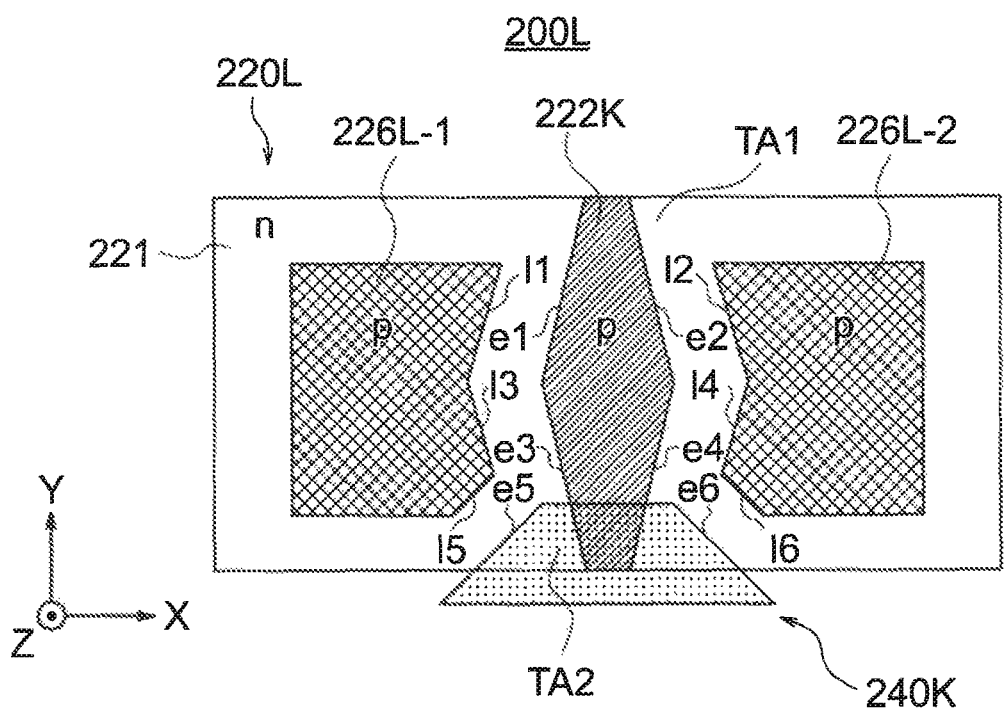
FIG. 30 is a diagram showing an example of the configuration of principal parts in a pinned photodiode (PPD) according to a 13th embodiment of the present invention.

FIG. 30 is a diagram showing an example of the configuration of principal parts of a pinned photodiode (PPD) according to a 13th embodiment of the present invention.

The difference of a pinned photodiode (PPD) 200L in the 13th embodiment from the pinned photodiode (PPD) 200K (FIG. 29) in the 12th embodiment is as follows.

In a photoelectric conversion part 220L of the pinned photodiode (PPD) 200L in the 13th embodiment, further, counter implant parts 226L (-1, -2) are formed by implantation of boron or another impurity having an inverse polarity in the n layer 221 at positions where the potential of the photodiode becomes the deepest. In the present example, the counter implant parts 226L are formed in intermediate regions between the position of formation of the p layer 222L and the positions of formation of the p type separation layers 230 in the direction X perpendicular to the normal line of the substrate 210.

The counter implant parts 226L are basically rectangular in shape when viewed on a plane, but the portions l1 and l2 and l3 and l4, and l5 and l6 which face the edge parts e1 and e2 and e3 and e4 of the p layer 222K and the edge parts e5 and e6 of the charge transfer gate part 240K are formed so as to become parallel to these edge parts.

By setting the depth of the bottom portion of the photoelectric conversion part 220L of the photodiode uniform by the counter implant parts 226L (by making the potential of the peripheral parts deeper), the saturation output at the time of same readout voltage (Vpin) is further improved.

In this way, according to the 13th embodiment, the saturation output of the n layer 221 can be improved, and it becomes possible to suppress the depletion voltage and increase of color bleeding.

14th Embodiment

Figure 31:
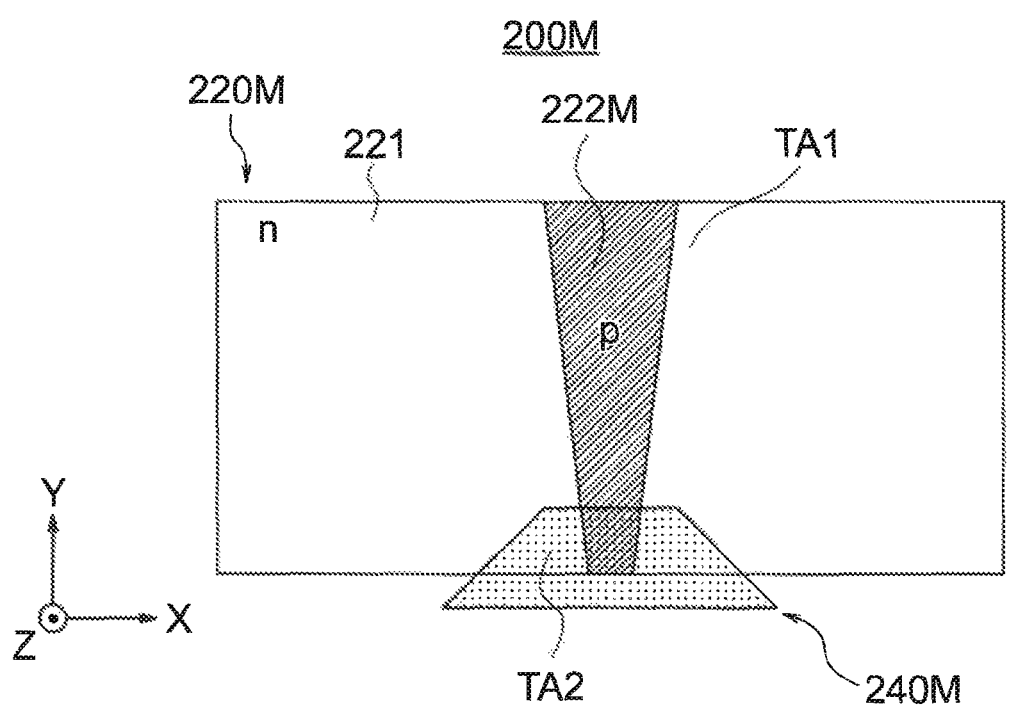
FIG. 31 is a diagram showing an example of the configuration of principal parts in a pinned photodiode (PPD) according to a 14th embodiment of the present invention.

FIG. 31 is a diagram showing an example of the configuration of principal parts of a pinned photodiode (PPD) according to a 14th embodiment of the present invention.

The difference of a pinned photodiode (PPD) 200M in the 14th embodiment from the pinned photodiode (PPD) 200E (FIG. 23) in the sixth embodiment is as follows.

In a photoelectric conversion part 220M of the pinned photodiode (PPD) 200M in the 14th embodiment, a rectangular shaped p layer 222M is locally formed in the n layer 221. It is formed up to end parts TA1 and TA2 of the direction Y perpendicular to the normal line of the substrate 210. Further, the p layer 222M is formed so as to exhibit a tapered shape or to stepwise become narrower from the end area (the peripheral part of the p layer 222M) TA1 of the direction Y perpendicular to the normal line of the substrate 210 toward the end area TA2 of the reading part constituted by the charge transfer gate part 240M.

According to the 14th embodiment, in the same way as the sixth embodiment explained above, the saturation output of the n layer 221 can be improved, and it becomes possible to suppress the depletion voltage and increase of color bleeding.

15th Embodiment

Figure 32:
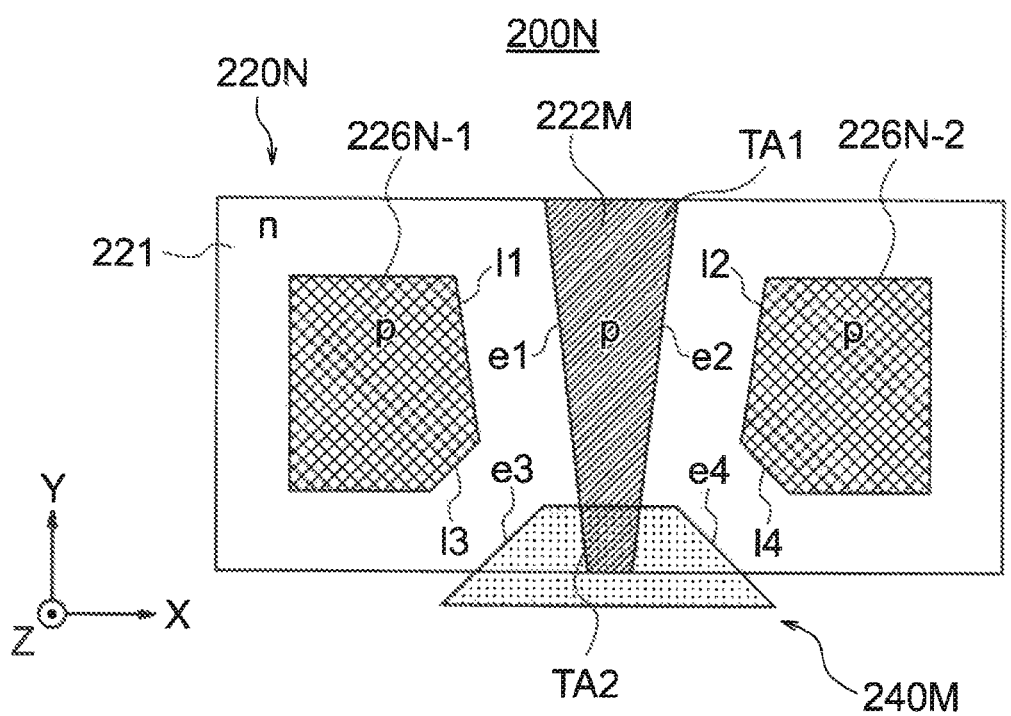
FIG. 32 is a diagram showing an example of the configuration of principal parts in a pinned photodiode (PPD) according to a 15th embodiment of the present invention.

FIG. 32 is a diagram showing an example of the configuration of principal parts of a pinned photodiode (PPD) according to a 15th embodiment of the present invention.

The difference of a pinned photodiode (PPD) 200N in the 15th embodiment from the pinned photodiode (PPD) 200M (FIG. 31) in the 14th embodiment is as follows.

In a photoelectric conversion part 220N of the pinned photodiode (PPD) 200N in the 16th embodiment, further, counter implant parts 226N (−1, −2) are formed by implantation of boron or another impurity having an inverse polarity in the n layer 221 at positions where the potential of the photodiode becomes the deepest. In the present example, the counter implant parts 226N are formed in intermediate regions between the position of formation of the p layer 222M and the positions of formation of the p type separation layers 230 in the direction X perpendicular to the normal line of the substrate 210.

The counter implant parts 226N are basically rectangular in shape when viewed on a plane, but the portions l1 and l2 and l3 and l4 which face the edge parts e1 and e2 of the p layer 222M and the edge parts e3 and e4 of the charge transfer gate part 240M are formed so as to become parallel to these edge parts.

By setting the depth of the bottom portion of the photoelectric conversion part 220N of the photodiode uniform by the counter implant parts 226N (by making the potential of the peripheral parts deeper), the saturation output at the time of same readout voltage (Vpin) is further improved.

In this way, according to the 15th embodiment, the saturation output of the n layer 221 can be improved, and it becomes possible to suppress the depletion voltage and increase of color bleeding.

16th Embodiment

Figure 33:
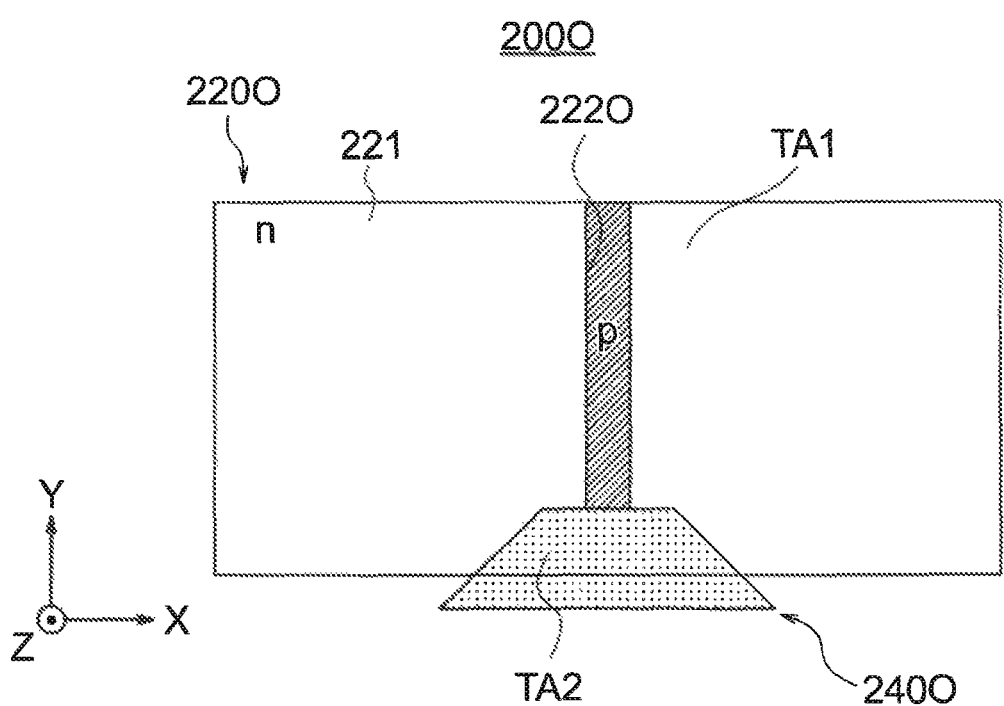
FIG. 33 is a diagram showing an example of the configuration of principal parts in a pinned photodiode (PPD) according to a 16th embodiment of the present invention.

FIG. 33 is a diagram showing an example of the configuration of principal parts of a pinned photodiode (PPD) according to a 16th embodiment of the present invention.

The difference of a pinned photodiode (PPD) 200O in the 16th embodiment from the pinned photodiode (PPD) 200E (FIG. 23) in the sixth embodiment is as follows.

In a photoelectric conversion part 220O of the pinned photodiode (PPD) 200O in the 16th embodiment, an elongated rectangular shaped p layer 222O is locally formed in the n layer 221. It is formed up to the end part TA1 of the direction Y perpendicular to the normal line of the substrate 210. That is, the p layer 222O is formed from the end area (the peripheral part of the p layer 222O) TA1 of the direction Y perpendicular to the normal line of the substrate 210 and separated from the end area TA2 of the reading part constituted by the charge transfer gate part 240O while thin in width.

According to the 16th embodiment, in the same way as the sixth embodiment explained above, the saturation output of the n layer 221 can be improved, and it becomes possible to suppress the depletion voltage and increase of color bleeding.

17th Embodiment

Figure 34:
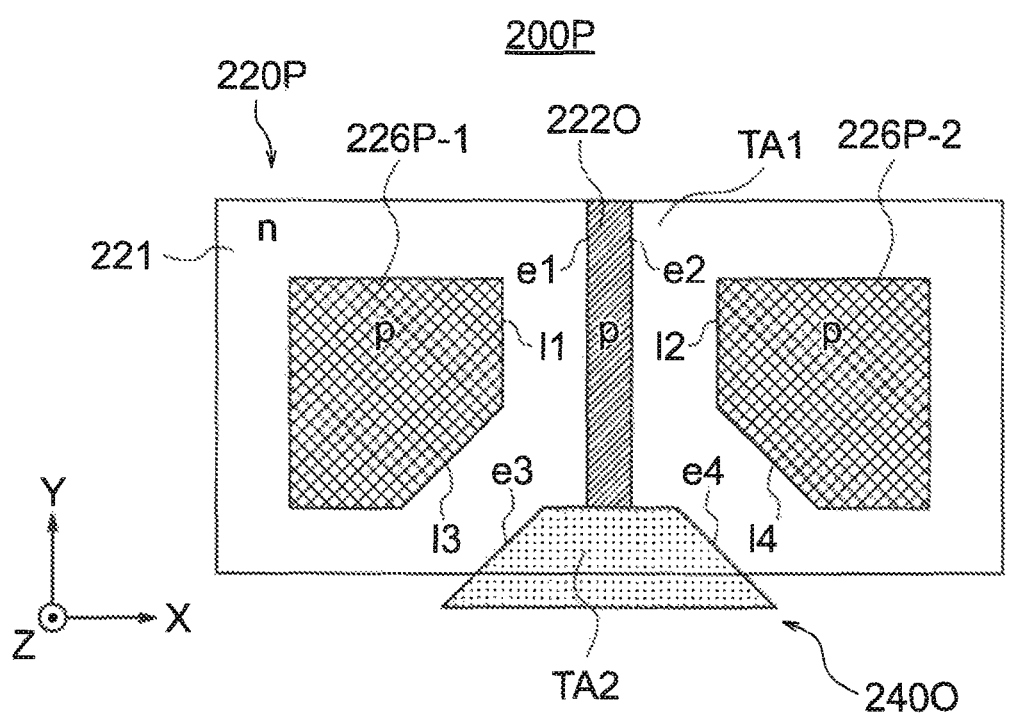
FIG. 34 is a diagram showing an example of the configuration of principal parts in a pinned photodiode (PPD) according to a 17th embodiment of the present invention.

FIG. 34 is a diagram showing an example of the configuration of principal parts of a pinned photodiode (PPD) according to a 17th embodiment of the present invention.

The difference of a pinned photodiode (PPD) 200P in the 17th embodiment from the pinned photodiode (PPD) 200O (FIG. 33) in the 16th embodiment is as follows.

In a photoelectric conversion part 220P of the pinned photodiode (PPD) 200P in the 17th embodiment, further, counter implant parts 226P (−1, −2) are formed by implantation of boron or another impurity having an inverse polarity in the n layer 221 at positions where the potential of the photodiode becomes the deepest. In the present example, the counter implant parts 226P are formed in intermediate regions between the position of formation of the p layer 222O and the positions of formation of the p type separation layers 230 in the direction X perpendicular to the normal line of the substrate 210.

The counter implant parts 226P are basically rectangular in shape when viewed on a plane, but the portions l1 and l2 and l3 and l4 which face the edge parts e1 and e2 of the p layer 222O and the edge parts e3 and e4 of the charge transfer gate part 240O are formed so as to become parallel to these edge parts.

By setting the depth of the bottom portion of the photoelectric conversion part 220P of the photodiode uniform by the counter implant parts 226P (by making the potential of the peripheral parts deeper), the saturation output at the time of same readout voltage (Vpin) is further improved.

In this way, according to the 17th embodiment, the saturation output of the n layer 221 can be improved, and it becomes possible to suppress the depletion voltage and increase of color bleeding.

18th Embodiment

Figure 35:
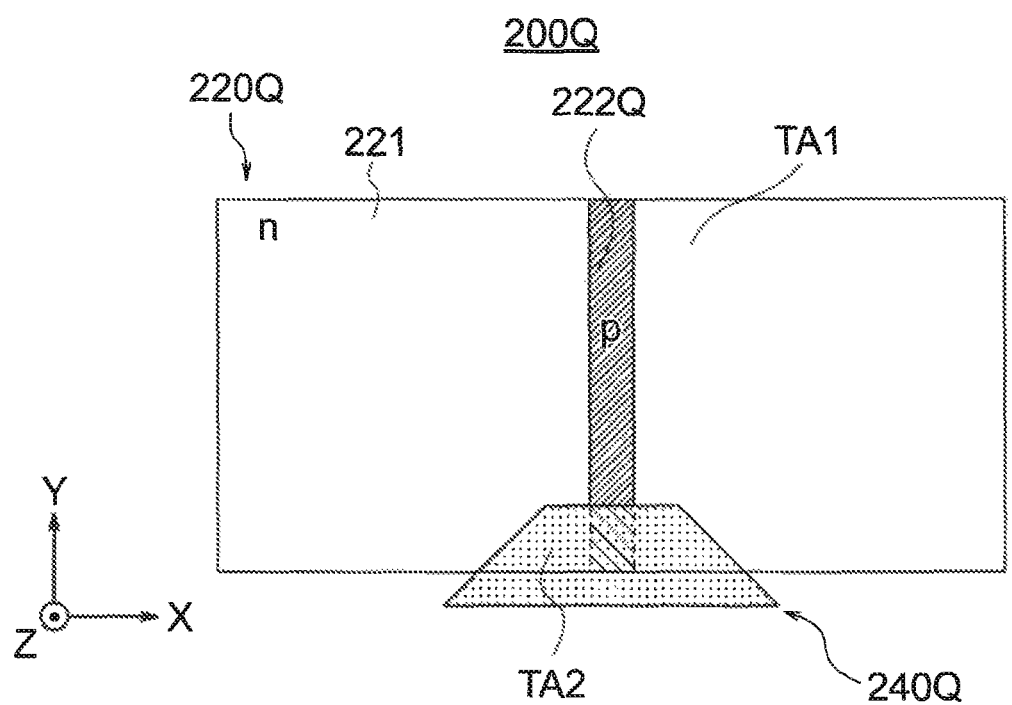
FIG. 35 is a diagram showing an example of the configuration of principal parts in a pinned photodiode (PPD) according to an 18th embodiment of the present invention.

FIG. 35 is a diagram showing an example of the configuration of principal parts of a pinned photodiode (PPD) according to an 18th embodiment of the present invention.

The difference of a pinned photodiode (PPD) 200Q in the 18th embodiment from the pinned photodiode (PPD) 200O (FIG. 33) in the 16th embodiment is as follows.

In a photoelectric conversion part 220Q of the pinned photodiode (PPD) 200Q in the 18th embodiment, an elongated rectangular shaped p layer 222Q is locally formed in the n layer 221. It is formed up to the end parts TA1 and TA2 of the direction Y perpendicular to the normal line of the substrate 210. Further, the p layer 222Q is formed with a narrow width from the end area (the peripheral part of the p layer 222Q) TA1 in the direction Y perpendicular to the normal line of the substrate 210 up to the end area TA2 of the reading part constituted by the charge transfer gate part 240Q and is formed so that the ion implantation concentration is thin in the end area TA2 of the reading part constituted by the charge transfer gate part 240Q.

According to the 18th embodiment, in the same way as the 16th embodiment explained above, the saturation output of the n layer 221 can be improved, and it becomes possible to suppress the depletion voltage and increase of color bleeding.

19th Embodiment

Figure 36:
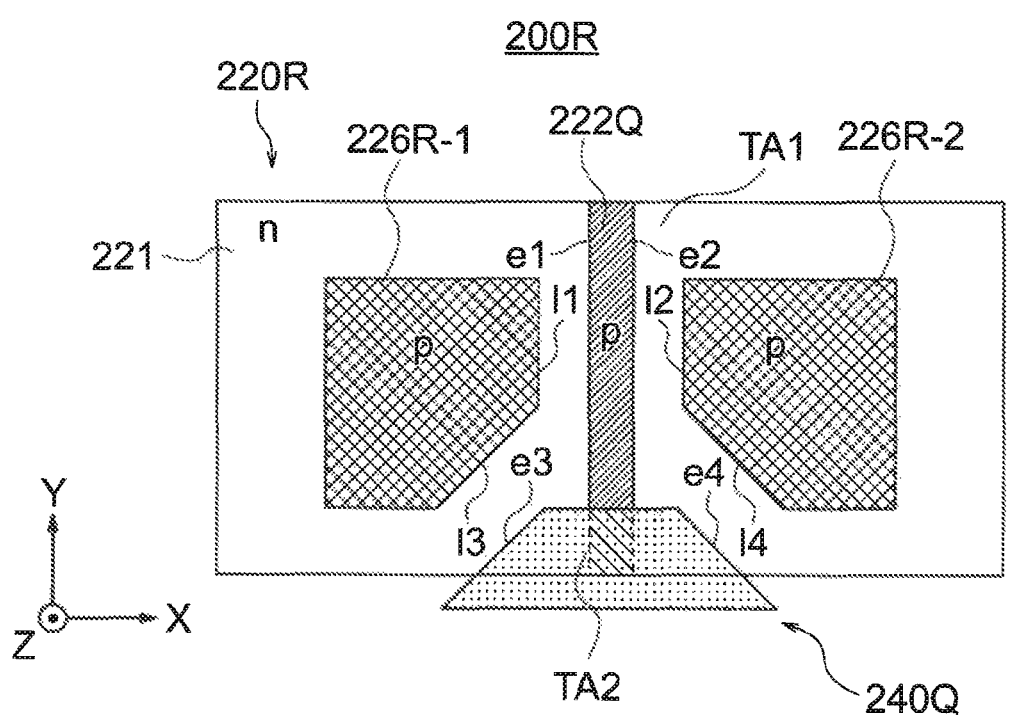
FIG. 36 is a diagram showing an example of the configuration of principal parts in a pinned photodiode (PPD) according to a 19th embodiment of the present invention.

FIG. 36 is a diagram showing an example of the configuration of principal parts of a pinned photodiode (PPD) according to a 19th embodiment of the present invention.

The difference of a pinned photodiode (PPD) 200R in the 19th embodiment from the pinned photodiode (PPD) 200Q (FIG. 35) in the 18th embodiment is as follows.

In a photoelectric conversion part 220R of the pinned photodiode (PPD) 200R in the 19th embodiment, further, counter implant parts 226R (−1, −2) are formed by implantation of boron or another impurity having an inverse polarity in the n layer 221 at positions where the potential of the photodiode becomes the deepest. In the present example, the counter implant parts 226R is formed in intermediate regions between the position of formation of the p layer 222Q and the positions of formation of the p type separation layers 230 in the direction X perpendicular to the normal line of the substrate 210 so that they are closer to the position of formation of the p layer 222Q.

The counter implant parts 226R are basically rectangular in shape when viewed on a plane, but the portions l1 and l2 and l3 and l4 which face the edge parts e1 and e2 of the p layer 222Q and the edge parts e3 and e4 of the charge transfer gate part 240Q are formed so as to become parallel to these edge parts.

By setting the depth of the bottom portion of the photoelectric conversion part 220R of the photodiode uniform by the counter implant parts 226R (by making the potential of the peripheral parts deeper), the saturation output at the time of same readout voltage (Vpin) is further improved.

In this way, according to the 19th embodiment, the saturation output of the n layer 221 can be further improved, and it becomes possible to suppress the depletion voltage and increase of color bleeding.

20th Embodiment

Figure 37:
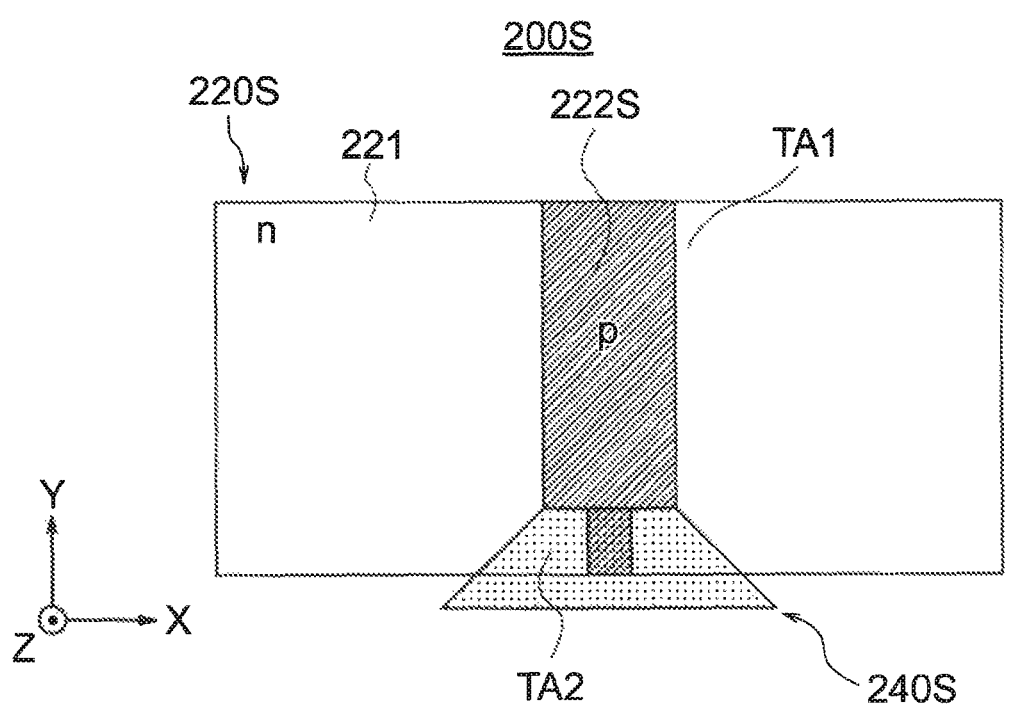
FIG. 37 is a diagram showing an example of the configuration of principal parts in a pinned photodiode (PPD) according to a 20th embodiment of the present invention.

FIG. 37 is a diagram showing an example of the configuration of principal parts of a pinned photodiode (PPD) according to a 20th embodiment of the present invention.

The difference of a pinned photodiode (PPD) 200S in the 20th embodiment from the pinned photodiode (PPD) 200E (FIG. 23) in the sixth embodiment is as follows.

In a photoelectric conversion part 220S of the pinned photodiode (PPD) 200S in the 20th embodiment, a rectangular shaped p layer 222S is locally formed in the n layer 221. It is formed up to end parts TA1 and TA2 in the direction Y perpendicular to the normal line of the substrate 210. Further, the p layer 222S is formed so as to have a narrow width in the end area (the region of the reading part constituted by the charge transfer gate part 240S) TA2 of the direction Y perpendicular to the normal line of the substrate 210.

According to the 20th embodiment, in the same way as the sixth embodiment explained above, the saturation output of the n layer 221 can be improved, and it becomes possible to suppress the depletion voltage and increase of color bleeding.

21st Embodiment

Figure 38:
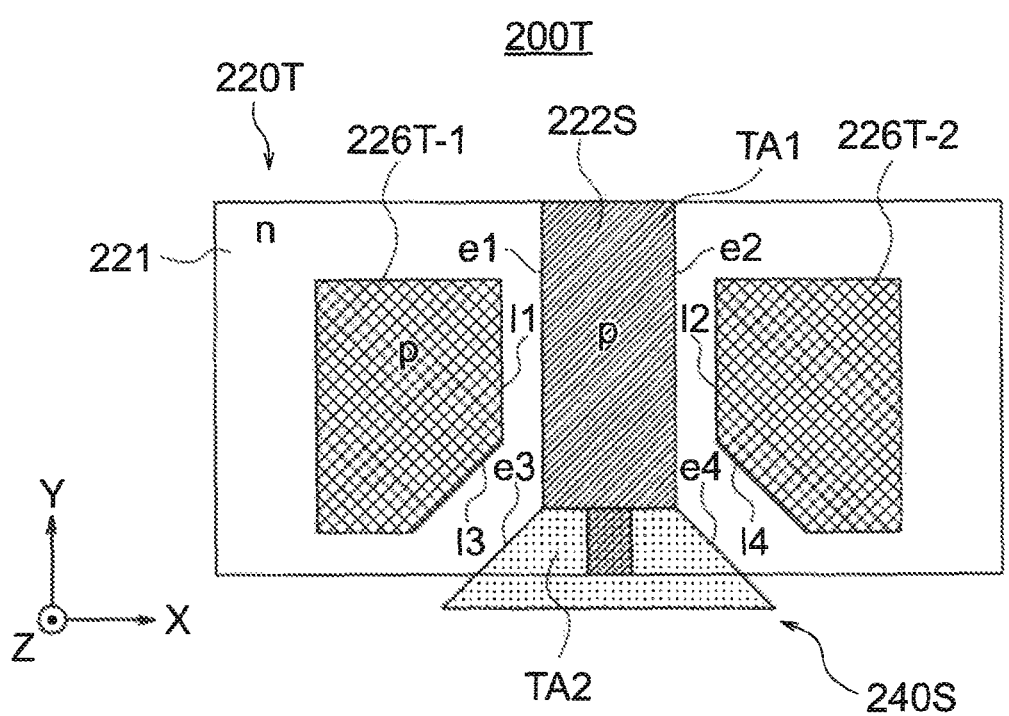
FIG. 38 is a diagram showing an example of the configuration of principal parts in a pinned photodiode (PPD) according to a 21st embodiment of the present invention.

FIG. 38 is a diagram showing an example of the configuration of principal parts of a pinned photodiode (PPD) according to a 21st embodiment of the present invention.

The difference of a pinned photodiode (PPD) 200T in the 21st embodiment from the pinned photodiode (PPD) 200S (FIG. 37) in the 20th embodiment is as follows.

In a photoelectric conversion part 220T of the pinned photodiode (PPD) 200T in the 21st embodiment, further, counter implant parts 226T (−1, −2) are formed by implantation of boron or another impurity having an inverse polarity in the n layer 221 at positions where the potential of the photodiode becomes the deepest. In the present example, the counter implant parts 226T are formed in intermediate regions between the position of formation of the p layer 222S and the positions of formation of the p type separation layer 230 in the direction X perpendicular to the normal line of the substrate 210 so as to become bit closer to the position of formation of the p layer 222S.

The counter implant part 226T is basically rectangular shaped when viewed on a plane, but the portions l1 and l2 and l3 and l4 which face the edge parts e1 and e2 of the p layer 222S and the edge parts e3 and e4 of the charge transfer gate part 240S are formed so as to become parallel to these edge parts.

By setting the depth of the bottom portion of the photoelectric conversion part 220T of the photodiode uniform by the counter implant parts 226T (by making the potential of the peripheral parts deeper), the saturation output at the time of same readout voltage (Vpin) is further improved.

In this way, according to the 21st embodiment, the saturation output of the n layer 221 can be further improved, and it becomes possible to suppress the depletion voltage and increase of color bleeding.

22nd Embodiment

Figure 39:
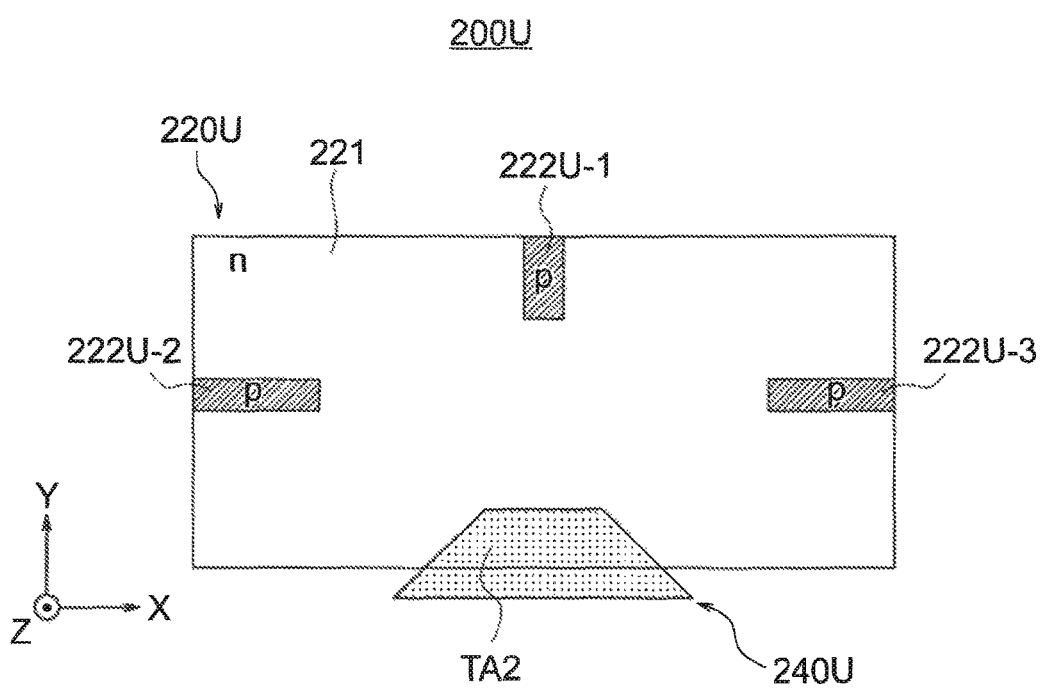
FIG. 39 is a diagram showing an example of the configuration of principal parts in a pinned photodiode (PPD) according to a 22nd embodiment of the present invention.

FIG. 39 is a diagram showing an example of the configuration of principal parts of a pinned photodiode (PPD) according to a 22nd embodiment of the present invention.

The difference of a pinned photodiode (PPD) 200U in the 22nd embodiment from the pinned photodiode (PPD) 200E (FIG. 23) in the sixth embodiment is as follows.

In a photoelectric conversion part 220U of the pinned photodiode (PPD) 200U in the 22nd embodiment, rectangular-shaped p layers 222U-1, 222U-2, and 222U-3 are locally formed in the n layer 221. However, the p layers 222U-1, 222U-2, and 222U-3 are selectively formed in regions other than the area TA2 of the reading part constituted by the charge transfer gate part 240U.

According to the 22nd embodiment, in the same way as the sixth embodiment explained above, the saturation output of the n layer 221 can be improved, and it becomes possible to suppress the depletion voltage and increase of color bleeding.

23rd Embodiment

Figure 40:
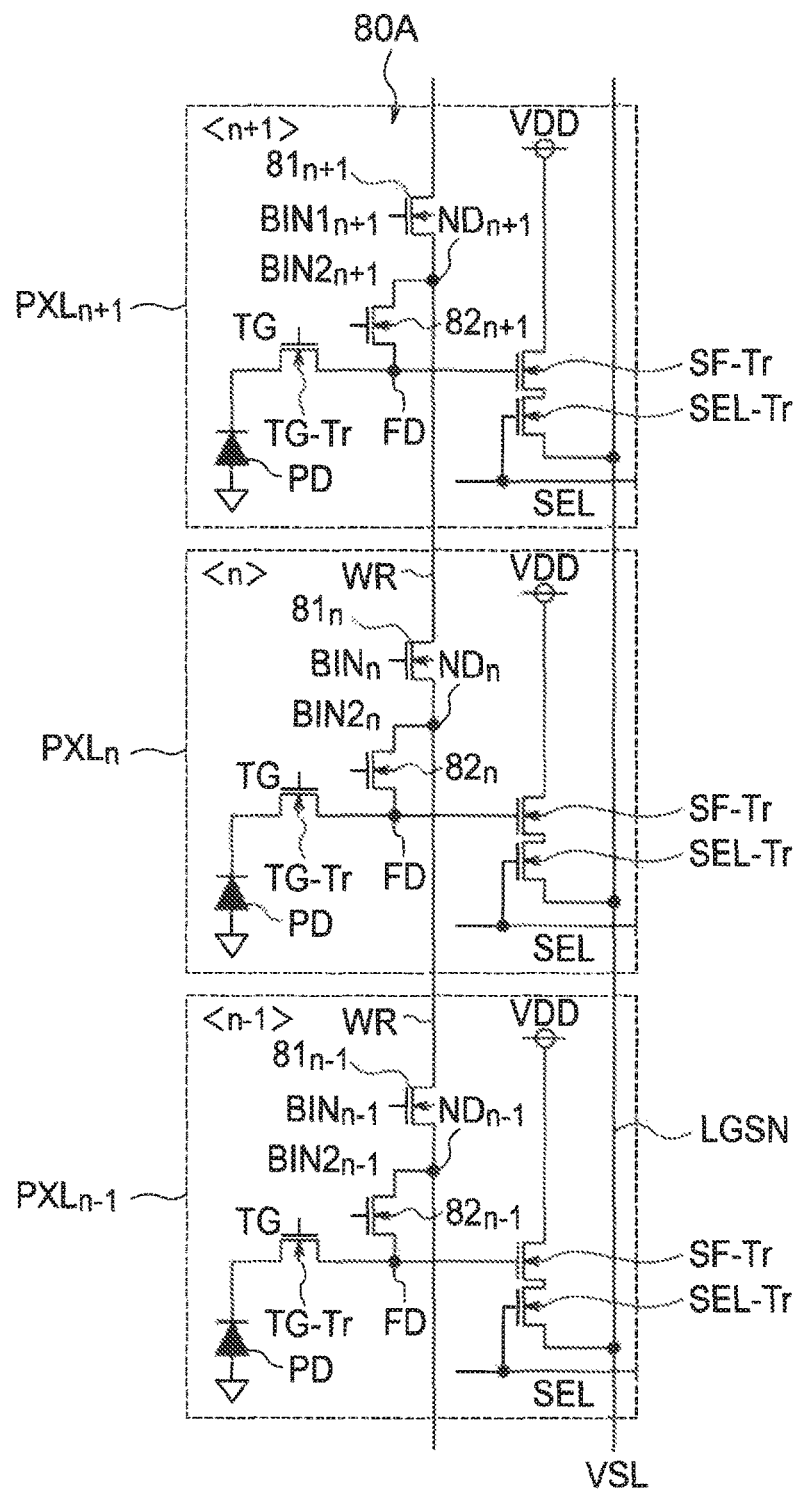
FIG. 40 is a diagram showing an example of the configuration of a pixel part and variable capacity part according to a 23rd embodiment of the present invention.

FIG. 40 is a diagram showing an example of the configuration of a pixel part and variable capacity part according to a 23rd embodiment of the present invention.

The difference of the variable capacity part 80A in the 23rd embodiment from the variable capacity part 80 in the first embodiment is as follows. In the 23rd embodiment, in addition to the first binning transistors (binning switches) 81$n$−1, 81$n$, and 81$n$+1 which are cascade connected onto the wiring WR and formed so as to correspond to the pixels, second binning transistors (binning switches) 82$n$−1, 82$n$, and 82$n$+1 formed by for example NMOS transistors are connected between the floating diffusions FD and the nodes ND$n$−1, ND$n$, and ND$n$+1 of the wiring WR in the pixels PXLn−1, PXLn, and PXLn+1.

The first binning transistors 81$n$−1, 81$n$, and 81$n$+1 are selectively turned on/off according to the first capacity changing signals BIN1$n$−1, BIN1$n$, and BIN1$n$+1, and the second binning transistors 82$n$−1, 82$n$, and 82$n$+1 are selectively turned on/off according to the second capacity changing signals BIN2$n$−1, BIN2$n$, and BIN2$n$+1. In the present embodiment, as shown in FIG. 41, the first capacity changing signals BIN1$n$−1, BIN1$n$, and BIN1$n$+1 and the second capacity changing signals BIN2$n$−1, BIN2$n$, and BIN2$n$+1 are paired and are switched to the H level and L level at the same timing (with same phase).

In such a configuration, the first binning transistors 81$n$−1, 81$n$, and 81$n$+1 are used for connection and disconnection of the adjacent FD wirings WR. The second binning transistors 82$n$−1, 82$n$, and 82$n$+1 are arranged in the vicinity of the transfer transistors TG-Tr in the pixels PXLn−1, PXLn, and PXLn+1 and are used for minimizing parasitic capacitances of the floating diffusion FD nodes in the high conversion gain mode.

Figure 41:
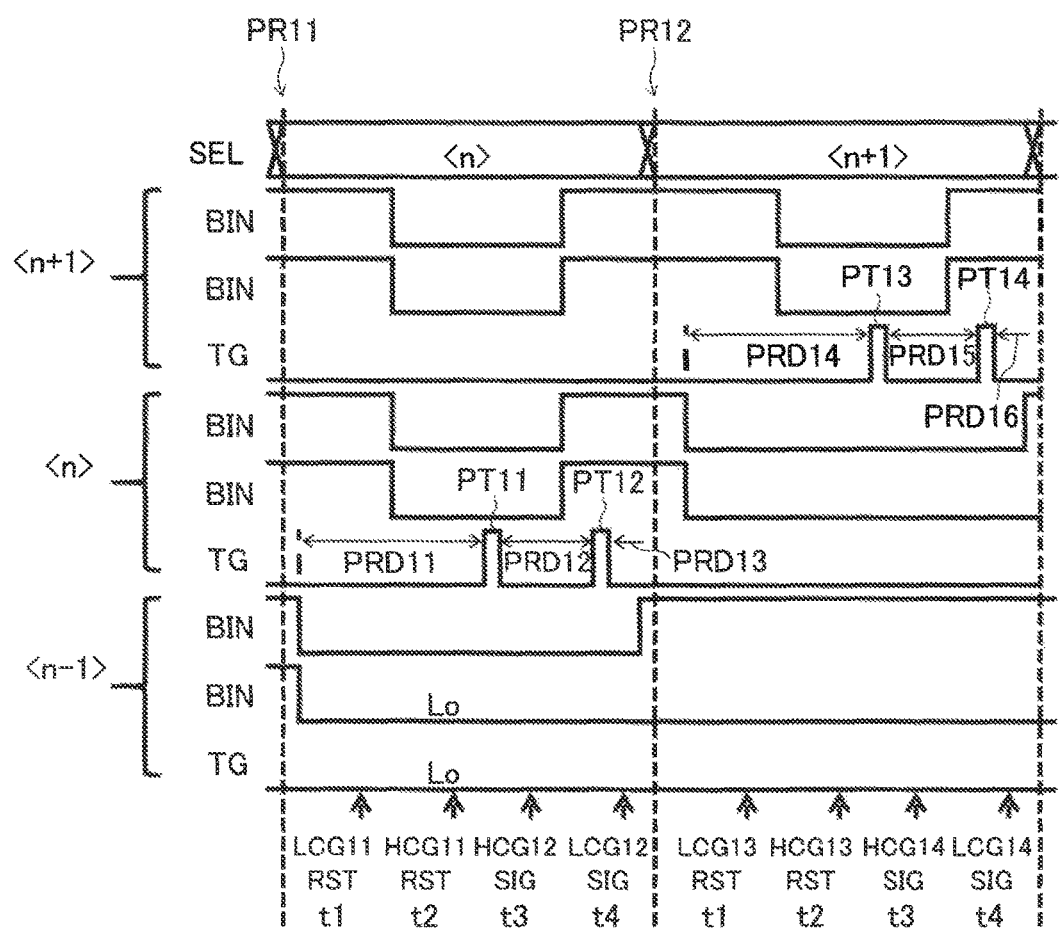
FIG. 41 is a timing chart of an operation realizing a wide dynamic range when a binning switch is applied to the variable capacity part according to the 23rd embodiment.

FIG. 41 is a timing chart of operations for realizing a wide dynamic range when binning switches are applied to the variable capacity parts according to the 23rd embodiment. As the operations in the 23rd embodiment, basically, the same operations as those in the first embodiment explained before are carried out except that the first and second capacity changing signals BIN1$n$+1 and BIN2$n$+1 of the read pixel, for example, the pixel PXLn+1 adjacent to the upper side of the pixel PXLn, are switched to the H level and L level at the same timing (with the same phase) as that of the first and second capacity changing signals BIN1$n$ and BIN2$n$ of the read pixel PXLn. Accordingly, details of operations in the 23rd embodiment are omitted.

According to the 23rd embodiment, the same effects as those by the first embodiment explained above can be obtained. Further, according to the 23rd embodiment, in a high conversion gain mode, the parasitic capacitance of the floating diffusion FD node can be minimized.

24th Embodiment

Figure 42:
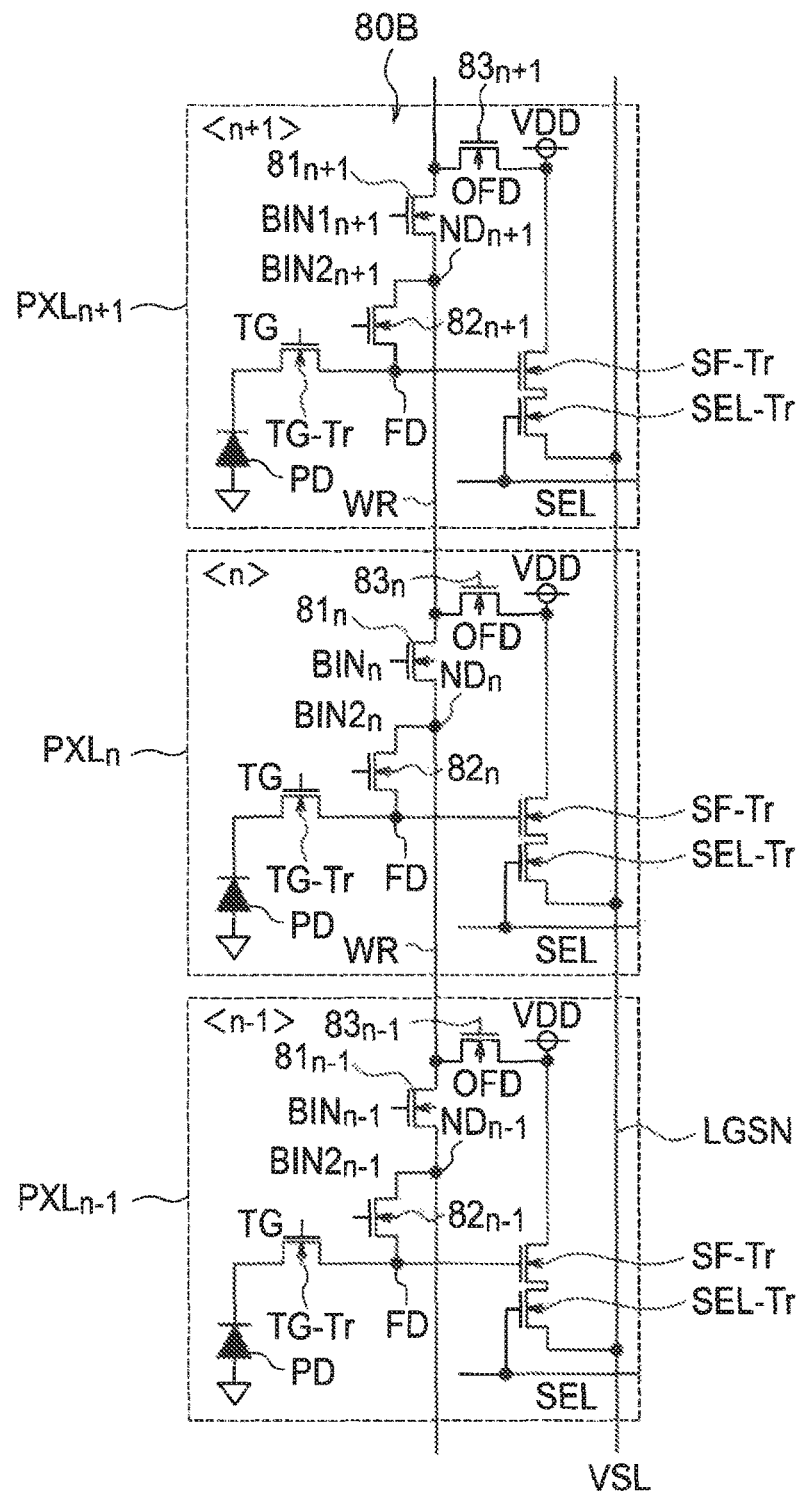
FIG. 42 is a diagram showing an example of the configuration of a pixel part and variable capacity part according to a 24th embodiment of the present invention.
Figure 43:
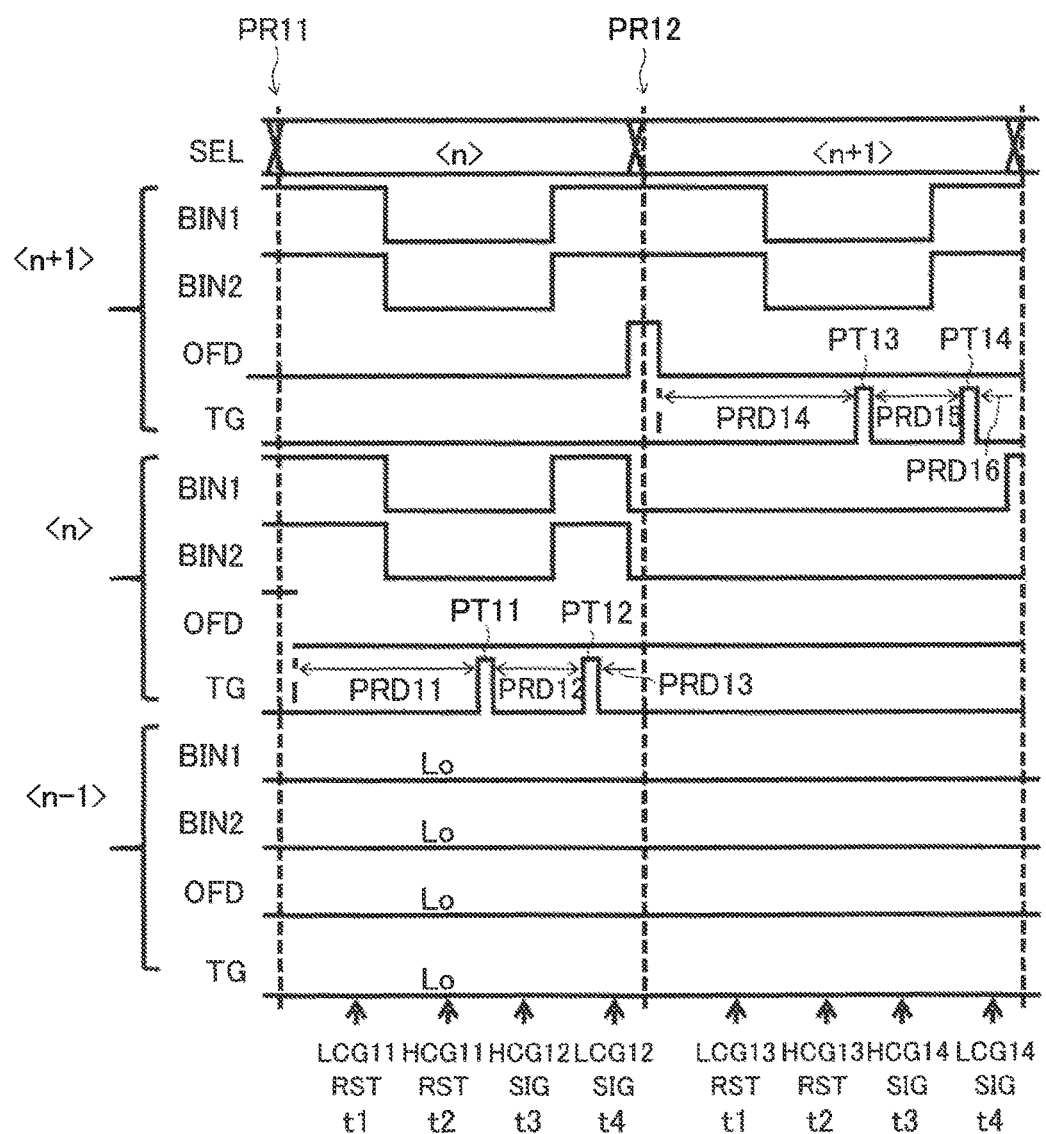
FIG. 43 is a timing chart of the operation realizing a wide dynamic range where a binning switch is applied to the variable capacity part according to the 24th embodiment.

FIG. 42 is a diagram showing an example of the configuration of a pixel part and variable capacity part according to a 24th embodiment of the present invention. FIG. 43 is a timing chart of the operations for realizing a wide dynamic range when binning switches are applied to the variable capacity part according to the 24th embodiment.

The difference of a variable capacity part 80B in the 24th embodiment from the variable capacity part 80A in the 23rd embodiment is as follows. In the 24th embodiment, in the pixels PXLn−1, PXLn, and PXLn+1, overflow drain (OFD) gates 83$n$−1, 83$n$, and 83$n$+1 are connected between the connection portions of the first binning transistors 81$n$−1, 81$n$, and 81$n$+1 with the upper side neighboring pixels and the power supply lines VDD.

The OFD gates 83$n$−1, 83$n$, and 83$n$+1 discharge the overflow electrons to the power supply lines (terminals) so that the electrons (charges) overflowing from the photodiodes PD to the floating diffusions FD at the time of high luminance do not leak into the neighboring pixels.

Further, by setting the voltages of the OFD gates 83$n$−1, 83$n$, and 83$n$+1 higher than the L level voltages of the first capacity changing signals BIN1$n$−1, BIN1$n$, and BIN1$n$+1 and the second capacity changing signals BIN2$n$−1, BIN2$n$, and BIN2$n$+1, a drop in the potentials of the floating diffusions FD in the neighboring pixels occurring by the electrons (charges) overflowing from the photodiodes PD can be prevented.

Further, as shown in FIG. 43, the OFD gates 83$n$−1, 83$n$, and 83$n$+1 may be used for resetting as well. In contrast to a configuration provided with a reset element and binning switch, the number of elements to be connected to the floating diffusion FD node is smaller, therefore this configuration is excellent in the characteristics at the time of high conversion gain.

Example of Application

Figure 44:
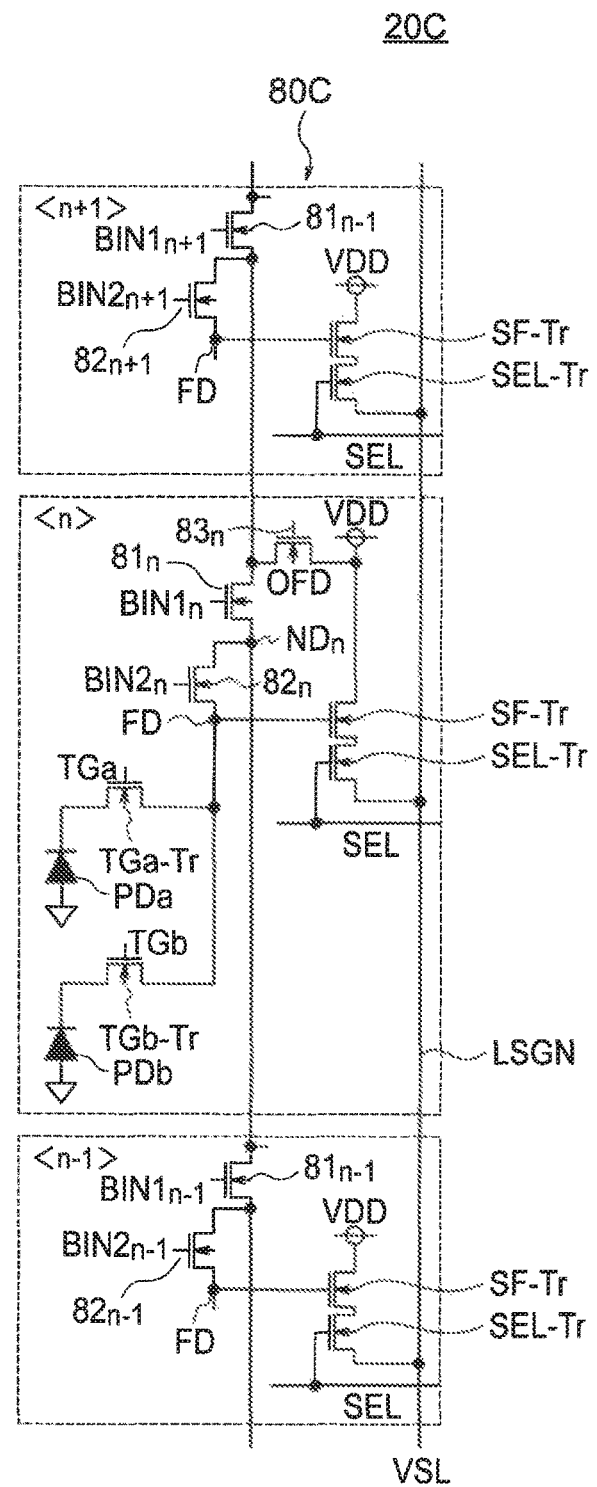
FIG. 44 is a diagram for explaining the fact that the solid-state imaging device according to the embodiments of the present invention can also be applied to a pixel sharing structure.
Figure 45:
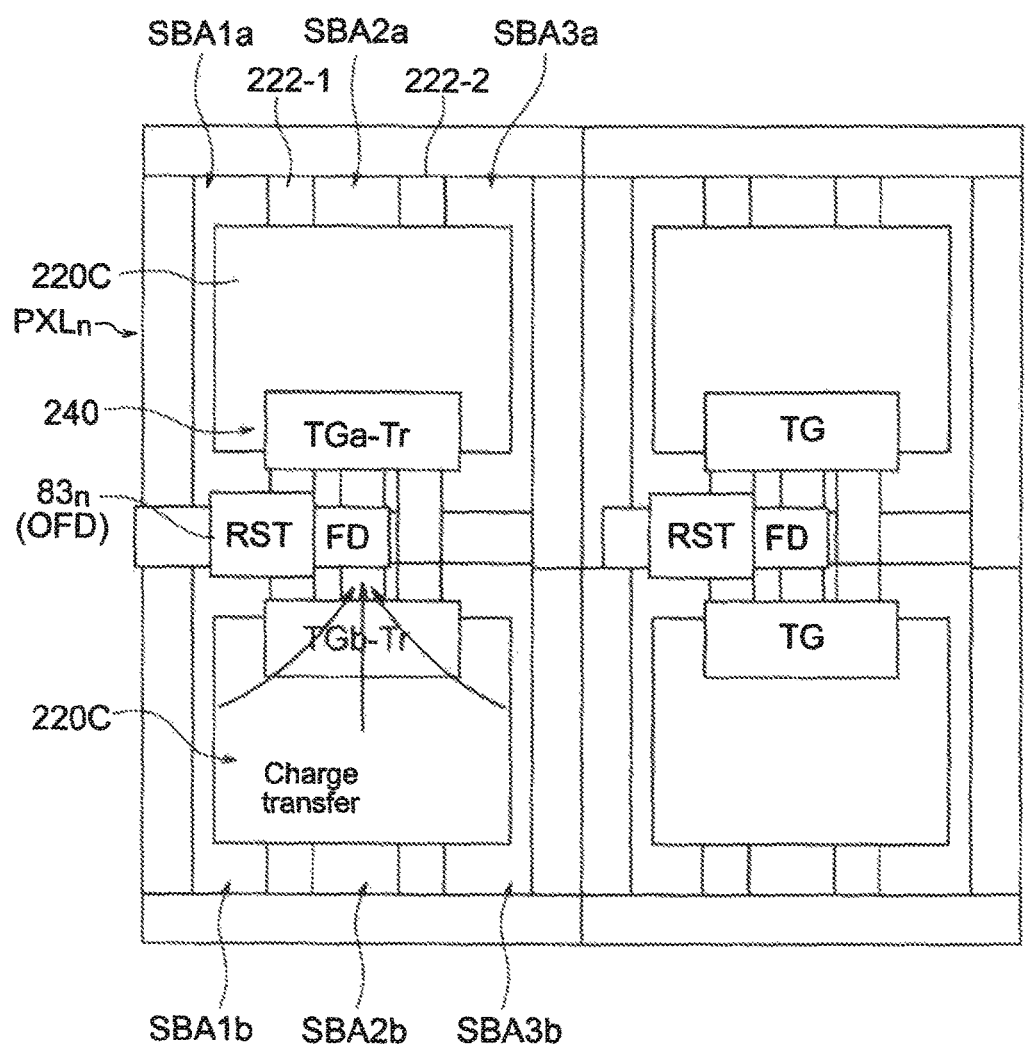
FIG. 45 is a view diagrammatically showing an example of the layout of the two-pixel sharing structure in FIG. 44.

FIG. 44 is a diagram for explaining that the solid-state imaging device according to the embodiment of the present invention can also be applied to a pixel sharing structure. FIG. 45 is a view diagrammatically showing an example of layout of the two-pixel sharing structure in FIG. 44.

The solid-state imaging device 10 in the present embodiment explained above, as shown in FIG. 44 and FIG. 45, can also be applied to a pixel sharing structure where a plurality of (two in the present example) photodiodes PDa and PDb share one floating diffusion FD.

Note that, in the example in FIG. 45, as an example, the configuration of the photoelectric conversion part 220C in the pinned photodiode (PPD) 200C in the fourth embodiment in FIG. 21 is employed. That is, in the n layer (first conductivity type semiconductor layer) 221, three sub-areas SBA1, SBA2, and SBA3 are formed in the direction X perpendicular to the normal line of the substrate by the two p layers 222-1 and 222-2.

Figure 46:
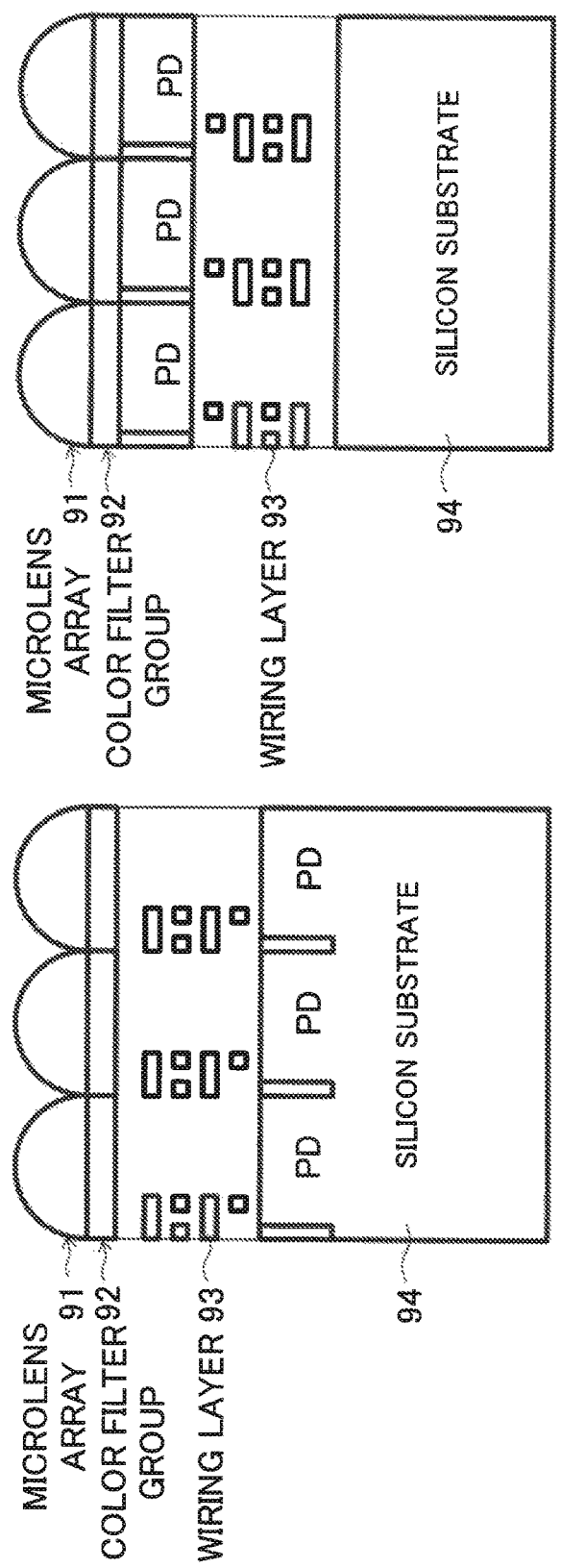
FIG. 46A and FIG. 46B are diagrams for explaining the fact that the solid-state imaging device according to the embodiments of the present invention can be applied to both of a frontside-illuminated type image sensor and a backside-illuminated type image sensor.

FIG. 46A and FIG. 46B are diagrams for explaining that the solid-state imaging device according to the embodiment of the present invention can be applied to both of a frontside-illuminated type image sensor and backside-illuminated type image sensor. FIG. 46A shows a simplified configuration of a frontside-illuminated type image sensor, and FIG. 46B shows a simplified configuration of a backside-illuminated type image sensor.

In FIG. 46A and FIG. 46B, notation 91 indicates a micro lens array, 92 indicates a color filter group, 93 indicates a wiring layer, and 94 indicates a silicon substrate.

The solid-state imaging device 10 explained above, as shown in FIG. 46A and FIG. 46B, can be applied to both of a frontside-illuminated type image sensor (FSI) and a backside-illuminated type image sensor (BSI).

The solid-state imaging device 10 explained above can be applied as imaging device to an electronic apparatus such as a digital camera, video camera, portable terminal, or monitoring camera, camera for medical endoscope, etc.

Figure 47:
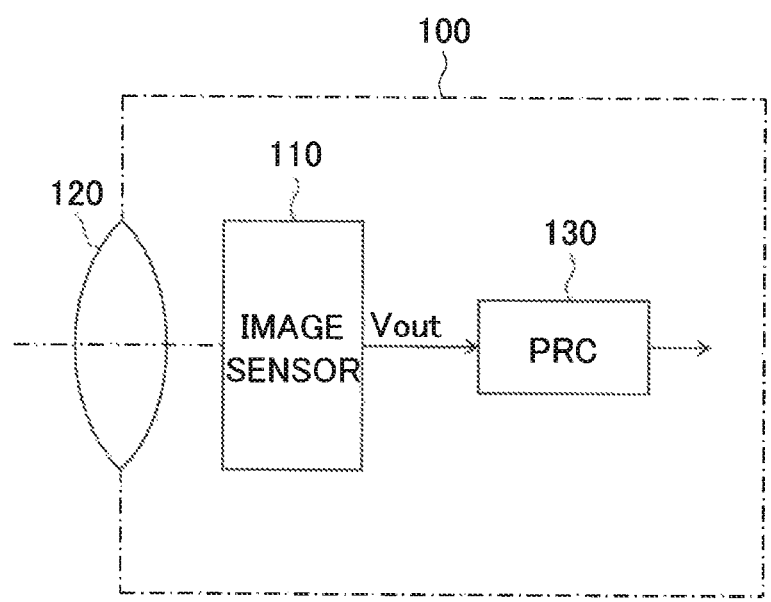
FIG. 47 is a diagram showing an example of the configuration of an electronic apparatus to which the solid-state imaging device according to the present invention is applied.

FIG. 47 is a diagram showing an example of the configuration of the electronic apparatus mounting a camera system to which a solid-state imaging device according to the embodiments of the present invention is applied.

The electronic apparatus 100, as shown in FIG. 47, has a CMOS image sensor 110 to which the solid-state imaging device 10 according to the present embodiments can be applied. Further, the electronic apparatus 100 has an optical system (lens etc.) 120 which guides incident light (forms a subject image) to a pixel region of this CMOS image sensor 110. The electronic apparatus 100 has a signal processing circuit (PRC) 130 for processing the output signal of the CMOS image sensor 110.

The signal processing circuit 130 applies predetermined signal processing with respect to the output signal of the CMOS image sensor 110. The image signal processed in the signal processing circuit 130 can be projected as a moving picture image onto a monitor formed by a liquid crystal display or the like or can be output to a printer. Further, it can be directly recorded on a storage medium such as a memory card. Various embodiments are possible.

As explained above, by mounting the solid-state imaging device 10 explained before as the CMOS image sensor 110, it becomes possible to provide a high performance, small-sized, and low cost camera system. Further, it is possible to realize for example a monitoring camera or camera for medical endoscopes or other electronic apparatus which is used for applications where there are restrictions in mounting size, number of connectable cables, cable length, installation height, etc. in requirements for camera installation.

The invention claimed is:

1. A solid-state imaging device comprising
a substrate which has a first substrate side and a second substrate side on the side opposite to the first substrate side,
a photoelectric conversion part which includes a first conductivity type semiconductor layer formed so that it is buried in the substrate and has a photoelectric conversion function for received light and a charge accumulation function,
a second conductivity type separation layer which is formed in a side portion of the first conductivity type semiconductor layer in the photoelectric conversion part, and
one charge transfer gate part capable of transferring a charge accumulated in the photoelectric conversion part, wherein
the photoelectric conversion part, in at least a portion of the first conductivity type semiconductor layer, includes
at least one second-conductivity type semiconductor layer forming at least one sub-area in a direction perpendicular to a normal line of the substrate and having a junction capacitance component together with the first conductivity type semiconductor layer, and
the one charge transfer gate part can transfer a charge accumulated in the sub-area in the photoelectric conversion part.

2. The solid-state imaging device according to claim 1, wherein the second conductivity type semiconductor layer
has a predetermined width in a direction perpendicular to a normal line of the substrate and
has a depth in the normal line direction of the substrate which starts from the surface on the second substrate side or the first substrate side of the first conductivity type semiconductor layer, but does not reach the surface on the first substrate side or the second substrate side.

3. The solid-state imaging device according to claim 1, wherein the second conductivity type semiconductor layer
has a predetermined width in a direction perpendicular to a normal line of the substrate and
has a depth in the normal line direction of the substrate which starts from the surface on the second substrate side or the first substrate side of the first conductivity type semiconductor layer and reaches the surface on the first substrate side or the second substrate side.

4. The solid-state imaging device according to claim 1, wherein the second conductivity type semiconductor layer
has a predetermined width in the normal line direction of the substrate and
has a length in a direction perpendicular to the normal line of the substrate forming at least one of the sub-areas with the second conductivity type separation layer.

5. The solid-state imaging device according to claim 1, wherein a second second-conductivity type semiconductor layer is formed on the surface on the first substrate side of the first-conductivity type semiconductor layer.

6. The solid-state imaging device according to claim 1, wherein a second first-conductivity type semiconductor layer is formed on the surface on the second substrate side of the first-conductivity type semiconductor layer.

7. The solid-state imaging device according to claim 6, wherein a third second-conductivity type semiconductor layer is formed on the surface on the second substrate side of the second first-conductivity type semiconductor layer.

8. The solid-state imaging device according to claim 7, wherein the charge transfer gate part includes
a third first-conductivity type semiconductor layer for forming a floating diffusion to which a charge accumulated in the photoelectric conversion part is transferred,
a fourth second-conductivity type semiconductor layer formed between the end parts of one of the stacked second first-conductivity type semiconductor layer and the third second-conductivity type semiconductor layer and the third first-conductivity type semiconductor layer, and
a gate electrode which is formed at least on the fourth second-conductivity type semiconductor layer through an insulation film.

9. The solid-state imaging device according to claim 1, wherein the second-conductivity type semiconductor layer is locally formed in the first-conductivity type semiconductor layer and differs in ion implantation concentration from the other areas in a region positioned at least at one of a peripheral part and the charge transfer gate part.

10. The solid-state imaging device according to claim 1, wherein the second-conductivity type semiconductor layer is locally formed in the first-conductivity type semiconductor layer and differs in shape from the other areas in a region positioned at least at one of a peripheral part and the charge transfer gate part.

11. The solid-state imaging device according to claim 1, wherein the second-conductivity type semiconductor layer is locally formed in the first-conductivity type semiconductor layer and is separated from a peripheral part and a charge transfer gate region in a region positioned at least at one of a peripheral part and the charge transfer gate part.

12. The solid-state imaging device according to claim 1, wherein the first-conductivity type semiconductor layer includes a counter ion implantation part in which a second-conductivity type impurity having an inverse polarity to that of the first-conductivity type is implanted.

13. The solid-state imaging device according to claim 12, wherein the counter ion implantation part is formed at a position where the potential of the photoelectric conversion part becomes deepest.

14. The solid-state imaging device according to claim 12, wherein the counter ion implantation part is formed so that at least an edge part facing an edge part of the second-conductivity type semiconductor layer and an edge part of a charge transfer gate part become parallel to an edge part of the second-conductivity type semiconductor layer and edge part of the charge transfer gate part.

15. The solid-state imaging device according to claim 1, wherein:
provision is made of a pixel part having pixels arranged therein,
a pixel includes the photoelectric conversion part which accumulates the charge generated by photoelectric conversion in an accumulation period,
the charge transfer gate part capable of transferring the charge accumulated in the photoelectric conversion part in a transfer period,
a floating diffusion to which the charge accumulated in the photoelectric conversion part is transferred through the charge transfer gate part,
a source follower element which converts the charge in the floating diffusion to a voltage signal with a conversion gain in accordance with the charge amount, and
a variable capacity part capable of changing the capacity of the floating diffusion in accordance with a capacity changing signal,
in a predetermined term in one reading period corresponding to the accumulation period, the capacity of the floating diffusion is changed by the variable capacity part, and the conversion gain is switched in this one reading period, and
the variable capacity part
includes at least binning switches which are connected between floating diffusions of two neighboring pixels and are selectively turned on/off in accordance with the capacity changing signal and
switches the conversion gain of the floating diffusion of the pixel to be read out by switching the number of floating diffusions to be connected.

16. The solid-state imaging device according to claim 15, wherein a reset element for discharging the charges in the floating diffusions in the reset period is shared by all of the plurality of pixels connected through the binning switches.

17. The solid-state imaging device according to claim 15, wherein the variable capacity part includes
a first binning switch which is connected to wiring between the floating diffusions in each of two neighboring pixels and is selectively turned on/off in accordance with a first capacity changing signal and
a second binning switch which is connected between wiring closer to the charge transfer gate part side than the first binning switch and the floating diffusion of the pixel to be read and is selectively turned on/off in accordance with a second capacity changing signal.

18. The solid-state imaging device according to claim 17, wherein the variable capacity part has an overflow gate which is connected to the first binning switch and discharges a charge overflowing from the floating diffusion.

19. A method for manufacturing a solid-state imaging device comprising:
a step of forming a first conductivity type semiconductor layer so that it is buried in a substrate having a first substrate side and a second substrate side on the side opposite to the first substrate side to form a photoelectric conversion part having a photoelectric conversion function for received light and a charge accumulation function,
a step of forming a second conductivity type separation layer in a side portion of the first conductivity type semiconductor layer in the photoelectric conversion part,
a step of forming, in at least a portion of the first conductivity type semiconductor layer in the photoelectric conversion part, at least one sub-area in a direction perpendicular to the normal line of the substrate and forming at least one second-conductivity type semiconductor layer having a junction capacitance component together with the first conductivity type semiconductor layer, and
a step of forming one charge transfer gate part capable of transferring a charge accumulated in the sub-area in the photoelectric conversion part.

20. An electronic apparatus comprising
a solid-state imaging device and
an optical system forming a subject image in the solid-state imaging device, wherein
the solid-state imaging device has
a substrate which has a first substrate side and a second substrate side on the side opposite to the first substrate side,
a photoelectric conversion part which includes a first conductivity type semiconductor layer formed so that it is buried in the substrate and has a photoelectric conversion function for received light and a charge accumulation function,
a second conductivity type separation layer which is formed in a side portion of the first conductivity type semiconductor layer in the photoelectric conversion part, and
one charge transfer gate part capable of transferring a charge accumulated in the photoelectric conversion part, wherein
the photoelectric conversion part, in at least a portion of the first conductivity type semiconductor layer, includes
at least one second-conductivity type semiconductor layer forming at least one sub-area in a direction perpendicular to a normal line of the substrate and having a junction capacitance component together with the first conductivity type semiconductor layer, and
the one charge transfer gate part can transfer a charge accumulated in the sub-area in the photoelectric conversion part.

* * * * *